United States Patent
Banno et al.

(10) Patent No.: US 10,797,105 B2
(45) Date of Patent: Oct. 6, 2020

(54) SEMICONDUCTOR DEVICE AND METHOD FOR PRODUCING SEMICONDUCTOR DEVICE

(71) Applicant: NEC Corporation, Minato-ku, Tokyo (JP)

(72) Inventors: Naoki Banno, Tokyo (JP); Munehiro Tada, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 16/311,228

(22) PCT Filed: Jun. 28, 2017

(86) PCT No.: PCT/JP2017/023765
§ 371 (c)(1),
(2) Date: Dec. 19, 2018

(87) PCT Pub. No.: WO2018/003864
PCT Pub. Date: Jan. 4, 2018

(65) Prior Publication Data
US 2019/0189690 A1 Jun. 20, 2019

(30) Foreign Application Priority Data
Jul. 1, 2016 (JP) .................... 2016-131469

(51) Int. Cl.
*H01L 27/24* (2006.01)
*H01L 21/8239* (2006.01)
(Continued)

(52) U.S. Cl.
CPC ...... *H01L 27/2436* (2013.01); *H01L 21/8239* (2013.01); *H01L 27/105* (2013.01);
(Continued)

(58) Field of Classification Search
CPC ... H01L 45/00; H01L 45/085; H01L 45/1206; H01L 45/1226; H01L 45/1233;
(Continued)

(56) References Cited

U.S. PATENT DOCUMENTS 10,340,451 B2 * 7/2019 Tada .................. H01L 45/1675
2015/0243355 A1 8/2015 Lee et al.
(Continued)

FOREIGN PATENT DOCUMENTS

JP 2002536840 A 10/2002
JP 2011091317 A 5/2011
(Continued)

OTHER PUBLICATIONS

Tada, M., et al., "Improved ON-State Reliability of Atom Switch Using Alloy Electrodes", IEEE Transactions on Electron Devices, vol. 60, No. 10, 2013, pp. 3534-3540, 7 pages.
(Continued)

*Primary Examiner* — Tucker J Wright

(57) ABSTRACT

Provided are: a semiconductor device in which a non-volatile switch provided with a rectifying element and a non-volatile element provided with no rectifying element are formed in the same wiring; and a method for producing the semiconductor device. The semiconductor device includes a first switching element and a second switching element disposed in a signal path of a logic circuit. The first switching element includes a rectifying element and a variable resistance element. The second switching element does not include the rectifying element but includes a variable resistance element. The first switching element and the second switching element are formed in the same wiring layer.

14 Claims, 14 Drawing Sheets

(51) Int. Cl.
H01L 27/105 (2006.01)
H01L 45/00 (2006.01)

(52) U.S. Cl.
CPC .......... *H01L 27/2463* (2013.01); *H01L 45/00* (2013.01); *H01L 45/085* (2013.01); *H01L 45/1206* (2013.01); *H01L 45/1226* (2013.01); *H01L 45/1233* (2013.01); *H01L 45/1266* (2013.01); *H01L 45/1608* (2013.01); *H01L 45/1675* (2013.01)

(58) Field of Classification Search
CPC ......... H01L 45/1266; H01L 1127/2436; H01L 45/105; H01L 45/2463
See application file for complete search history.

(56) References Cited

U.S. PATENT DOCUMENTS

2015/0340606 A1 11/2015 Tada et al.
2016/0035419 A1 2/2016 Zaitsu et al.
2017/0162784 A1 6/2017 Banno et al.

FOREIGN PATENT DOCUMENTS

| JP | 2013084640 A | 5/2013 |
| JP | 5382001 B2 | 1/2014 |
| JP | 2015018590 A | 1/2015 |
| JP | 2017107911 A | 6/2017 |
| WO | 2011058947 A1 | 5/2011 |
| WO | 2011158821 A1 | 12/2011 |
| WO | 2012043502 A1 | 4/2012 |
| WO | 2014112365 A1 | 7/2014 |

OTHER PUBLICATIONS

International Search Report and Translation of Written Opinion, dated Sep. 12, 2017 from the International Bureau in counterpart International application No. PCT/JP2017/023765.

\* cited by examiner

SEMICONDUCTOR DEVICE AND METHOD FOR PRODUCING SEMICONDUCTOR DEVICE

This application is a National Stage Entry of PCT/JP2017/023765 filed on Jun. 28, 2017, which claims priority from Japanese Patent Application 2016-131469 filed on Jul. 1, 2016, the contents of all of which are incorporated herein by reference, in their entirety.

TECHNICAL FIELD

The present invention relates to a semiconductor device and a method for producing the semiconductor device and particularly relates to a semiconductor device that is used in an electronic device, such as a programmable logic and a memory, and is provided with a variable resistance element using deposition of a metal and a rectifying element and a method for producing the semiconductor device.

BACKGROUND ART

In order to diversify functions of a programmable logic and promote implementation of the programmable logic in electronic devices or the like, it is required to reduce size of each switch connecting logic cells to each other and reduce on-resistance of the switch. It has been known that a switch that uses deposition of a metal in an ion conductive layer in which metal ions are conducted has a smaller size than a conventional semiconductor switch and has a small on-resistance.

Such switching elements include a two-terminal switch disclosed in Patent Literature 1 (PTL1) and a three-terminal switch disclosed in Patent Literature 2 (PTL2). The two-terminal switch has a structure in which an ion conductive layer is interposed between a first electrode supplying metal ions and a second electrode supplying no metal ion. Switching between both electrodes is performed through formation and disappearance of metal cross-links in the ion conductive layer. Since the two-terminal switch has a simple structure, a production process thereof is simple and easy, and the two-terminal switch can be processed to a small element size in the order of nanometers. The three-terminal switch has a structure in which second electrodes of two two-terminal switches are integrated into one electrode and is capable of securing high reliability.

For an ion conductive layer, a porous polymer including silicon, oxygen, and carbon as main components is preferably used. Since a porous polymer ion conductive layer is capable of maintaining a breakdown voltage at a high level even when metal cross-links are formed therein, the porous polymer ion conductive layer excels in operation reliability (Patent Literature 3 (PTL3)).

In order to implement a programmable logic with such switches as a wiring changeover switch, it is required to increase density by miniaturizing the switches and simplify a production process. Wiring material of a state-of-the-art semiconductor device is mainly constituted by copper, and a method for efficiently forming a variable resistance element in copper wiring is expected. With regard to a technology for integrating a switching element using an electrochemical reaction into a semiconductor device, a two-terminal switch using the technology and a three-terminal switch using the technology are disclosed in Patent Literature 4 (PTL4) and Patent Literature 5 (PTL5), respectively. According to the literatures, a technology for using a copper wiring also as a first electrode of a switching element on a semiconductor substrate is described. Use of the structure enables a step for newly forming a first electrode to be eliminated. Thus, a mask for forming a first electrode becomes unnecessary, and the number of photoresist masks (PRs) to be added for producing a variable resistance element can be reduced to 2. On this occasion, since film-forming an ion conductive layer (a second ion conductive layer) directly on a copper wiring causes the surface of the copper wiring to be oxidized and leakage current to be increased, a metal thin film functioning as an oxidation sacrificial layer is interposed between the copper wiring and the ion conductive layer. The metal thin film is oxidized by oxygen included in the ion conductive layer and becomes a portion of the ion conductive layer (first ion conductive layer). A metal constituting the oxidation sacrificial layer forms an alloy layer at a boundary face with copper, and, when metal cross-links are formed by voltage application, the metal is incorporated into the metal cross-links.

Non Patent Literature 1 (NPL1) discloses that improvement in thermal stability of metal cross-links by the metal having diffused into the metal cross-links causes retaining resistance (retention) to be improved. On that occasion, since incorporation of the metal into metal cross-links causes generation efficiency of Joule heat to be improved, required current at the time of transition from an on-state to an off-state does not increase.

To wiring changeover switches in a programmable logic, a crossbar switch structure in which switching elements are arranged at intersection points between wirings is applied. In the crossbar switch structure, at least one select transistor is required with respect to each switch because of inhibition of sneak current at the time of signal transmission and current limitation at the time of selection (programming). For this reason, there has been an issue in that transistors occupy a large area and an advantage of a small-sized switch cannot be fully exploited.

Thus, Patent Literature 6 (PTL6) discloses a structure in which a bipolar rectifying element is arranged on a three-terminal switch. Programming of the three-terminal switch is performed through the rectifying element, and current at the time of writing is limited by a reached current through the rectifying element. In addition, the rectifying element inhibits sneak current to an adjacent element via the control terminal of the three-terminal element, which prevents an erroneous writing from occurring.

CITATION LIST

Patent Literature

[PTL1] JP2002-536840A
[PTL2] WO2012/043502A
[PTL3] WO2011/058947A
[PTL4] JP5382001B
[PTL5] WO2011/158821A
[PTL6] WO2014/112365A

Non Patent Literature

[NPL1] Tada et al., "Improved ON-State Reliability of Atom Switch Using Alloy Electrodes", IEEE Transactions on Electron Devices, Volume 60, Issue 10, pp. 3534-3540, 2013

SUMMARY OF INVENTION

Technical Problem

However, the semiconductor devices described in the background art have an issue as follows.

In the multi-terminal switch structure provided with rectifying elements described in the background art, rectifying elements are formed on all switches. Although it is preferable to replace a power supply line supplying power source to a programmable circuit constituted by crossbar switches, such as a multiplexer and a lookup table, with a non-volatile three-terminal switch, such a non-volatile three-terminal switch is required to cope with various voltage levels and current levels and secure high reliability. However, since a current limit level by a rectifying element is determined invariably by film thickness of a rectifying layer, it becomes impossible to adjust a resistance level of the switch. To secure reliability, a switch is required to have a low on-resistance, and it is preferable to perform current control of a three-terminal switch on a power supply line by use of a transistor. Although it is possible to increase a current limit level by increasing area of a rectifying element, a current level that was determined once cannot be changed in the rectifying element and fine tuning at the time of circuit operation (for example, adjustment of power supply voltage in association with a change in an operational frequency) cannot be performed.

In addition, when a multi-terminal switch provided with two rectifying elements and a three-terminal switch are integrated in a multilayer wiring layer in accordance with the background art, photoresist masks for patterning respective structures of the multi-terminal switch provided with two rectifying elements and the three-terminal switch are required. As a result, the number of exposures increases, which causes a production cost to increase.

An object of the present invention is to provide a semiconductor device in which a non-volatile switch provided with a rectifying element and a non-volatile element provided with no rectifying element are formed in the same wiring and a method for producing the semiconductor device.

Solution to Problem

To achieve the above-mentioned object, a semiconductor device according to the present invention comprises a first switching element and a second switching element that are disposed in a signal path of a logic circuit, wherein the first switching element includes a rectifying element and a variable resistance element, the second switching element does not include a rectifying element and includes a variable resistance element, and the first switching element and the second switching element are formed in the same wiring layer.

A method for producing a semiconductor device in which a first switching element and a second switching element are formed at the same time, the first switching element including a rectifying element and a variable resistance element, the second switching element including no rectifying element and a variable resistance element, the method comprises:

film-forming electrodes and a variable resistance layer that form the variable resistance elements;

film-forming electrodes and a rectifying layer that form the rectifying element;

forming a first pattern for constituting the variable resistance element and the rectifying element to a hard mask for forming the first switching element;

forming a second pattern for constituting the variable resistance element to a hard mask for forming the second switching element; and etching the rectifying layer and the variable resistance layer at the same time by use of the hard masks to which the first pattern and the second pattern are formed.

Advantageous Effect of Invention

According to the present invention, it is possible to achieve a semiconductor device including a non-volatile switch provided with a rectifying element and a non-volatile switch provided with no rectifying element in the same wiring in a multilayer wiring structure. According to the present invention, it is also possible to form a non-volatile switch provided with a rectifying element and a non-volatile switch provided with no rectifying element in the same wiring in a multilayer wiring structure at the same time.

EXAMPLE EMBODIMENT

Preferred example embodiments of the present invention will be described in detail with referent to the drawings. A semiconductor device of each of the example embodiments includes a first switching element and a second switching element disposed in a signal path of a logic circuit. The first switching element and the second switching element are programmable non-volatile switches. The first switching element is characterized by having a rectifying element and a variable resistance element, and the second switching element is characterized by having no rectifying element and a variable resistance element. It is assumed that the first switching element and the second switching element are formed in the same wiring layer.

Figure 15:
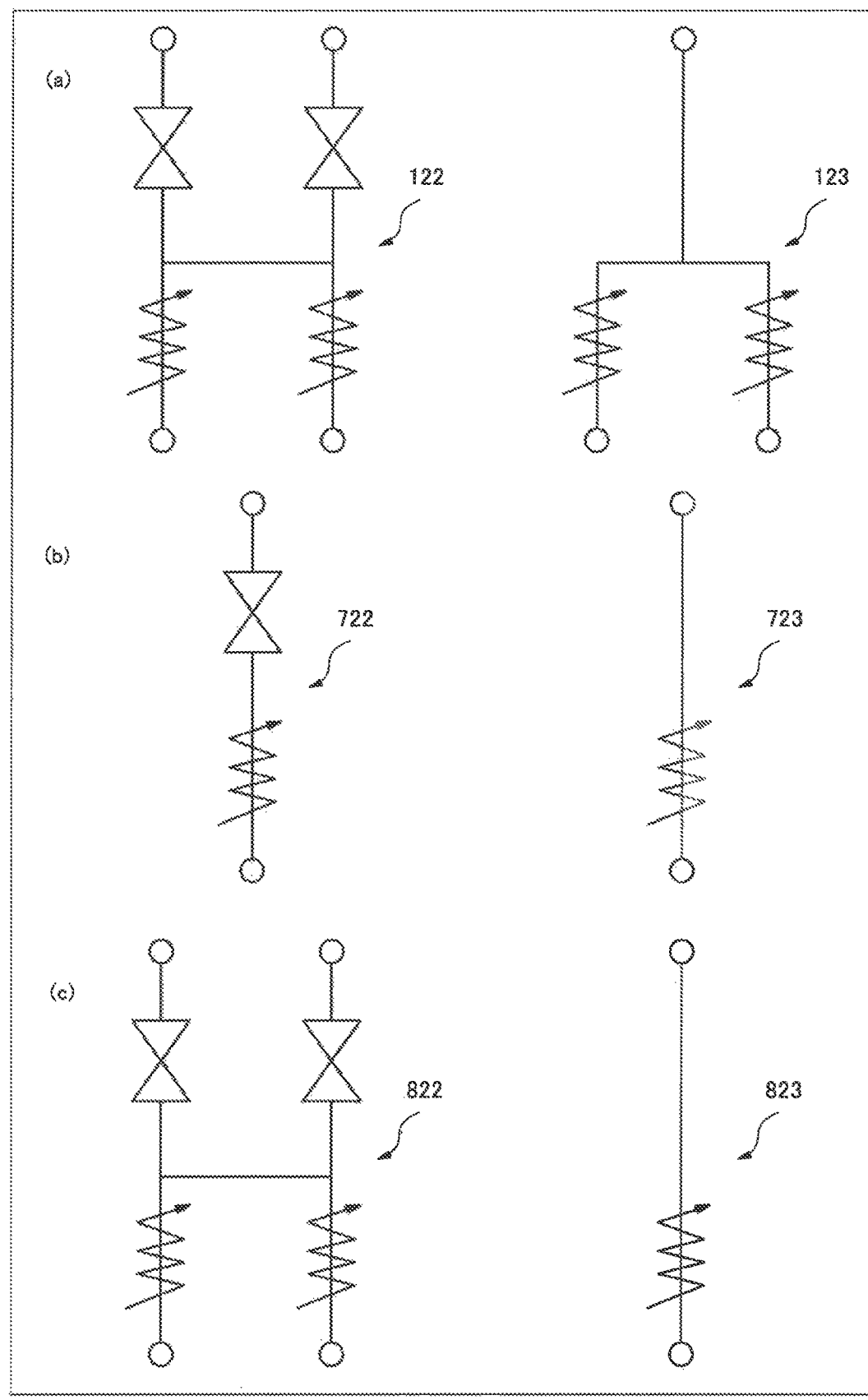
FIG. 15(a) to (c) of FIG. 15 are equivalent circuit diagrams of multi-terminal switches with rectifying elements and multi-terminal switches of example embodiments.
Figure 16:
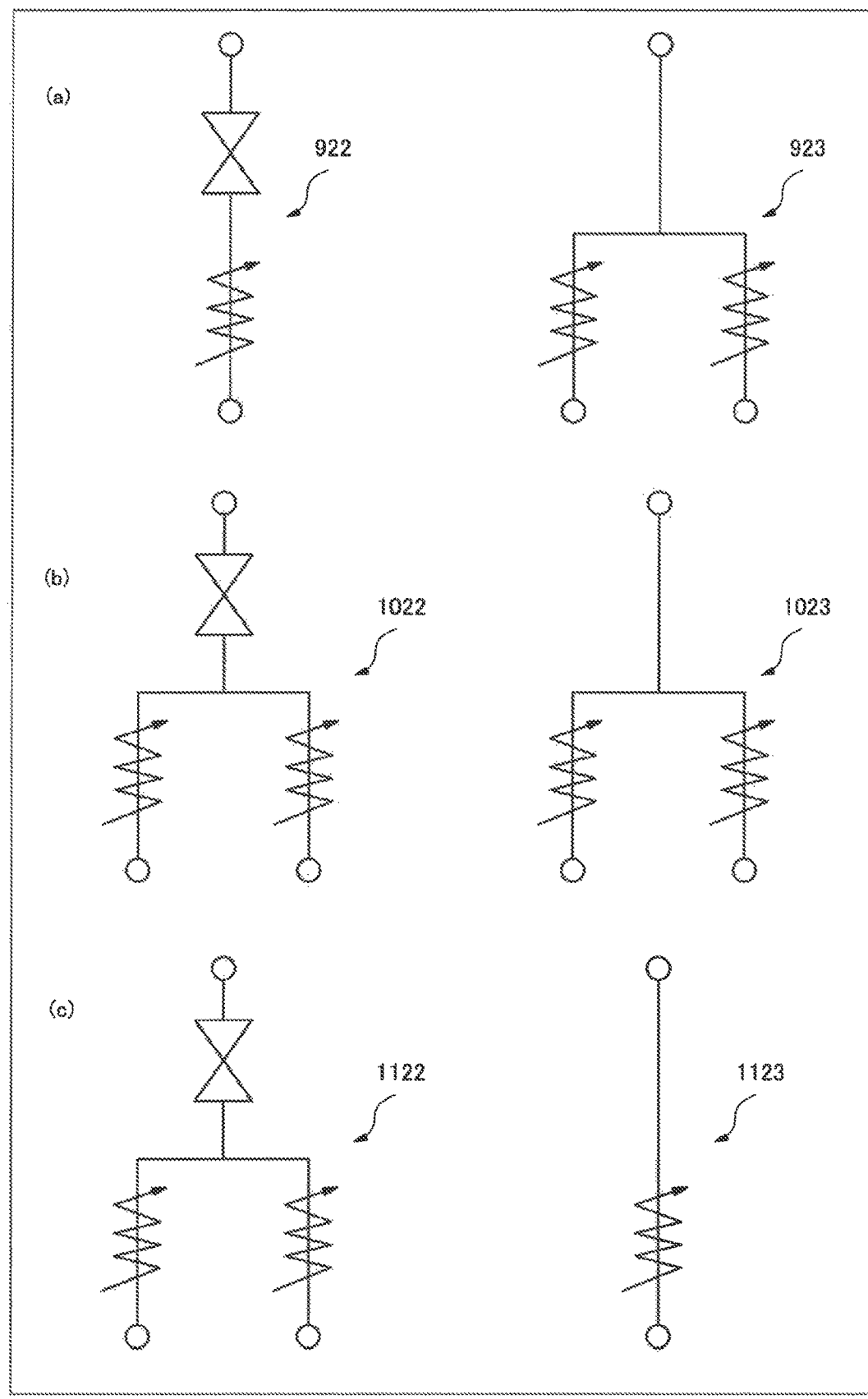
FIG. 16(a) to (c) of FIG. 16 are equivalent circuit diagrams of multi-terminal switches with a rectifying element and multi-terminal switches of example embodiments.

In FIGS. 15 and 16, equivalent circuit diagrams of semiconductor devices each of which includes a first switching element having a rectifying element(s) and a second switching element having no rectifying element are illustrated. A lot of variations can be conceived by a combination of the number of terminals in each switching element and whether or not a rectifying element is included in each switching element. (a) of FIG. 15 is equivalent circuit diagrams of a four-terminal switch 122 with rectifying elements and a three-terminal switch 123 of an example embodiment. (b) of FIG. 15 is equivalent circuit diagrams of a two-terminal switch 722 with a rectifying element and a two-terminal switch 723 of an example embodiment. (c) of FIG. 15 is equivalent circuit diagrams of a four-terminal switch 822 with rectifying elements and a two-terminal switch 823 of an example embodiment. (a) of FIG. 16 is equivalent circuit diagrams of a two-terminal switch 922 with a rectifying element and a three-terminal switch 923 of an example embodiment. (b) and (c) of FIG. 16 are equivalent circuit diagrams of a three-terminal switch 1022 with a rectifying element and a three-terminal switch 1023 of an example embodiment and equivalent circuit diagrams of a three-terminal switch 1122 with a rectifying element and a two-terminal switch 1123 of an example embodiment, respectively. Hereinafter, specific semiconductor devices of example embodiments and methods for producing the semiconductor devices will be described.

First Example Embodiment

Figure 1:
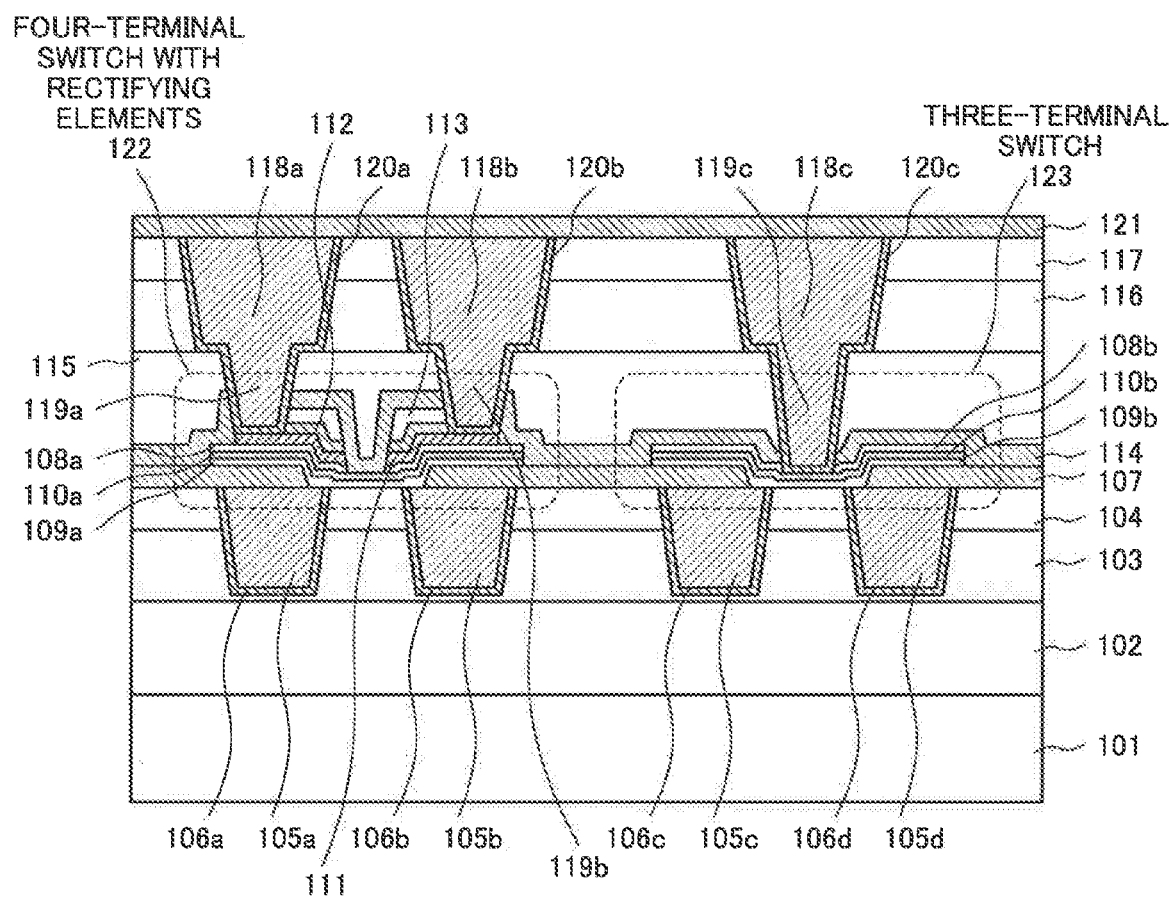
FIG. 1 is a cross-sectional schematic view illustrating a configuration example of a semiconductor device of a first example embodiment.

A semiconductor device according to a first example embodiment of the present invention and a method for producing the semiconductor device will be described. The present example embodiment is a semiconductor device that has "a four-terminal switch with rectifying elements and a three-terminal switch" formed within a multilayer wiring layer. FIG. 1 is a cross-sectional schematic view illustrating a configuration example of a semiconductor device of the first example embodiment. The present example embodiment is a semiconductor device that includes a four-terminal switch with rectifying elements and a three-terminal switch within a multilayer wiring layer and the equivalent circuit diagrams of which are illustrated in (a) of FIG. 15.

Configuration

The semiconductor device illustrated in FIG. 1 has a four-terminal switch 122 with rectifying elements and a three-terminal switch 123 within a multilayer wiring layer on a semiconductor substrate 101.

The multilayer wiring layer has an insulating stacked body in which, on the semiconductor substrate 101, an interlayer insulating film 102, a low-k insulating film 103, an interlayer insulating film 104, a barrier insulating film 107, a protection insulating film 114, an interlayer insulating film 115, a low-k insulating film 116, an interlayer insulating film 117, and a barrier insulating film 121 are stacked in this sequence. The multilayer wiring layer has, in wiring grooves formed in the interlayer insulating film 104 and the low-k insulating film 103, first wirings 105a and 105b embedded with first barrier metals 106a and 106b in between, respectively. In addition, the multilayer wiring layer has, in wiring grooves formed in the interlayer insulating film 104 and the low-k insulating film 103, first wirings 105c and 105d embedded with first barrier metals 106c and 106d in between, respectively.

Further, the multilayer wiring layer has second wirings 118a, 118b, and 118c embedded in wiring grooves formed in the interlayer insulating film 117 and the low-k insulating film 116. Furthermore, vias 119a, 119b, and 119c are embedded in lower holes that are formed in the interlayer insulating film 115, the protection insulating film 114, and a first hard mask film 112. Each of pairs of the second wiring 118a and the via 119a, the second wiring 118b and the via 119b, and the second wiring 118c and the via 119c are integrated into one body. In addition, the side surfaces and the bottom surfaces of pairs of the second wiring 118a and the via 119a, the second wiring 118b and the via 119b, and the second wiring 118c and the via 119c are covered by second barrier metals 120a, 120b, and 120c, respectively.

In an opening section formed in the barrier insulating film 107, on the first wirings 105a and 105b that serve as first electrodes, a portion of the interlayer insulating film 104 flanked by the first wirings 105a and 105b, the wall surface of the opening section in the barrier insulating film 107, and the barrier insulating film 107, an ion conductive layer 109a, a second electrode 110a, a rectifying layer 108a, and a third electrode 111 are stacked in this sequence and the four-terminal switch 122 with rectifying elements is thereby formed. In addition, on the third electrode 111, the first hard mask film 112 and a second hard mask film 113 are formed. Further, the upper surface and the side face of a stacked body of the ion conductive layer 109a, the second electrode 110a, the rectifying layer 108a, the third electrode 111, the first hard mask film 112, and the second hard mask film 113 are covered by the protection insulating film 114.

The multilayer wiring layer has, in another opening section formed in the barrier insulating film 107, on the first wirings 105c and 105d that serve as first electrodes, a portion of the interlayer insulating film 104 flanked by the first wirings 105c and 105d, the wall surface of the another opening section in the barrier insulating film 107, and the barrier insulating film 107, the three-terminal switch 123 formed in which an ion conductive layer 109b, a second electrode 110b, and a rectifying layer 108b are stacked in this sequence and the upper surface and the side face of a stacked body of the ion conductive layer 109b and the second electrode 110b covered by the protection insulating film 114.

Forming portions of the first wirings 105a and 105b into lower electrodes of the four-terminal switch 122 with rectifying elements and forming portions of the first wirings 105c and 105d into lower electrodes of the three-terminal switch 123, while simplifying the number of process steps, enable electrode resistance to be reduced. Only generating a mask set of at least three PRs as additional process steps to a regular copper damascene wiring process enables the four-terminal switch 122 with rectifying elements and the three-terminal switch 123 to be provided in the same wiring layer, which enables reduction in element resistance and cost reduction to be achieved at the same time.

The four-terminal switch 122 with rectifying elements has the ion conductive layer 109a in direct contact with the first wirings 105a and 105b in regions in the opening section formed in the barrier insulating film 107. A metal constituting a portion of the ion conductive layer 109a diffuses into the first wirings 105a and 105b and thereby forms alloy layers.

The three-terminal switch 123 has the ion conductive layer 109b in direct contact with the first wirings 105c and 105d in regions in the another opening section formed in the barrier insulating film 107. A metal constituting a portion of the ion conductive layer 109b diffuses into the first wirings 105c and 105d and thereby forms alloy layers.

The four-terminal switch 122 with rectifying elements has the rectifying layer 108a on the second electrode 110a, and the rectifying layer 108a is in contact with the third electrode 111 at the upper surface of the rectifying layer 108a. The third electrode 111 of the four-terminal switch 122 with rectifying elements is electrically separated into two regions by etching. On this occasion, the rectifying layer 108a may be separated into two regions as with the third electrode 111 or does not have to be separated. On the third electrode 111, the first hard mask film 112 and the second hard mask film 113, which are separated as with the third electrode 111, remain. The second hard mask film 113 does not have to remain.

In the four-terminal switch 122 with rectifying elements, the vias 119a and 119b and the third electrode 111 are electrically connected to each other with the second barrier metals 120a and 120b in between, respectively, on the third electrode 111.

The four-terminal switch 122 with rectifying elements is on/off controlled by applying voltage or flowing current between the second electrode 110a and the first wiring 105a or 105b with the rectifying layer 108a in between, such as being on/off controlled by use of electric field diffusion of metal ions supplied from a metal forming the first wirings 105a and 105b into the ion conductive layer 109a. On this occasion, on-resistance is determined by current in the rectifying layer 108a.

In the three-terminal switch 123, the via 119c and the second electrode 110b are electrically connected to each other with the second barrier metal 120c in between, on the second electrode 110b. The rectifying layer 108b may remain on the second electrode 110b or may be removed when etching is performed in a production process of the three-terminal switch 123. The three-terminal switch 123 is on/off controlled by applying voltage or flowing current, such as being on/off controlled by use of electric field diffusion of metal ions supplied from a metal forming the first wirings 105c and 105d into the ion conductive layer 109b.

The semiconductor substrate 101 is a substrate on which semiconductor elements are formed. For the semiconductor substrate 101, substrates, such as a silicon substrate, a single crystal substrate, a Silicon On Insulator (SOI) substrate, a Thin Film Transistor (TFT) substrate, a substrate for liquid crystal production and the like can be used.

The interlayer insulating film 102 is an insulating film that is formed on the semiconductor substrate 101. For the interlayer insulating film 102, for example, a silicon oxide film, a SiOC film or the like can be used. The interlayer insulating film 102 may be a stack of a plurality of insulating films.

For the low-k insulating film 103, a low dielectric constant film (for example, a SiOCH film) or the like that has a lower relative dielectric constant than a silicon oxide film is used. The low-k insulating film 103 is an insulating film that is interposed between the interlayer insulating films 102 and 104 and has a low dielectric constant. In the low-k insulating film 103, wiring grooves for embedding the first wirings 105a, 105b, 105c, and 105d are formed. In the wiring grooves in the low-k insulating film 103, the first wirings 105a, 105b, 105c, and 105d are embedded with the first barrier metals 106a, 106b, 106c, and 106d in between, respectively.

The interlayer insulating film 104 is an insulating film that is formed on the low-k insulating film 103. For the interlayer insulating film 104, for example, a silicon oxide film, a SiOC film or the like can be used. The interlayer insulating film 104 may be a stack of a plurality of insulating films. In the interlayer insulating film 104, wiring grooves for embedding the first wirings 105a, 105b, 105c, and 105d are formed. In the wiring grooves in the interlayer insulating film 104, the first wirings 105a, 105b, 105c, and 105d are embedded with the first barrier metals 106a, 106b, 106c, and 106d in between, respectively.

The first wirings 105a and 105b are wirings that are embedded in the wiring grooves formed in the interlayer insulating film 104 and the low-k insulating film 103 with the first barrier metals 106a and 106b in between, respectively. The first wirings 105a and 105b also serve as the lower electrodes of the four-terminal switch 122 with rectifying elements and are in direct contact with the ion conductive layer 109a. The upper surface of the ion conductive layer 109a is in direct contact with the second electrode 110a. As a metal constituting the first wirings 105a and 105b, a metal that can diffuse and be ion-conducted in the ion conductive layer 109a is used and, for example, copper or the like can be used. The metal (for example, copper) constituting the first wirings 105a and 105b may be alloyed with aluminum.

The first wirings 105c and 105d are wirings that are embedded in the wiring grooves formed in the interlayer insulating film 104 and the low-k insulating film 103 with the first barrier metals 106c and 106d in between, respectively. The first wirings 105c and 105d also serve as the lower electrodes of the three-terminal switch 123 and are in direct contact with the ion conductive layer 109b. The upper surface of the ion conductive layer 109b is in direct contact with the second electrode 110b. As a metal constituting the first wirings 105c and 105d, a metal that can diffuse and be ion-conducted in the ion conductive layer 109b is used and, for example, copper or the like can be used. The metal (for example, copper) constituting the first wirings 105c and 105d may be alloyed with aluminum.

The first barrier metals 106a, 106b, 106c, and 106d are conductive films having a barrier property. The first barrier metals 106a, 106b, 106c, and 106d, in order to prevent the metal forming the first wirings 105a, 105b, 105c, and 105d from diffusing into the interlayer insulating film 104 and lower layers, covers the side surfaces and the bottom surfaces of the respective wirings. When the first wirings 105a, 105b, 105c, and 105d are constituted by metallic elements including copper as a main component, a refractory metal, a nitride thereof or the like, such as tantalum, tantalum nitride, titanium nitride, and tungsten carbonitride, or a stacked film thereof can be used for the first barrier metals 106a, 106b, 106c, and 106d.

The barrier insulating film 107 is formed on the interlayer insulating film 104 including the first wirings 105a, 105b, 105c, and 105d. This configuration enables the barrier insulating film 107 to have roles of preventing the metal (for example, copper) forming the first wirings 105a, 105b, 105c, and 105d from being oxidized, preventing the metal forming the first wirings 105a, 105b, 105c, and 105d from diffusing into the interlayer insulating film 115, and working as an etching stop layer at the time of processing the third electrode 111, the rectifying layers 108a and 108b, the second electrodes 110a and 110b, and the ion conductive layers 109a and 109b. For the barrier insulating film 107, for example, a SiC film, a silicon carbonitride film, a silicon nitride film, a stacked structure thereof or the like can be used. The barrier insulating film 107 is preferably made of the same material as the protection insulating film 114 and the first hard mask film 112.

The ion conductive layers 109a and 109b are films the resistance of which changes. For the ion conductive layers 109a and 109b, a material the resistance of which changes due to action (diffusion, ionic conduction, or the like) of metal ions generated from the metal forming the first wirings 105a, 105b, 105c, and 105d (lower electrodes) can be used. When resistance change in association with switching to an on-state is achieved through deposition of a metal by reduction of metal ions, a film capable of conducting ions is used for the ion conductive layers 109a and 109b.

The ion conductive layers 109a and 109b are respectively constituted by ion conductive layers that are made of a metal oxide and are in contact with the first wirings 105a, 105b, 105c, and 105d and ion conductive layers that are made of a polymer and are in contact with the second electrodes 110a and 110b.

The ion conductive layer made of a polymer in each of the ion conductive layers 109a and 109b is formed using a plasma-enhanced chemical vapor deposition (plasma-enhanced CVD) method. Raw material of cyclic organosiloxane and helium, which is a carrier gas, are flowed into a reaction chamber, and, when the supply of both the cyclic organosiloxane and helium has stabilized and pressure in the reaction chamber has become constant, application of Radio Frequency (RF) electric power is started. The amount of supply of the raw material is set at 10 to 200 sccm, and 500 sccm helium is supplied via a raw material vaporizer.

The ion conductive layer made of a metal oxide in each of the ion conductive layers 109a and 109b has a plurality of roles. One role is to prevent the metal forming the first wirings 105a, 105b, 105c, and 105d from diffusing into the ion conductive layer made of a polymer due to application of heat and plasma during deposition of the ion conductive layer made of a polymer. Another role is to prevent the first wirings 105a, 105b, 105c, and 105d from being oxidized and becoming easily accelerated to diffuse into the ion conductive layer made of a polymer. A metal, such as zirconium, hafnium, aluminum and titanium, that forms the ion conductive layer made of a metal oxide, after film formation of the metal that constitutes the ion conductive layer made of a metal oxide, is exposed to an oxygen atmosphere under reduced pressure in a film forming chamber for the ion conductive layer made of a polymer and becomes zirconium oxide, hafnium oxide, aluminum oxide, or titanium oxide, thereby becoming a portion of each of the ion conductive layers 109a and 109b. An optimum thickness of a metal film that forms the ion conductive layer made of a metal oxide is 0.5 to 1 nm. The metal film that is used for forming the ion conductive layer made of a metal oxide may form a stack or a single layer. Film formation of the metal film that is used for forming the ion conductive layer made of a metal oxide is preferably performed by sputtering. Metal atoms or ions having acquired energy through sputtering plunge and diffuse into the first wirings 105a, 105b, 105c, and 105d and form alloy layers.

The ion conductive layer 109a is formed on the first wirings 105a and 105b, a portion of the interlayer insulating film 104 flanked by the first wirings 105a and 105b, tapered surfaces formed in the opening section in the barrier insulating film 107, and the barrier insulating film 107.

The ion conductive layer 109b is formed on the first wirings 105c and 105d, a portion of the interlayer insulating film 104 flanked by the first wirings 105c and 105d, tapered surfaces formed in the another opening section in the barrier insulating film 107, and the barrier insulating film 107.

The second electrodes 110a and 110b are upper electrodes of the four-terminal switch 122 with rectifying elements and the three-terminal switch 123 and are in direct contact with the ion conductive layers 109a and 109b, respectively.

For the second electrodes 110a and 110b, a ruthenium alloy containing titanium, tantalum, zirconium, hafnium, aluminum or the like is used. Ruthenium is a metal that is harder to ionize than the metal forming the first wirings 105a, 105b, 105c, and 105d and is hard to diffuse and be ion-conducted in the ion conductive layers 109a and 109b. Titanium, tantalum, zirconium, hafnium, or aluminum that is added to a ruthenium alloy has a good adhesiveness with the metal forming the first wirings 105a, 105b, 105c, and 105d. As a first metal that constitutes the second electrodes 110a and 110b and is added to ruthenium, it is preferable to select a metal that has a standard Gibbs energy of formation of a process of generating metal ions from the metal (oxidation process) larger than ruthenium in the negative direction. Because of having a standard Gibbs energy of formation of a process of generating metal ions from a metal (oxidation process) larger than ruthenium in the negative direction and being more likely to spontaneously react chemically than ruthenium, titanium, tantalum, zirconium, hafnium, aluminum and the like are highly reactive. For this reason, in the ruthenium alloy that forms the second electrodes 110a and 110b, alloying titanium, tantalum, zirconium, hafnium, aluminum or the like with ruthenium improves adhesiveness thereof with metal cross-links formed by the metal forming the first wirings 105a, 105b, 105c, and 105d.

On the other hand, an additive metal itself like titanium, tantalum, zirconium, hafnium, aluminum or the like, not alloyed with ruthenium, becomes too highly reactive, which causes a transition to an "OFF" state not to occur. While a transition from an "ON" state to an "OFF" state proceeds through oxidation reaction (dissolution reaction) of metal cross-links, when a metal constituting the second electrodes 110a and 110b has a standard Gibbs energy of formation of a process of generating metal ions from the metal (oxidation process) larger, in the negative direction, than the metal forming the first wirings 105a, 105b, 105c, and 105d, the oxidation reaction of the metal constituting the second electrodes 110a and 110b proceeds faster than the oxidation reaction of metal cross-links formed by the metal forming the first wirings 105a, 105b, 105c, and 105d, which causes a transition to the "OFF" state not to occur.

For this reason, a metal material that is used to form the metal constituting the second electrodes 110a and 110b is required to be alloyed with ruthenium that has a standard Gibbs energy of formation of a process of generating metal ions from the metal (oxidation process) smaller than copper in the negative direction.

Further, when copper, which is a component of metal cross-links, mixes with the metal constituting the second electrodes 110a and 110b, an effect of adding a metal having a large standard Gibbs energy of formation in the negative direction is reduced. For this reason, a material having a barrier property against copper and copper ions is preferable as a metal added to ruthenium. Such materials include, for example, tantalum and titanium. On the other hand, it has been revealed that, the larger the amount of additive metal is, the more stable an "ON" state becomes, and even an addition of only 5 atm % metal improves the stability. In particular, a case of using titanium as an additive metal excels in transition to an-off state and stability of an on-state, and it is particularly preferable that an alloy of ruthenium and titanium be used as the metal constituting the second electrodes 110a and 110b and a content of titanium be set at a value within a range from 20 atm % to 30 atm %. A content of ruthenium in the ruthenium alloy is preferably set at a value of 60 atm % or higher and 90 atm % or lower.

For forming a ruthenium alloy, it is preferable to use a sputtering method. When an alloy is film-formed using a sputtering method, the sputtering methods include a method of using a target made of an alloy of ruthenium and the first metal, a co-sputtering method of sputtering a ruthenium target and a first metal target in the same chamber at the same time, and an intermixing method in which a thin film of the first metal is formed in advance, ruthenium is film-formed on the thin film by a sputtering method, and the first metal and the ruthenium are alloyed with energy of colliding atoms. Use of the co-sputtering method and the intermixing method enables composition of an alloy to be altered. When the intermixing method is employed, it is preferable that, after ruthenium film formation has been finished, heat treatment at a temperature of 400° C. or lower be performed for "planarization" of the mixed state of metals.

The second electrodes 110a and 110b preferably have a two-layer structure. When the sides of the second electrodes 110a and 110b in contact with the ion conductive layers 109a and 109b are made of a ruthenium alloy, the sides of the second electrodes 110a and 110b in contact with the rectifying layers 108a and 108b serve as lower electrodes of the rectifying elements. As a metal species, a metal nitride, such as titanium nitride and tantalum nitride, that is difficult to be oxidized, easy to process, and the work function of which is adjustable by adjusting composition thereof can be used.

Titanium and tantalum may also be used as long as being able to inhibit oxidation at boundary faces of the second electrodes 110a and 110b with the rectifying layers 108a and 108b. Titanium nitride, tantalum nitride, titanium, or tantalum is film-formed on the ruthenium alloy layer by a sputtering method in a continuous vacuum process. When titanium or tantalum is nitrided, the nitride is film-formed by introducing nitrogen into a chamber and using a reactive sputtering method.

The rectifying layers 108a and 108b are layers that have a bipolar rectification effect and have a characteristic in which current increases in a non-linear manner with respect to applied voltage. A Poole-Frenkel type insulating film, a Schottky type insulating film, a threshold switching type volatile variable-resistance film, or the like can be used as the rectifying layers 108a and 108b. For example, a film containing any of titanium oxide, tungsten oxide, molybdenum oxide, hafnium oxide, aluminum oxide, zirconium oxide, yttrium oxide, manganese oxide, niobium oxide, silicon nitride, silicon carbonitride, silicon oxide and amorphous silicon can be used as the rectifying layers 108a and 108b. In particular, constituting a stack by stacking amorphous silicon, silicon nitride, and amorphous silicon in this sequence enables excellent non-linearity to be generated. By, by means of interposing a silicon nitride film between amorphous silicon films, causing composition of a portion of the silicon nitride film to be brought to a state in which nitrogen is deficient from the stoichiometric ratio and thereby reducing differences in barrier heights with the second electrodes 110a and 110b and the third electrode 111, it is possible to facilitate tunneling current to flow to the silicon nitride at the time of high voltage application. As a result, a non-linear current change is generated.

The third electrode 111 is a metal that serves as upper electrodes of the rectifying elements, and, for example, tantalum, titanium, tungsten, a nitride thereof, or the like can be used for the third electrode 111. In order to make current-voltage characteristics of the rectifying elements symmetrical in both positive and negative sides, it is preferable to use the same material as those of the second electrodes 110a and 110b for the third electrode 111. The third electrode 111 also has a function as an etching stop layer when the vias 119a and 119b are electrically connected onto the second electrode 110a. Thus, it is preferable that the third electrode 111 have a low etching rate for plasma of a fluorocarbon-based gas that is used in etching of the interlayer insulating film 115. For forming the third electrode 111, it is preferable to use a sputtering method. When a metal nitride is film-formed using a sputtering method, it is preferable to use a reactive sputtering method in which a metal target is vaporized using plasma of a gas mixture of nitrogen and argon. A metal vaporized from the metal target reacts with nitrogen and forms a metal nitride, which is film-formed on a substrate.

The third electrode 111 is present only on the four-terminal switch 122 with rectifying elements in which rectifying elements are formed and separated into two regions on the four-terminal switch 122 with rectifying elements. As a result, two rectifying elements are arranged on the four-terminal switch 122 with rectifying elements independently of each other.

The first hard mask film 112 is a film that serves as a hard mask film and a passivation film when the third electrode 111, the second electrodes 110a and 110b, the rectifying layers 108a and 108b, and the ion conductive layers 109a and 109b are etched. For the first hard mask film 112, for example, a silicon nitride film, a silicon oxide film or the like, or a stack thereof can be used. The first hard mask film 112 preferably includes the same material as the protection insulating film 114 and the barrier insulating film 107.

The second hard mask film 113 is a film that serves as a hard mask film when the third electrode 111, the second electrodes 110a and 110b, the rectifying layers 108a and 108b, and the ion conductive layers 109a and 109b are etched. For the second hard mask film 113, for example, a silicon nitride film, a silicon oxide film or the like, or a stack thereof can be used.

Based on a shape of the second hard mask film 113, the four-terminal switch 122 with rectifying elements and the three-terminal switch 123 are formed differently from each other. On the barrier insulating film 107 of both the four-terminal switch 122 with rectifying elements and the three-terminal switch 123, the ion conductive layers 109a and 109b, the second electrodes 110a and 110b, the rectifying layers 108a and 108b, the third electrode 111, the first hard mask film 112, and the second hard mask film 113 are film-formed. Subsequently, in a manner in which a shape of the second hard mask film 113, formed through two rounds of patterning and etching, is transferred onto the four-terminal switch 122 with rectifying elements, two rectifying elements are formed separated from each other on the second electrode 110a in one round of etching.

That is, a stacked structure for the four-terminal switch 122 with rectifying elements is film-formed once on the whole wafer, and, on an element portion to which the three-terminal switch 123 is to be formed, patterning for forming a rectifying element portion in the four-terminal switch 122 with rectifying elements is configured not to be performed (a resist is configured not to be left). This configuration causes thickness of a portion of the second hard mask film 113 on the three-terminal switch 123 to be reduced. Subsequently, performing etching enables a portion of the third electrode 111 on the three-terminal switch 123 to be removed. That is, an area on the three-terminal switch 123 is brought into the same condition as an area on the four-terminal switch 122 with rectifying elements except an area under which the rectifying elements are formed. The rectifying layer 108b may or does not have to remain on the second electrode 110a of the three-terminal switch 123. In addition, the first hard mask film 112 and the second hard mask film 113 do not remain on the three-terminal switch 123.

The protection insulating film 114 is an insulating film that has functions of preventing the four-terminal switch 122 with rectifying elements and the three-terminal switch 123 from being damaged and further preventing desorption of oxygen from the ion conductive layers 109a and 109b. For the protection insulating film 114, for example, a silicon nitride film, a silicon carbonitride film or the like can be used. The protection insulating film 114 is preferably made of the same material as the first hard mask film 112 and the barrier insulating film 107. In the case of being made of the same material, the protection insulating film 114 is integrated into one body with the barrier insulating film 107 and the first hard mask film 112 and adhesiveness of boundary faces thereamong is thereby improved, which enables the four-terminal switch 122 with rectifying elements and the three-terminal switch 123 to be protected more securely.

The interlayer insulating film 115 is an insulating film that is formed on the protection insulating film 114. For the interlayer insulating film 115, for example, a silicon oxide film, a SiOC film or the like can be used. The interlayer insulating film 115 may be a stack of a plurality of insulating films. The interlayer insulating film 115 may be made of the same material as the interlayer insulating film 117. In the interlayer insulating film 115, lower holes for embedding the vias 119a, 119b, and 119c are formed, and, in the lower holes, the vias 119a, 119b, and 119c are embedded with the second barrier metals 120a, 120b, and 120c in between, respectively.

For the low-k insulating film 116, a low dielectric constant film (for example, a SiOCH film) or the like that has a lower relative dielectric constant than a silicon oxide film is used. The low-k insulating film 116 is an insulating film that is interposed between the interlayer insulating films 115 and 117 and has a low dielectric constant. In the low-k insulating film 116, wiring grooves for embedding the second wirings 118a, 118b, and 118c are formed. In the wiring grooves in the low-k insulating film 116, the second wirings 118a, 118b, and 118c are embedded with the second barrier metals 120a, 120b, and 120c in between, respectively.

The interlayer insulating film 117 is an insulating film that is formed on the low-k insulating film 116. For the interlayer insulating film 117, for example, a silicon oxide film, a SiOC film, a low dielectric constant film (for example, a SiOCH film) that has a lower relative dielectric constant than a silicon oxide film, or the like can be used. The interlayer insulating film 117 may be a stack of a plurality of insulating films. The interlayer insulating film 117 may be made of the same material as the interlayer insulating film 115. In the interlayer insulating film 117, wiring grooves for embedding the second wirings 118a, 118b, and 118c are formed. In the wiring grooves in the interlayer insulating film 117, the second wirings 118a, 118b, and 118c are embedded with the second barrier metals 120a, 120b, and 120c in between, respectively.

The second wirings 118a, 118b, and 118c are wirings that are embedded in the wiring grooves formed in the interlayer insulating film 117 and the low-k insulating film 116 with the second barrier metals 120a, 120b, and 120c in between, respectively. The second wirings 118a, 118b, and 118c are integrated into one body with the vias 119a, 119b, and 119c, respectively.

The vias 119a and 119b are embedded in the lower holes formed in the interlayer insulating film 115, the protection insulating film 114, the first hard mask film 112, and the second hard mask film 113 with the second barrier metals 120a and 120b in between, respectively. The via 119c is embedded in the lower hole formed in the interlayer insulating film 115 and the protection insulating film 114 with the second barrier metal 120c in between.

The vias 119a and 119b are electrically connected to the third electrode 111 with the second barrier metals 120a and 120b in between, respectively. The via 119c is electrically connected to the second electrode 110b with the second barrier metal 120c in between. For the second wirings 118a, 118b, and 118c and the vias 119a, 119b, and 119c, for example, copper can be used.

The second barrier metals 120a, 120b, and 120c are conductive films that cover the side surfaces and the bottom surfaces of the second wirings 118a, 118b, and 118c and the vias 119a, 119b, and 119c, respectively and have a barrier property. The second barrier metals 120a, 120b, and 120c prevent a metal forming the second wirings 118a, 118b, and 118c (including the vias 119a, 119b, and 119c) from diffusing into the interlayer insulating films 115 and 117 and lower layers.

For example, when the second wirings 118a, 118b, and 118c and the vias 119a, 119b, and 119c are constituted by metallic elements including copper as a main component, a refractory metal, a nitride thereof or the like, such as tantalum, tantalum nitride, titanium nitride, and tungsten carbonitride, or a stack thereof can be used for the second barrier metals 120a, 120b, and 120c.

The barrier insulating film 121 is an insulating film that is formed on the interlayer insulating film 117 including the second wirings 118a, 118b, and 118c. The barrier insulating film 121 has roles of preventing the metal (for example, copper) forming the second wirings 118a, 118b, and 118c from being oxidized and preventing the metal forming the second wirings 118a, 118b, and 118c from diffusing into upper layers. For the barrier insulating film 121, for example, a silicon carbonitride film, a silicon nitride film, a stacked structure thereof or the like can be used.

Embodiment Mode 1

An advantageous effect of "a three-terminal switch with rectifying elements and a three-terminal switch formed within a multilayer wiring layer" described in the first example embodiment described above will be described in accordance with FIGS. 2 to 5. In addition, an element configuration will be described in accordance with the terminology illustrated in FIG. 1.

Figure 2:
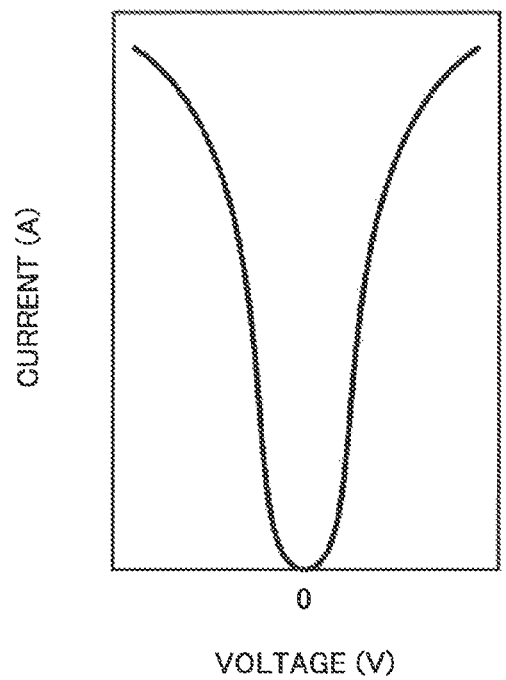
FIG. 2 is a conceptual diagram of current-voltage characteristics of a rectifying element.

In FIG. 2, a conceptual diagram of current-voltage characteristics of a rectifying element is illustrated. When voltage is applied between the second electrode 110a and the third electrode 111 of the four-terminal switch 122 with rectifying elements, the rectifying element exhibits current-voltage characteristics through the rectifying layer 108a that are non-linear and symmetrical in the positive and negative sides. While a high resistance is indicated in a low-voltage region, the current increases exponentially as the applied voltage increases. Resistance change is not retained in a non-volatile state, and, when voltage application is stopped, a low-resistance state is immediately released in a volatile manner.

Figure 3:
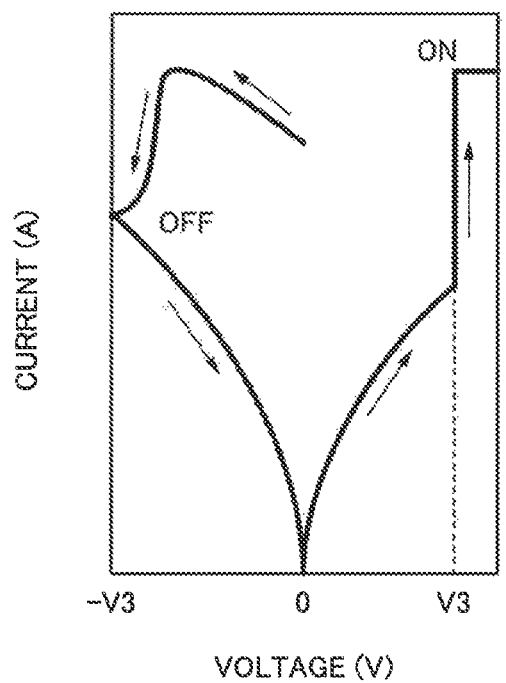
FIG. 3 is a conceptual diagram of current-voltage characteristics between a first wiring and a second electrode of a three-terminal switch.

In FIG. 3, a conceptual diagram of current-voltage characteristics between a first wiring and the second electrode of the three-terminal switch 123. When the second electrode 110b is grounded and a positive voltage is applied to the first wiring 105c, a metal constituting the first wiring 105c is ionized through an electrochemical reaction and metal ions are implanted into the ion conductive layer 109b. The implanted metal ions migrate to the second electrode 110b side and, receiving electrons, deposit in the ion conductive layer 109b as metal cross-links. When the second electrode 110b and the first wiring 105c are connected by the metal cross-links, the three-terminal switch 123 transitions to a low-resistance state (on-state) at V3 in FIG. 3. On the other hand, when a negative voltage is applied to the first wiring 105c, the metal cross-links are ionized into metal ions through a dissolution reaction and the metal ions are collected by the first wiring 105c, as a result of which the three-terminal switch 123 transitions to a high-resistance state (off-state) at −V3 in FIG. 3. Resistance change in the three-terminal switch 123 is retained in a non-volatile manner even after the applied voltage is cut off. When the three-terminal switch 123 transitions to the low-resistance state, current limitation is applied by a transistor connected in series and a resistance value in the low-resistance state is thereby determined. That is, thickness of the metal cross-links can be controlled by the current limitation by the transistor. Between the first wiring 105d and the second electrode 110b of the three-terminal switch 123, current-voltage characteristics similar to the current-voltage characteristics described above are also exhibited.

Figure 4:
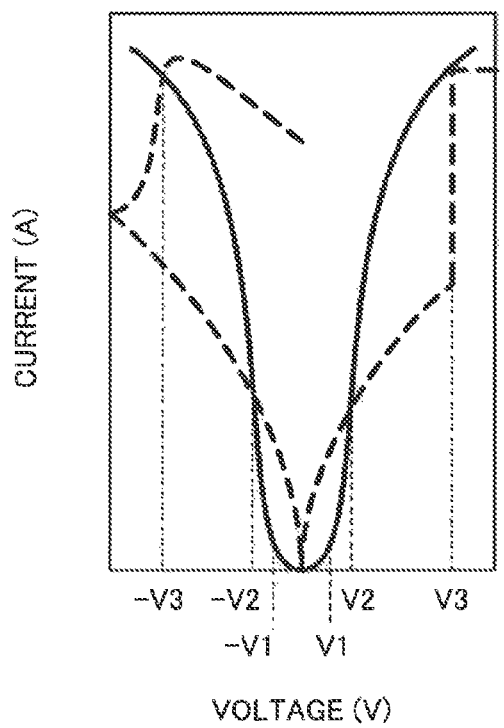
FIG. 4 is a conceptual diagram of current-voltage characteristics between a first wiring and a third electrode of a four-terminal switch with rectifying elements.
Figure 5:
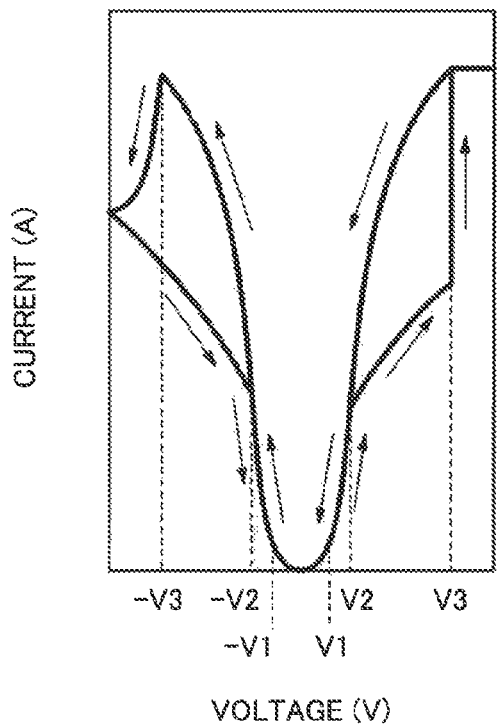
FIG. 5 is another conceptual diagram of the current-voltage characteristics between the first wiring and the third electrode of the four-terminal switch with rectifying elements.

In FIGS. 4 and 5, conceptual diagrams of current-voltage characteristics between the first wiring 105a and the region of the third electrode 111 in contact with the via 119b of the four-terminal switch 122 with rectifying elements are illustrated. While non-volatile switching in the four-terminal switch 122 with rectifying elements exhibits the same current-voltage characteristics as the current-voltage characteristics (FIG. 3) between the first wiring 105c and the second electrode 110b of the three-terminal switch 123, current limitation is performed by the rectifying layer 108a. For this reason, the current-voltage characteristics of the four-terminal switch 122 with rectifying elements exhibit current-voltage characteristics into which the current-voltage characteristics in FIGS. 2 and 3 are merged. In FIG. 4, the current-voltage characteristics in FIGS. 2 and 3 are illustrated in a superimposed manner.

When the region of the third electrode 111 in contact with the via 119b is grounded and positive voltage is applied to the first wiring 105a, the four-terminal switch 122 with rectifying elements exhibits current-voltage characteristics of a high-resistance rectifying element until the voltage reaches V2 at which the current-voltage characteristics in FIGS. 2 and 3 cross each other. For this reason, a high-resistance state is maintained at V1 that is a readout voltage in an off-state, which enables sneak current to be inhibited from flowing. While the four-terminal switch 122 with rectifying elements exhibits the current-voltage characteristics of the three-terminal switch 123 in a high-resistance state within a range of voltage from V2 to V3 at which the ion conductive layer 109a between the first wiring 105a and the second electrode 110a transitions to a low-resistance state, the four-terminal switch 122 with rectifying elements exhibits the current-voltage characteristics of a rectifying element after the ion conductive layer 109a between the first wiring 105a and the second electrode 110a has transitioned to a low-resistance state. On the other hand, when negative voltage is applied to the first wiring 105a, while the four-terminal switch 122 with rectifying elements first exhibits the current-voltage characteristics of a rectifying element until the voltage reaches −V3 at which the ion conductive layer 109a between the first wiring 105a and the second electrode 110a transitions to a high-resistance state and, subsequently, exhibits the current-voltage characteristics of the three-terminal switch 123 within a range of voltage from −V3 to −V2 at which the current-voltage characteristics in FIGS. 2 and 3 cross each other, the four-terminal switch 122 with rectifying elements exhibits the current-voltage characteristics of a high-resistance rectifying element within a range of voltage from −V2 to 0 V.

In FIG. 5, current-voltage characteristics between the first wiring 105a and the region of the third electrode 111 in contact with the via 119b of the four-terminal switch 122 with rectifying elements are illustrated. Between the first wiring 105b and the region of the third electrode 111 in contact with the via 119a of the four-terminal switch 122 with rectifying elements, current-voltage characteristics similar to the current-voltage characteristics described above are also exhibited.

Embodiment Mode 2

Next, a method for producing a semiconductor device of the present example embodiment will be described with reference to FIGS. 6 to 9. Specifically, a method for producing a semiconductor device that has "a four-terminal switch with rectifying elements and a three-terminal switch formed within a multilayer wiring layer" will be described. In particular, production steps in which switching elements employing a configuration of "a four-terminal switch with rectifying elements and a three-terminal switch" are formed within a multilayer wiring layer will be described.

Step 1

On a semiconductor substrate 601 (for example, a substrate on which semiconductor devices are formed), an interlayer insulating film 602 (for example, a silicon oxide film having a thickness of 500 nm) is deposited, and, subsequently, a low dielectric constant film (for example, a SiOCH film having a thickness of 150 nm) that has a low relative dielectric constant is deposited on the interlayer insulating film 602 as a low-k insulating film 603. Subsequently, a silicon oxide film (for example, a silicon oxide film having a thickness of 100 nm) is deposited on the low-k insulating film 603 as an interlayer insulating film 604. Subsequently, using a lithography method (including photoresist formation, dry etching, and photoresist removal), wiring grooves are formed in the interlayer insulating film 604 and the low-k insulating film 603. Subsequently, in the wiring grooves, first wirings 605a, 605b, 605c, and 605d (for example, copper) are embedded with first barrier metals 606a, 606b, 606c, and 606d (for example, tantalum having a film thickness of 5 nm and tantalum nitride having a film thickness of 5 nm) in between, respectively ((a) of FIG. 6).

The interlayer insulating films 602 and 604 can be formed by a plasma-enhanced CVD method. The first wirings 605a, 605b, 605c, and 605d can be formed by, for example, forming the first wirings 605a, 605b, 605c, and 605d (for example, a stacked film of tantalum nitride and tantalum) by a Physical Vapor Deposition (PVD) method, burying copper in the wiring grooves by an electrolytic plating method after forming copper seeds by the PVD method, and, after heat treatment at a temperature of 150° C. or higher, removing surplus copper other than copper in the wiring grooves by a Chemical Mechanical Polishing (CMP) method. As such a series of forming method of copper wirings, general methods in the technological field can be used. As used herein, the CMP method is a method for planarizing unevenness of a wafer surface generated in a multilayer wiring formation process by, flowing a polishing solution on the wafer surface, polishing the wafer surface with the wafer surface in contact with a rotated polishing pad. The CMP method is used for forming an embedded wiring (damascene wiring) by polishing surplus copper embedded in a groove or performing planarization by polishing an interlayer insulating film.

Step 2

Figure 6:
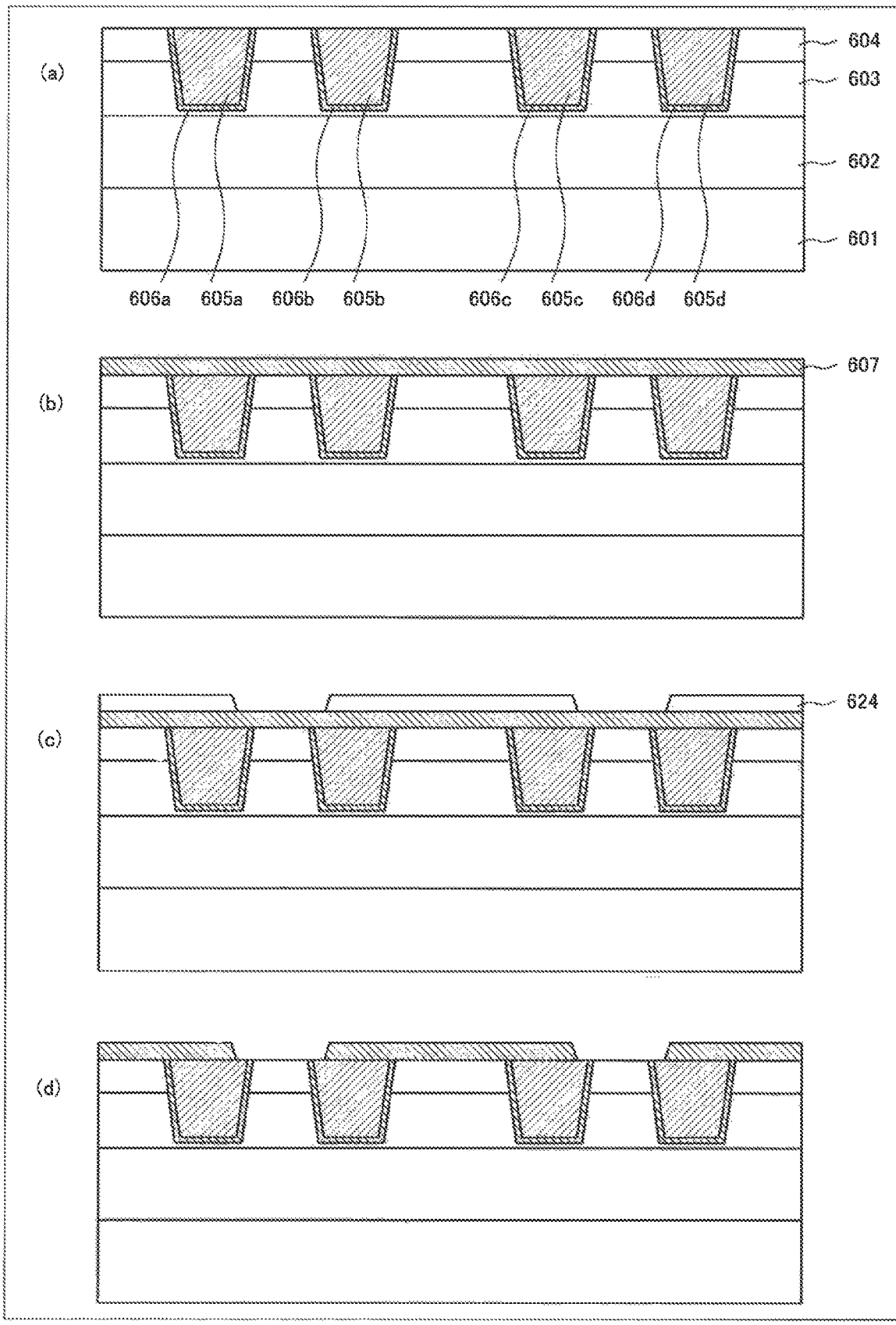
FIG. 6(a) to (d) of FIG. 6 are cross-sectional schematic views for a description of a method for producing the semiconductor device of the first example embodiment.

Next, as illustrated in (b) of FIG. 6, on the interlayer insulating film 604 including the first wirings 605a, 605b, 605c, and 605d, a barrier insulating film 607 (for example, a silicon nitride film or a silicon carbonitride film having a thickness of 30 nm) is formed. The barrier insulating film 607 can be formed using the plasma-enhanced CVD method. Thickness of the barrier insulating film 607 is preferably approximately 10 nm to 50 nm.

Step 3

Next, on the barrier insulating film 607, a hard mask film 624 (for example, a silicon oxide film having a thickness of 40 nm) is formed. On this occasion, the hard mask film 624 is preferably made of a material different from the material of the barrier insulating film 607 in terms of keeping an etching selectivity in dry etching processing at a high level and may be an insulating film or a conductive film. For the hard mask film 624, for example, silicon oxide, silicon nitride, titanium nitride, titanium, tantalum, tantalum nitride or the like can be used and a stacked body of a silicon nitride film and a silicon oxide film can also be used. Openings are patterned on the hard mask film 624 by use of a photoresist (not illustrated), opening patterns are formed on the hard mask film 624 by performing dry etching by use of the photoresist as a mask, and, subsequently, the photoresist is stripped by oxygen plasma ashing or the like ((c) of FIG. 6). On this occasion, the dry etching does not always have to be stopped at the upper surface of the barrier insulating film 607 and may reach the inside of the barrier insulating film 607.

Step 4

Openings are formed on the barrier insulating film 607 by etching back (dry etching) portions of the barrier insulating film 607 exposed from the openings of the hard mask film 624 by use of the hard mask film 624 as a mask, and the first wirings 605a, 605b, 605c, and 605d are thereby exposed from the openings of the barrier insulating film 607 ((d) of FIG. 6). Subsequently, by exposing the barrier insulating film 607 and the openings thereof to plasma using a gas mixture of nitrogen and argon, copper oxide formed on exposed surfaces of the first wirings 605a, 605b, 605c, and 605d are removed and, therewith, etching by-products and the like generated at the time of the etch-back are removed. In the etch-back of the barrier insulating film 607, use of reactive dry etching enables wall surfaces of the openings of the barrier insulating film 607 to be formed into tapered surfaces. In the reactive dry etching, a gas containing fluorocarbon can be used as an etching gas. Although the hard mask film 624 is preferably removed completely in the etch-back, the hard mask film 624 may be left unremoved when the hard mask film 624 is made of an insulating material. In addition, a shape of each opening of the barrier insulating film 607 may be configured to be a circle, the diameter of which is 30 nm to 500 nm.

Step 5

On the barrier insulating film 607 including the first wirings 605a, 605b, 605c, and 605d, an ion conductive layer 609 is formed. First, a zirconium film having a thickness of 1 nm is deposited by a sputtering method. The zirconium is oxidized when an ion conductive layer made of a polymer is film-formed and forms a portion of the ion conductive layer 609. On this occasion, the zirconium diffuses into portions of the first wirings 605a, 605b, 605c, and 605d that are in contact with the ion conductive layer 609, and alloy layers are spontaneously formed. Further, performing annealing under a vacuum environment at a temperature of 350° C. enables thickness of the alloy layers to be increased. The annealing is preferably performed for approximately 2 minutes. Further, a SiOCH-based polymer film containing silicon, oxygen, carbon, and hydrogen is formed as an ion conductive layer made of a polymer by a plasma-enhanced CVD method. Raw material of cyclic organosiloxane and helium, which is a carrier gas, are flowed into a reaction chamber, and, when the supply of both the cyclic organosiloxane and helium has stabilized and pressure in the reaction chamber has become constant, application of RF electric power is started. The amount of supply of the raw material is set at 10 to 200 sccm, and 500 sccm helium is supplied via a raw material vaporizer and another 500 sccm helium is supplied directly to the reaction chamber via a different line. Since moisture or the like adhere to the openings of the barrier insulating film 607 through air exposure, it is preferable to, before the ion conductive layer made of a polymer is deposited, perform degassing by performing heat treatment at a temperature of approximately 250° C. to 350° C. under reduced pressure.

On the ion conductive layer 609, a second electrode 610 having a stacked structure of an upper layer and a lower layer is formed. First, as the lower layer of the second electrode 610, an "alloy of ruthenium and titanium" is formed in a film thickness of 10 nm by a co-sputtering method. On this occasion, a ruthenium target and a titanium target are present in the same chamber, and sputtering both targets at the same time causes an alloy film to deposit. On this occasion, by setting applied power to the ruthenium target and the titanium target at 150 W and 50 W, respectively, a content of ruthenium in the "alloy of ruthenium and titanium" is set at 75 atm %. The ruthenium alloy serves as an upper electrode of the three-terminal switch. Further, as the upper layer of the second electrode 610, titanium nitride is formed on the ruthenium alloy in a film thickness of 5 nm to 10 nm by a reactive sputtering method. On this occasion, the sputtering is performed setting applied power to a titanium target at 500 W to 1 kW and introducing a nitrogen gas and an argon gas into a chamber. On this occasion, by setting a ratio between a flow rate of nitrogen and a flow rate of argon at 1:1, a ratio of titanium to titanium nitride is set at 70 atm %.

On the second electrode 610, amorphous silicon, silicon nitride, and amorphous silicon are film-formed in this sequence as a rectifying layer 608 by the plasma-enhanced CVD method. Thickness of each film is preferably 5 nm or thinner. For example, amorphous silicon and silicon nitride are film-formed in a thickness of 2 nm and a thickness of 1 nm, respectively. The film formation is performed in a continuous manner by switching gases to be introduced while plasma is ignited. Adjustment of flow rates of $SiH_4$ gas and nitrogen gas enables composition of silicon nitride to be controlled. On this occasion, setting a ratio between the flow rate of the $SiH_4$ gas and the flow rate of the nitrogen gas at 4:1 enables silicon nitride having composition close to the stoichiometric ratio to be obtained.

On the rectifying layer 608, titanium nitride is formed in a film thickness of 15 nm to 25 nm as a third electrode 611 by the reactive sputtering method. On this occasion, the sputtering is performed setting applied power to a titanium target at 500 W to 1 kW and introducing a nitrogen gas and an argon gas into a chamber. On this occasion, by setting a ratio between a flow rate of nitrogen and a flow rate of argon at 1:1, a ratio of titanium to titanium nitride is set at 70 atm % ((a) of FIG. 7).

Step 6

Figure 7:
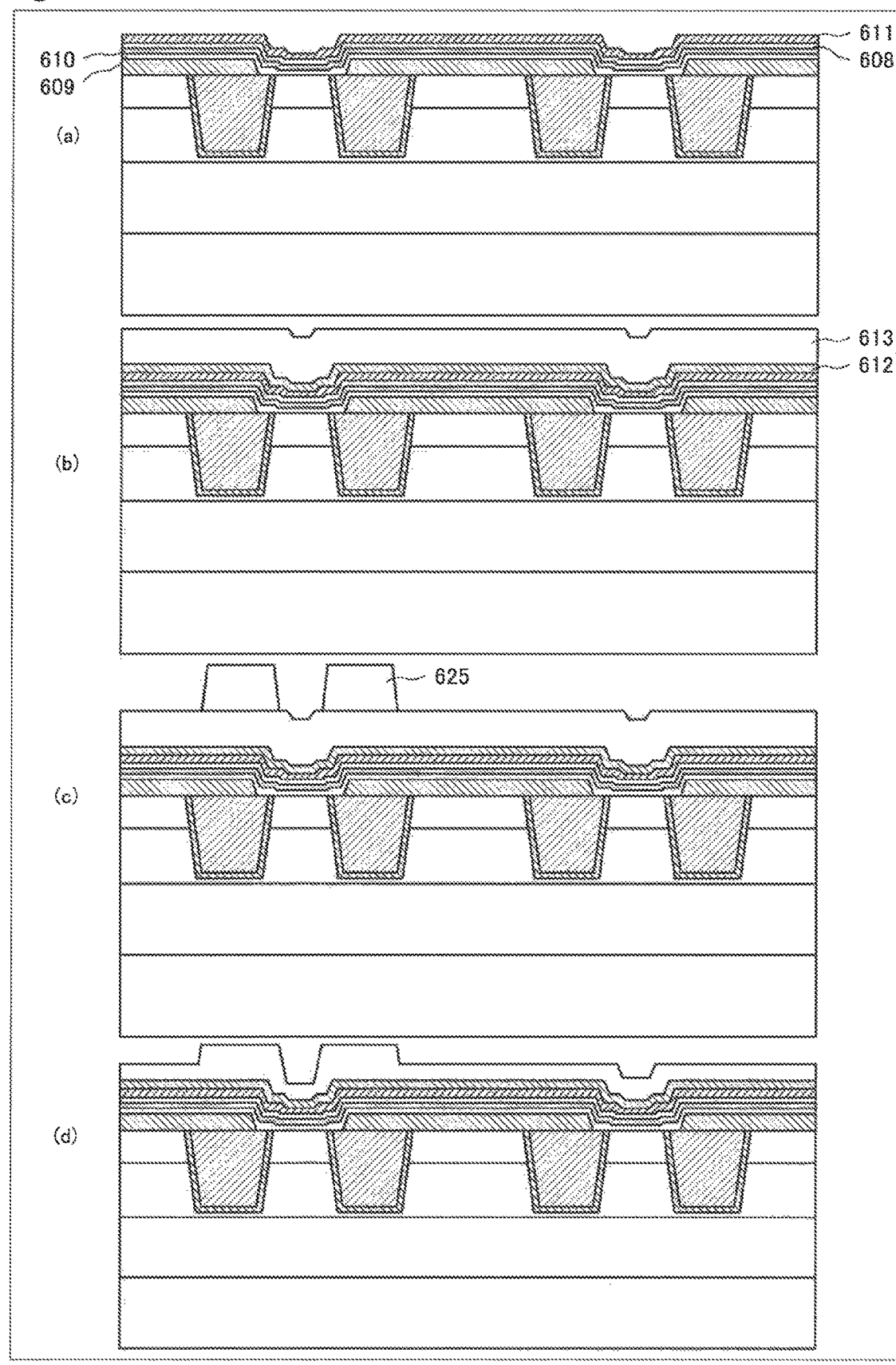
FIG. 7(a) to (d) of FIG. 7 are another cross-sectional schematic views for a description of the method for producing the semiconductor device of the first example embodiment.

On the third electrode 611, a first hard mask film 612 (for example, a silicon nitride film or a silicon carbonitride film having a thickness of 30 nm) and a second hard mask film 613 (for example, a silicon oxide film having a thickness of 100 nm) are stacked in this sequence ((b) of FIG. 7). The first hard mask film 612 and the second hard mask film 613 can be film-formed using the plasma-enhanced CVD method. The first hard mask film 612 and the second hard mask film 613 can be formed using a general plasma-enhanced CVD method in the technical field. In addition, the first hard mask film 612 and the second hard mask film 613 are preferably different types of films, and, for example, the first hard mask film 612 and the second hard mask film 613 can be a silicon nitride film and a silicon oxide film, respectively. On this occasion, the first hard mask film 612 is preferably made of the same material as that of a protection insulating film 614 and a barrier insulating film 607, which will be described later. In addition, while the first hard mask film 612 can be formed by the plasma-enhanced CVD method, it is preferable to use a high-density silicon nitride film or the like by, for example, transforming a $SiH_4/N_2$ gas mixture into a high-density plasma.

Step 7

On the second hard mask film 613, photoresists 625 for patterning rectifying element portions of the four-terminal switch with rectifying elements are formed by a lithography method ((c) of FIG. 7). On this occasion, on a portion of the second hard mask film 613 on the three-terminal switch, in which no rectifying element is formed, the patterning is not performed and the photoresist is removed at the time of development and is not left.

Step 8

Using the photoresists 625 as masks, a portion of the second hard mask film 613 is dry-etched, and, subsequently, the photoresists are removed using oxygen plasma ashing and organic stripping ((d) of FIG. 7). Film thickness in an area where the photoresists 625 were not formed is reduced by etching, and film thickness in areas where the photoresists 625 were formed are not reduced. Etched film thickness is preferably approximately 30 nm to 70 nm. Specifically, etched film thickness, remaining film thickness in areas of the second hard mask film 613 where the photoresists 625 were formed, and remaining film thickness in an area of the second hard mask film 613 where the photoresists 625 were not formed are preferably approximately 60 nm, 100 nm, and 40 nm, respectively.

Step 9

Figure 8:
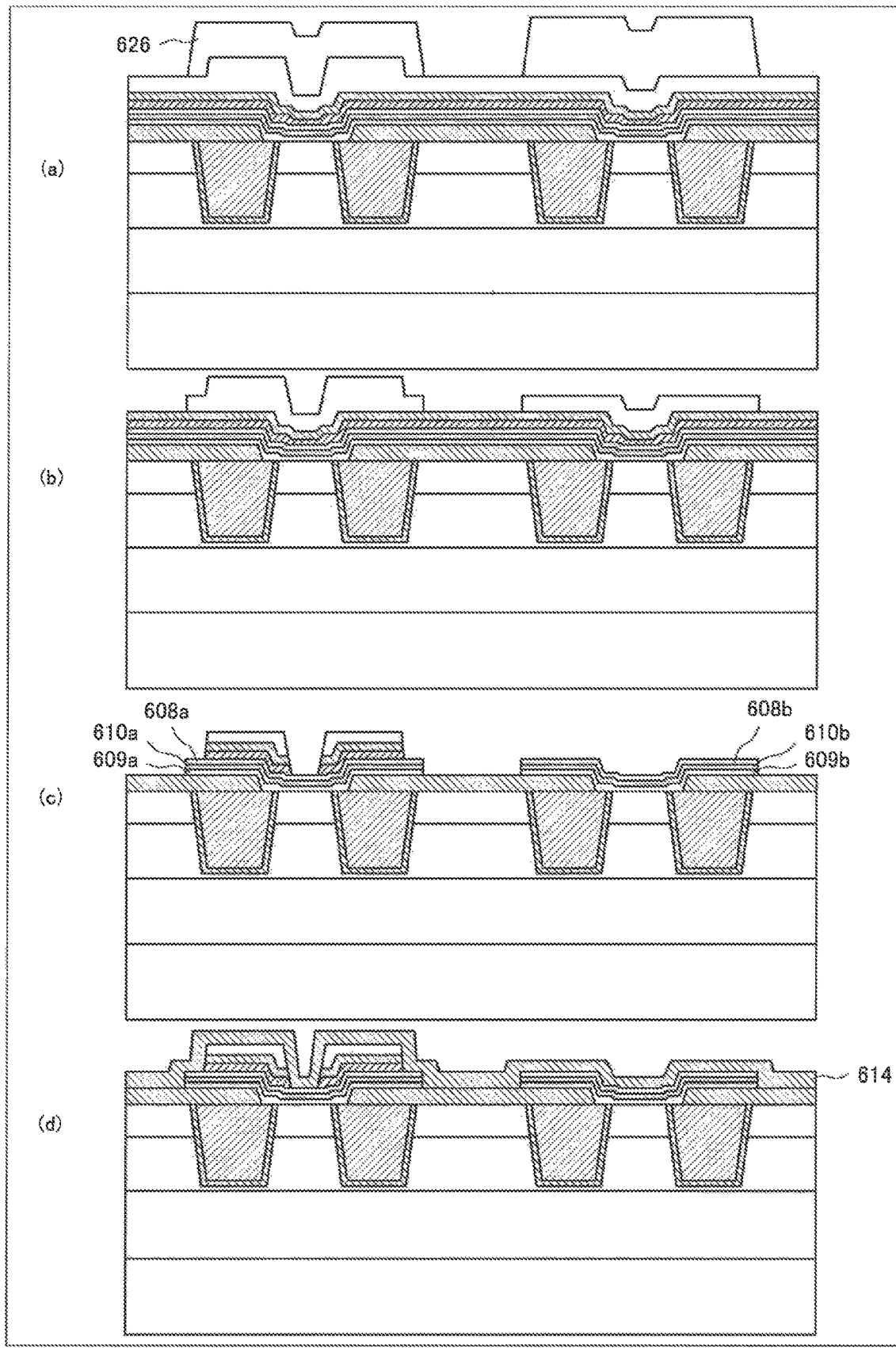
FIG. 8(a) to (d) of FIG. 8 are still another cross-sectional schematic views for a description of the method for producing the semiconductor device of the first example embodiment.

On the processed second hard mask film 613, photoresists 626 for patterning switching element portions of the four-terminal switch with rectifying elements and the three-terminal switch are formed by the lithography method ((a) of FIG. 8).

Step 10

Using the photoresists 626 as masks, a remaining portion of the second hard mask film 613 is dry-etched, and, subsequently, the photoresists are removed using oxygen plasma ashing and organic stripping ((b) of FIG. 8). From an area where neither the photoresists 625 nor the photoresists 626 were formed, the first hard mask film 612 is exposed after the dry etching. The second hard mask film 613 are processed by two stages of dry etching, and remaining film thickness thereof in areas under which the rectifying element portions of the four-terminal switch with rectifying elements are to be formed, remaining film thickness thereof in an area on the four-terminal switch with rectifying elements except the areas under which the rectifying element portions are to be formed and an area under which the three-terminal switch is to be formed, and remaining film thickness thereof in an area other than those are 100 nm, 40 nm, and 0 nm, respectively. Although the first hard mask film 612 in an area where the first hard mask film 612 is exposed is preferably not dry-etched, the first hard mask film 612 may be etched by approximately several nm.

Step 11

Using the second hard mask film 613 as a mask, in a manner in which a shape of the processed second hard mask film 613 is transferred onto lower layers, the first hard mask film 612, the third electrode 611, the rectifying layer 608, the second electrode 610, and the ion conductive layer 609 are dry-etched in a continuous manner. This dry etching causes a rectifying layer 608a, a second electrode 610a, and an ion conductive layer 609a to be formed to an area where the four-terminal switch with rectifying elements is to be formed and a rectifying layer 608b, a second electrode 610b, and an ion conductive layer 609b to be formed to an area where the three-terminal switch is to be formed ((c) of FIG. 8). On this occasion, the second hard mask film 613, the first hard mask film 612, and the third electrode 611 in the area where the three-terminal switch is to be formed are etched and removed. In particular, the third electrode 611 is removed in the area where the three-terminal switch is to be formed. Note that the rectifying layer 608b may remain or be removed in the area where the three-terminal switch is to be formed. In the area where the four-terminal switch with rectifying elements is to be formed, the second hard mask film 613, the first hard mask film 612, and the third electrode 611 remain only in areas where the rectifying elements are to be formed. The second hard mask film 613 in the areas where the rectifying elements are to be formed may be removed. An area where the rectifying elements are not formed in the area where the four-terminal switch with rectifying elements is to be formed is in the same condition as the area where the three-terminal switch is to be formed, and, from the area where the rectifying elements are not formed, the second hard mask film 613, the first hard mask film 612, and the third electrode 611 are etched and removed. The rectifying layer 608b may remain or be removed. In the area where neither the photoresists 625 nor the photoresists 626 were formed in the steps 7 and 9, all the layers down to the second electrode 610 and the ion conductive layer 609 are removed by etching. After the dry etching, the barrier insulating film 607 may be etched by at most approximately several nm.

For example, when being made of titanium nitride, the third electrode 611 and the upper layer of the second electrode 610 can be processed by $Cl_2$-based RIE, and, when being made of an alloy of ruthenium and titanium, the lower layer of the second electrode 610 can be RIE-processed using a $Cl_2/O_2$ gas mixture. In addition, in the etching of the ion conductive layer 609, the dry etching is required to be stopped at the upper surface of the barrier insulating film 607 layered under the ion conductive layer 609. When the ion conductive layer 609 is a SiOCH-based polymer film containing silicon, oxygen, carbon, and hydrogen and the barrier insulating film 607 is a silicon nitride film or a silicon carbonitride film, the ion conductive layer 609 and the barrier insulating film 607 can be RIE-processed by adjusting etching conditions by use of a $CF_4$-based gas mixture, a $CF_4/Cl_2$-based gas mixture, a $CF_4/Cl_2/Ar$-based gas mixture or the like. Use of such a hard mask RIE method enables variable resistance element portions to be processed without exposing the variable resistance element portions to oxygen plasma ashing for resist removal. When oxidation processing is performed by use of oxygen plasma after the processing, it becomes possible to radiate plasma in the oxidizing plasma treatment without depending on resist stripping time.

Step 12

On the barrier insulating film 607 including the first hard mask film 612, the second hard mask film 613, the third electrode 611, the rectifying layers 608a and 608b, the second electrodes 610a and 610b, and the ion conductive layer 609a, a protection insulating film 614 (for example, a silicon nitride film or a silicon carbonitride film having a thickness of 20 nm) is deposited ((d) of FIG. 8). Although the protection insulating film 614 can be formed by the plasma-enhanced CVD method, the wafer is required to be maintained under reduced pressure in the reaction chamber before the film formation and, on this occasion, oxygen desorbs from the side faces of the ion conductive layers 609a and 609b, which may causes an issue to arise in that leakage current in the ion conductive layer increases. In order to inhibit such a phenomenon, it is preferable to set film forming temperature of the protection insulating film 614 at 400° C. or lower. Further, since the wafer is exposed to a film forming gas under reduced pressure before the film formation, it is preferable not to use a reducing gas. For example, it is preferable to use a silicon nitride film or the like that is formed by use of a high-density plasma of a $SiH_4/N_2$ gas mixture at a substrate temperature of 400° C.

Step 13

On the protection insulating film 614, an interlayer insulating film 615 (for example, a silicon oxide film), a low dielectric constant film (for example, a SiOCH film having a thickness of 150 nm) that has a low relative dielectric constant as a low-k insulating film 616, and an interlayer insulating film 617 (for example, a silicon oxide film) are deposited in this sequence. Subsequently, wiring grooves for second wirings 618a, 618b, and 618c and lower holes for vias 619a, 619b, and 619c are formed, and, using a copper dual damascene wiring process, the second wirings 618a, 618b, and 618c (for example, copper) and the vias 619a, 619b, and 619c (for example, copper) are formed in the wiring grooves and the lower holes with second barrier metals 620a, 620b, and 620c (for example, tantalum nitride/tantalum) in between, respectively, at the same time. Subsequently, on the interlayer insulating film 617 including the vias 619a, 619b, and 619c, a barrier insulating film 621 (for example, a silicon nitride film) is deposited. For forming the vias 619a, 619b, and 619c, a similar process to that used for the lower wiring formation can be used. The interlayer insulating films 615, the low-k insulating film 616, and the interlayer insulating film 617 can be formed by the plasma-enhanced CVD method. In order to eliminate a difference in level formed by the four-terminal switch with rectifying elements and the three-terminal switch, the interlayer insulating film 615 may be first deposited thickly, then planarized by scraping the upper surface thereof by the CMP method, and thereby formed in a desired film thickness.

The vias 619a, 619b, and 619c are formed by being patterned through exposure using the same photoresist mask and being etched at the same time. At depths equivalent to heights of the respective vias 619a, 619b, and 619c, the third electrode 611 and the second electrode 610b are exposed to etching and etched down in the depth direction. The first hard mask film 612 and the second hard mask film 613 in areas where the vias 619a and 619b are formed are etched and removed at the time of forming the vias 619a and 619b. As a result, the vias 619a and 619b are directly connected to the third electrode 611.

The rectifying layer 608b is etched and removed at the time of forming the via 619c. As a result, the via 619c is directly connected to the second electrode 610b. Use of a fluorocarbon-based etching gas that has a low etching rate for a titanium nitride-ruthenium alloy for etching to form the vias 619a, 619b, and 619c causes the etching to form the vias 619a, 619b, and 619c to be stopped at the third electrode 611 and the second electrode 610b.

Figure 9:
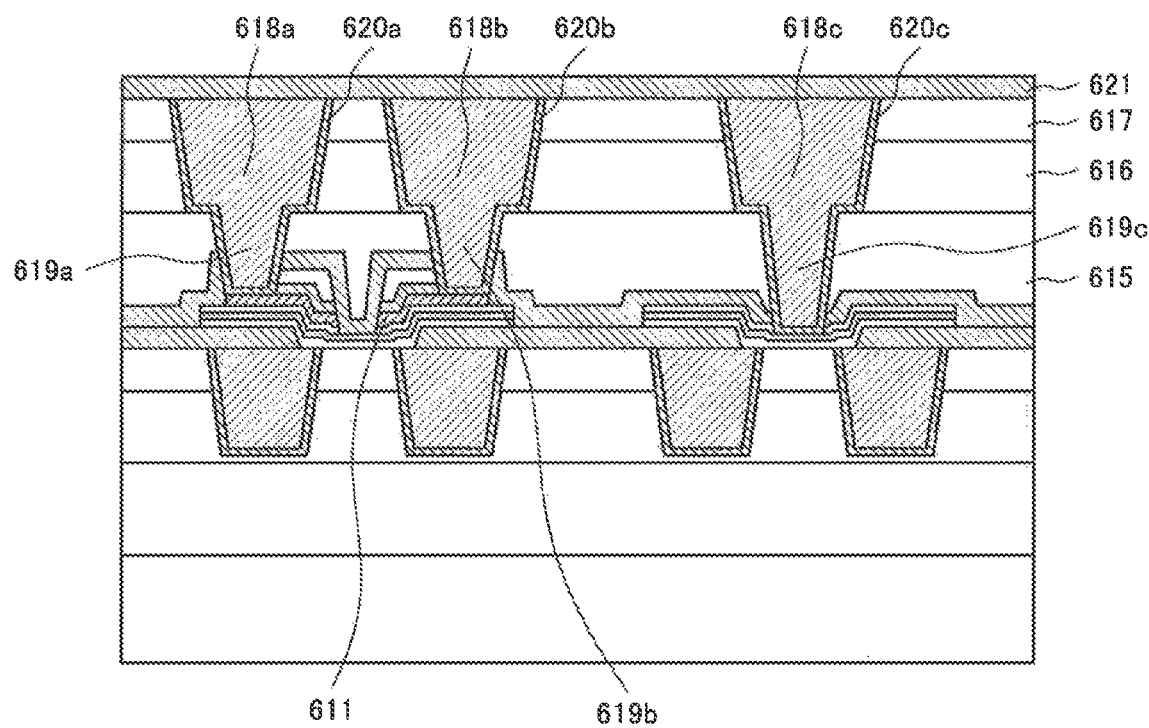
FIG. 9 is still another cross-sectional schematic view for a description of the method for producing the semiconductor device of the first example embodiment.

In this way, the semiconductor device including the four-terminal switch with rectifying elements and the three-terminal switch within the multilayer wiring layer on the semiconductor substrate, as illustrated in FIG. 9, can be produced.

Advantageous Effect of Example Embodiment

According to the present example embodiment, it is possible to achieve a semiconductor device including the four-terminal switch 122 with rectifying elements including two rectifying elements and the three-terminal switch 123 provided with no rectifying element in the same wiring in a multilayer wiring structure. In the present example embodiment, it is possible to form the four-terminal switch 122 with rectifying elements including two rectifying elements and the three-terminal switch 123 in the same wiring layer at the same time. The three-terminal switch on a power-supply line is connected to a transistor.

In the production method of the example embodiment, when a hard mask for processing a stack of the four-terminal switch 122 with rectifying elements is etched, a photoresist for patterning a rectifying element portion is not formed on the hard mask in an area where the three-terminal switch 123 is to be formed. This configuration causes thickness of the hard mask on the three-terminal switch 123 to be reduced when etching of a rectifying element pattern for the four-terminal switch 122 with rectifying elements is performed. As a result, when etching for processing the stack of the four-terminal switch 122 with rectifying elements is performed, the three-terminal switch 123 is etched down to the upper electrode (the third electrode 111) of a rectifying element, which enables the via 119c to be connected to the three-terminal switch 123 without interposing the remaining rectifying layer 108b.

Further, according to the production method of the present example embodiment, when a multi-terminal switch including rectifying elements has two or more rectifying elements, the upper electrode of the rectifying elements is separated, which enables the two rectifying elements to be electrically independent of each other on the switch. Use of the production method of the present example embodiment enables a three-terminal switch to be formed at the same time by use of only photoresist masks and exposure steps necessary for forming a multi-terminal switch provided with rectifying elements and does not invite an increase in a production cost.

According to the present example embodiment, it is possible to provide switching elements having structures that are respectively suitable for a wiring changeover switch constituting a programmable logic and a power-supply line control switch. For the wiring changeover switch and the power-supply line control switch, a multi-terminal switch including rectifying elements that does not require a select transistor and enables area saving and a three-terminal switch that can be connected to a select transistor and is capable of controlling resistance at the time of turning on in a variable manner can be used, respectively. The power-supply control switch, to which a high voltage is sometimes applied, is capable of achieving low on-resistance by performing writing with sufficient current and thereby maintaining high reliability. In addition, when power-supply voltage is required to be adjusted upon a change in operational frequency at the time of operation of a programmable logic, it is also possible to change the on-resistance in accordance with the power-supply voltage.

According to the present example embodiment, it is possible to form the three-terminal switch 123 the on-resistance of which is variable through current control by a transistor and the four-terminal switch 122 with rectifying elements that, although the on-resistance thereof is determined invariably, enables element area to be reduced to a great extent within the same wiring layer at the same time. For this reason, it is possible to achieve a programmable circuit provided with a switching element that has a low on-resistance and enables high reliability to be achieved on the power-supply line, and to provide a highly reliable, area saving, low power consumption, and low cost programmable logic.

Second Example Embodiment

Figure 10:
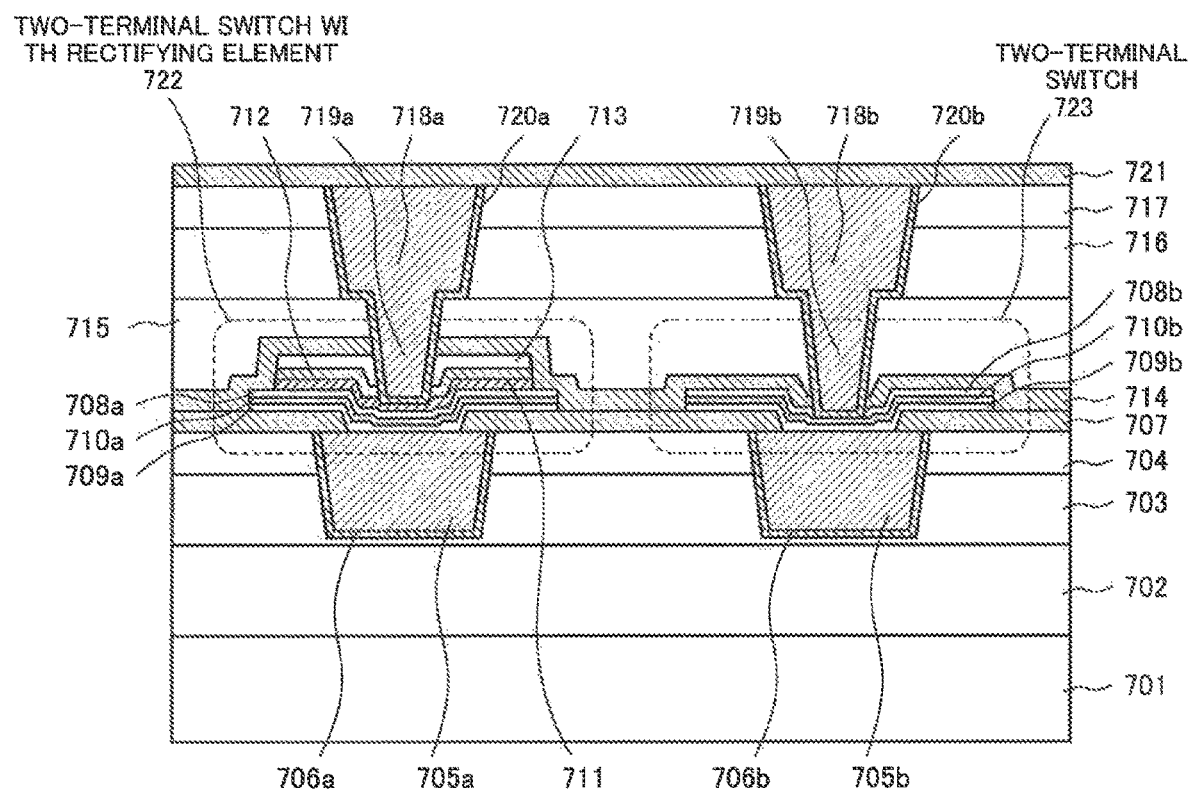
FIG. 10 is a cross-sectional schematic view illustrating a configuration example of a semiconductor device of a second example embodiment.

Next, a semiconductor device according to a second example embodiment of the present invention and a method for producing the semiconductor device will be described. The present example embodiment is a semiconductor device that has "a two-terminal switch with a rectifying element and a two-terminal switch" formed within a multilayer wiring layer. FIG. 10 is a cross-sectional schematic view illustrating a configuration example of the semiconductor device of the second example embodiment. The present example embodiment is a semiconductor device that includes a two-terminal switch with a rectifying element and a two-terminal switch within a multilayer wiring layer and the equivalent circuit diagrams of which are illustrated in (b) of FIG. 15.

Configuration

The semiconductor device illustrated in FIG. 10 has a two-terminal switch 722 with a rectifying element and a two-terminal switch 723 within a multilayer wiring layer on a semiconductor substrate 701.

The multilayer wiring layer has an insulating stacked body in which, on the semiconductor substrate 701, an interlayer insulating film 702, a low-k insulating film 703, an interlayer insulating film 704, a barrier insulating film 707, a protection insulating film 714, an interlayer insulating film 715, a low-k insulating film 716, an interlayer insulating film 717, and a barrier insulating film 721 are stacked in this sequence. The multilayer wiring layer has, in wiring grooves formed in the interlayer insulating film 704 and the low-k insulating film 703, first wirings 705a and 705b embedded with first barrier metals 706a and 706b in between, respectively.

Further, the multilayer wiring layer has second wirings 718a and 718b embedded in wiring grooves formed in the interlayer insulating film 717 and the low-k insulating film 716. Furthermore, vias 719a and 719b are embedded in lower holes that are formed in the interlayer insulating film 715, the protection insulating film 714, and a first hard mask film 712. Each of pairs of the second wiring 718a and the via 719a and the second wiring 718b and the via 719b are integrated into one body. In addition, the side surfaces and the bottom surfaces of pairs of the second wiring 718a and the via 719a and the second wiring 718b and the via 719b are covered by second barrier metals 720a and 720b, respectively.

In an opening section formed in the barrier insulating film 707, on the first wiring 705a that serves as a first electrode, the wall surface of the opening section in the barrier insulating film 707, and the barrier insulating film 707, an ion conductive layer 709a, a second electrode 710a, a rectifying layer 708a, and a third electrode 711 are stacked in this sequence and the two-terminal switch 722 with a rectifying element is thereby formed. In addition, on the third electrode 711 of the two-terminal switch 722 with a rectifying element, the first hard mask film 712 and a second hard mask film 713 are formed. Further, the upper surface and the side face of a stacked body of the ion conductive layer 709a, the second electrode 710a, the rectifying layer 708a, the third electrode 711, the first hard mask film 712, and the second hard mask film 713 are covered by the protection insulating film 714.

The multilayer wiring layer has, in another opening section formed in the barrier insulating film 707, on the first wiring 705b that serves as a first electrode, the wall surface of the another opening section in the barrier insulating film 707, and the barrier insulating film 707, the two-terminal switch 723 formed in which an ion conductive layer 709b, a second electrode 710b, and a rectifying layer 708b are stacked in this sequence and the upper surface and the side face of a stacked body of the ion conductive layer 709b, the second electrode 710b, and the rectifying layer 708b covered by the protection insulating film 714.

Forming a portion of the first wiring 705a into a lower electrode of the two-terminal switch 722 with a rectifying element and forming a portion of the first wiring 705b into a lower electrode of the two-terminal switch 723, while simplifying the number of process steps, enable electrode resistance to be reduced. Only generating a mask set of at least three photoresist masks (three PRs) as additional process steps to a regular copper damascene wiring process enables the two-terminal switch 722 with a rectifying element and the two-terminal switch 723 to be provided in the same wiring layer, which enables reduction in element resistance and cost reduction to be achieved at the same time.

The two-terminal switch 722 with a rectifying element has the ion conductive layer 709a in direct contact with the first wiring 705a in a region in the opening section formed in the barrier insulating film 707. A metal constituting a portion of the ion conductive layer 709a diffuses into the first wiring 705a and thereby forms an alloy layer.

The two-terminal switch 723 has the ion conductive layer 709b in direct contact with the first wiring 705b in a region in the another opening section formed in the barrier insulating film 707. A metal constituting a portion of the ion conductive layer 709b diffuses into the first wiring 705b and thereby forms an alloy layer.

The two-terminal switch 722 with a rectifying element has the rectifying layer 708a on the second electrode 710a, and the rectifying layer 708a is in contact with the third electrode 711 at the upper surface of the rectifying layer 708a. On the third electrode 711, the first hard mask film 712 and a second hard mask film 713 remain. The second hard mask film 713 does not have to remain.

In the two-terminal switch 722 with a rectifying element, the via 719a and the third electrode 711 are electrically connected to each other with the second barrier metal 720a in between, on the third electrode 711. The two-terminal switch 722 with a rectifying element is on/off controlled by applying voltage or flowing current between the second electrode 710a and the first wiring 705a with the rectifying layer 708a in between, such as being on/off controlled by use of electric field diffusion of metal ions supplied from a metal forming the first wiring 705a into the ion conductive layer 709a. On this occasion, on-resistance is determined by current in the rectifying layer 708a.

In the two-terminal switch 723, the via 719b and the second electrode 710b are electrically connected to each other with the second barrier metal 720b in between, on the second electrode 710b. The rectifying layer 708b may remain on the second electrode 710b or may be removed when etching is performed in a production process of the two-terminal switch 723. The two-terminal switch 723 is on/off controlled by applying voltage or flowing current, such as being on/off controlled by use of electric field diffusion of metal ions supplied from a metal forming the first wiring 705b into the ion conductive layer 709b.

The semiconductor substrate 701 is a substrate on which semiconductor elements are formed. For the semiconductor substrate 701, as with the first example embodiment, substrates, such as a silicon substrate, a single crystal substrate, an SOI substrate, a TFT substrate, a substrate for liquid crystal production and the like can be used.

The interlayer insulating film 702 is an insulating film that is formed on the semiconductor substrate 701. For the interlayer insulating film 702, as with the first example embodiment, for example, a silicon oxide film, a SiOC film or the like can be used. The interlayer insulating film 702 may be a stack of a plurality of insulating films.

For the low-k insulating film 703, a low dielectric constant film (for example, a SiOCH film) or the like that has a lower relative dielectric constant than a silicon oxide film is used. The low-k insulating film 703 is an insulating film that is interposed between the interlayer insulating films 702 and 704 and has a low dielectric constant. In the low-k insulating film 703, wiring grooves for embedding the first wirings 705a and 705b are formed. In the wiring grooves in the low-k insulating film 703, the first wirings 705a and 705b are embedded with the first barrier metals 706a and 706b in between, respectively.

The interlayer insulating film 704 is an insulating film that is formed on the low-k insulating film 703. For the interlayer insulating film 704, as with the first example embodiment, for example, a silicon oxide film, a SiOC film, or the like can be used. The interlayer insulating film 704 may be a stack of a plurality of insulating films. In the interlayer insulating film 704, wiring grooves for embedding the first wirings 705a and 705b are formed. In the wiring grooves in the interlayer insulating film 704, the first wirings 705a and 705b are embedded with the first barrier metals 706a and 706b in between, respectively.

The first wiring 705a is a wiring that is embedded in the wiring groove formed in the interlayer insulating film 704 and the low-k insulating film 703 with the first barrier metals 706a and 706b in between. The first wiring 705a also serves as the lower electrode of the two-terminal switch 722 with a rectifying element and is in direct contact with the ion conductive layer 709a. The upper surface of the ion conductive layer 709a is in direct contact with the second electrode 710a. As a metal constituting the first wiring 705a, a metal that can diffuse and be ion-conducted in the ion conductive layer 709a is used and, for example, copper or the like can be used. The metal (for example, copper) constituting the first wiring 705a may be alloyed with aluminum.

The first wiring 705b is a wiring that is embedded in the wiring groove formed in the interlayer insulating film 704 and the low-k insulating film 703 with the first barrier metal 706b in between. The first wiring 705b also serves as the lower electrode of the two-terminal switch 723 and is in direct contact with the ion conductive layer 709b. The upper surface of the ion conductive layer 709b is in direct contact with the second electrode 710b. As a metal constituting the first wiring 705b, a metal that can diffuse and be ion-conducted in the ion conductive layer 709b is used and, for example, copper or the like can be used. The metal (for example, copper) constituting the first wiring 705b may be alloyed with aluminum.

The first barrier metals 706a and 706b are conductive films having a barrier property. The first barrier metals 706a and 706b, in order to prevent the metal constituting the first wirings 705a and 705b from diffusing into the interlayer insulating film 704 and lower layers, covers the side surfaces and the bottom surfaces of the respective wirings. When the first wirings 705a and 705b are constituted by metallic elements including copper as a main component, a refractory metal, a nitride thereof or the like, such as tantalum, tantalum nitride, titanium nitride, and tungsten carbonitride, or a stacked film thereof can be used for the first barrier metals 706a and 706b.

The barrier insulating film 707 is formed on the interlayer insulating film 704 including the first wirings 705a and 705b. This configuration enables the barrier insulating film 707 to have roles of preventing the metal (for example, copper) forming the first wirings 705a and 705b from being oxidized, preventing the metal forming the first wirings 705a and 705b from diffusing into the interlayer insulating film 715, and working as an etching stop layer at the time of processing the third electrode 711, the rectifying layers 708a and 708b, the second electrodes 710a and 710b, and the ion conductive layers 709a and 709b. For the barrier insulating film 707, for example, a SiC film, a silicon carbonitride film, a silicon nitride film, a stacked structure thereof or the like can be used. The barrier insulating film 707 is preferably made of the same material as the protection insulating film 714 and the first hard mask film 712.

The ion conductive layers 709a and 709b are films the resistance of which changes. For the ion conductive layers 709a and 709b, a material the resistance of which changes due to action (diffusion, ionic conduction, or the like) of metal ions generated from the metal forming the first wirings 705a and 705b (lower electrodes) can be used. When resistance change in association with switching to an on-state is achieved through deposition of a metal by reduction of metal ions, a film capable of conducting ions is used for the ion conductive layers 709a and 709b.

The ion conductive layers 709a and 709b are respectively constituted by stacked structures of ion conductive layers that are made of of a metal oxide and are in contact with the first wirings 705a and 705b and ion conductive layers that are made of a polymer and are in contact with the second electrodes 710a and 710b.

The ion conductive layer made of a polymer in each of the ion conductive layers 709a and 709b is formed using a plasma-enhanced CVD method. Raw material of cyclic organosiloxane and helium, which is a carrier gas, are flowed into a reaction chamber, and, when the supply of both the cyclic organosiloxane and helium has stabilized and pressure in the reaction chamber has become constant, application of Radio Frequency (RF) electric power is started. The amount of supply of the raw material is set at 10 to 200 sccm, and 500 sccm helium is supplied via a raw material vaporizer.

The ion conductive layer made of a metal oxide in each of the ion conductive layers 709a and 709b has a plurality of roles. One role is to prevent the metal forming the first wirings 705a and 705b from diffusing into the ion conductive layer made of a polymer due to application of heat and plasma during deposition of the ion conductive layer made of a polymer. Another role is to prevent the first wirings 705a and 705b from being oxidized and becoming easily accelerated to diffuse into the ion conductive layer made of a polymer. A metal, such as zirconium, hafnium, aluminum and titanium, that forms the ion conductive layer made of a metal oxide, after film formation of the metal that constitutes the ion conductive layer made of a metal oxide, is exposed to an oxygen atmosphere under reduced pressure in a film forming chamber for the ion conductive layer made of a polymer and becomes zirconium oxide, hafnium oxide, aluminum oxide, or titanium oxide, thereby becoming a portion of each of the ion conductive layers 709a and 709b. An optimum thickness of a metal film that forms the ion conductive layer made of a metal oxide is 0.5 to 1 nm. The metal film that is used for forming the ion conductive layer made of a metal oxide may form a stack or a single layer. Film formation of the metal film that is used for forming the ion conductive layer made of a metal oxide is preferably performed by sputtering. Metal atoms or ions having acquired energy through sputtering plunge and diffuse into the first wirings 705a and 705b and form alloy layers.

The ion conductive layer 709a is formed on the first wiring 705a, tapered surfaces formed in the opening section in the barrier insulating film 707, and the barrier insulating film 707. The ion conductive layer 709b is formed on the first wiring 705b, tapered surfaces formed in the another opening section in the barrier insulating film 707, and the barrier insulating film 707.

The second electrodes 710a and 710b are upper electrodes of the two-terminal switch 722 with a rectifying element and the two-terminal switch 723 and are in direct contact with the ion conductive layers 709a and 709b, respectively.

For the second electrodes 710a and 710b, a ruthenium alloy containing titanium, tantalum, zirconium, hafnium, aluminum or the like is used. Ruthenium is a metal that is harder to ionize than the metal forming the first wirings 705a and 705b and is hard to diffuse and be ion-conducted in the ion conductive layers 709a and 709b. Titanium, tantalum, zirconium, hafnium, or aluminum that is added to a ruthenium alloy has a good adhesiveness with the metal forming the first wirings 705a and 705b. As a metal that constitutes the second electrodes 710a and 710b and is added to ruthenium, it is preferable to select a metal that has a standard Gibbs energy of formation of a process of generating metal ions from the metal (oxidation process) larger than ruthenium in the negative direction. Because of having a standard Gibbs energy of formation of a process of generating metal ions from a metal (oxidation process) larger than ruthenium in the negative direction and being more likely to spontaneously react chemically than ruthenium, titanium, tantalum, zirconium, hafnium, aluminum and the like are highly reactive. For this reason, in the ruthenium alloy that forms the second electrodes 710a and 710b, alloying titanium, tantalum, zirconium, hafnium, aluminum or the like with ruthenium improves adhesiveness thereof with metal cross-links formed by the metal forming the first wirings 705a and 705b.

On the other hand, an additive metal itself like titanium, tantalum, zirconium, hafnium, aluminum or the like, not alloyed with ruthenium, becomes too highly reactive, which causes a transition to an "OFF" state not to occur. While a transition from an "ON" state to an "OFF" state proceeds through oxidation reaction (dissolution reaction) of metal cross-links, when a metal constituting the second electrodes 710a and 710b has a standard Gibbs energy of formation of a process of generating metal ions from the metal (oxidation process) larger, in the negative direction, than the metal forming the first wirings 705a and 705b, the oxidation reaction of the metal constituting the second electrodes 710a and 710b proceeds faster than the oxidation reaction of metal cross-links formed by the metal forming the first wirings 705a and 705b, which causes a transition to the "OFF" state not to occur.

For this reason, a metal material that is used to form the metal constituting the second electrodes 710a and 710b is required to be alloyed with ruthenium that has a standard Gibbs energy of formation of a process of generating metal ions from the metal (oxidation process) smaller than copper in the negative direction.

Further, when copper, which is a component of metal cross-links, mixes with the metal constituting the second electrodes 710a and 710b, an effect of adding a metal having a large standard Gibbs energy of formation in the negative direction is reduced. For this reason, a material having a barrier property against copper and copper ions is preferable as a metal added to ruthenium. Such materials include, for example, tantalum and titanium. On the other hand, it has been revealed that, the larger the amount of additive metal is, the more stable an "ON" state becomes, and even an addition of only 5 atm % metal improves the stability. In particular, a case of using titanium as an additive metal excels in transition to an off-state and stability of an on-state, and it is particularly preferable that an alloy of ruthenium and titanium be used as the metal constituting the second electrodes 710a and 710b and a content of titanium be set at a value within a range from 20 atm % to 30 atm %. A content of ruthenium in the ruthenium alloy is preferably set at a value of 60 atm % or higher and 90 atm % or lower.

For forming a ruthenium alloy, it is preferable to use a sputtering method. When an alloy is film-formed using a sputtering method, the sputtering methods include a method of using a target made of an alloy of ruthenium and the first metal, a co-sputtering method of sputtering a ruthenium target and a first metal target in the same chamber at the same time, and an intermixing method in which a thin film of the first metal is formed in advance, ruthenium is film-formed on the thin film by a sputtering method, and the first metal and the ruthenium are alloyed with energy of colliding atoms. Use of the co-sputtering method and the intermixing method enables composition of an alloy to be altered. When the intermixing method is employed, it is preferable that, after ruthenium film formation has been finished, heat treatment at a temperature of 400° C. or lower be performed for "planarization" of the mixed state of metals.

The second electrodes 710a and 710b preferably have a two-layer structure. When the sides of the second electrodes 710a and 710b in contact with the ion conductive layers 709a and 709b are made of a ruthenium alloy, the sides of the second electrodes 710a and 710b in contact with the rectifying layers 708a and 708b serve as lower electrodes of the rectifying elements. As a metal species, a metal nitride, such as titanium nitride and tantalum nitride, that is difficult to be oxidized, easy to process, and the work function of which is adjustable by adjusting composition thereof can be used.

Titanium and tantalum may also be used as long as being able to inhibit oxidation at boundary faces of the second electrodes 710a and 710b with the rectifying layers 708a and 708b. Titanium nitride, tantalum nitride, titanium, or tantalum is film-formed on the ruthenium alloy layer by a sputtering method in a continuous vacuum process. When titanium or tantalum is nitrided, the nitride is film-formed by introducing nitrogen into a chamber and using a reactive sputtering method.

The rectifying layers 708a and 708b are layers that have a bipolar rectification effect and have a characteristic in which current increases in a non-linear manner with respect to applied voltage. A Poole-Frenkel type insulating film, a Schottky type insulating film, a threshold switching type volatile variable-resistance film, or the like can be used as the rectifying layers 708a and 708b. For example, a film containing any of titanium oxide, tungsten oxide, molybdenum oxide, hafnium oxide, aluminum oxide, zircon oxide, yttrium oxide, manganese oxide, niobium oxide, silicon nitride, silicon carbonitride, silicon oxide, and amorphous silicon can be used as the rectifying layers 708a and 708b. In particular, constituting a stack by stacking amorphous silicon, silicon nitride, and amorphous silicon in this sequence enables excellent non-linearity to be generated. By, by means of interposing a silicon nitride film between amorphous silicon films, causing composition of a portion of the silicon nitride film to be brought to a state in which nitrogen is deficient from the stoichiometric ratio and thereby reducing differences in barrier heights with the second electrode 710a and the third electrode 711, it is possible to facilitate tunneling current to flow to the silicon nitride at the time of high voltage application. As a result, a non-linear current change is generated.

The third electrode 711 is a metal that serves as an upper electrode of the rectifying element, and, for example, tantalum, titanium, tungsten, a nitride thereof or the like can be used for the third electrode 711. In order to make current-voltage characteristics of the rectifying element symmetrical in both positive and negative sides, it is preferable to use the same material as that of the second electrode 710a for the third electrode 711. The third electrode 711 also has a function as an etching stop layer when the via 719a is electrically connected onto the second electrode 710a. Thus, it is preferable that the third electrode 711 have a low etching rate for plasma of a fluorocarbon-based gas that is used in etching of the interlayer insulating film 715. For forming the third electrode 711, it is preferable to use a sputtering method. When a metal nitride is film-formed using a sputtering method, it is preferable to use a reactive sputtering method in which a metal target is vaporized using plasma of a gas mixture of nitrogen and argon. A metal vaporized from the metal target reacts with nitrogen and forms a metal nitride, which is film-formed on a substrate.

The third electrode 711 is present only on the two-terminal switch 722 with a rectifying element in which a rectifying element is formed, and is not present on the two-terminal switch 723.

The first hard mask film 712 is a film that serves as a hard mask film and a passivation film when the third electrode 711, the second electrodes 710a and 710b, the rectifying layers 708a and 708b, and the ion conductive layers 709a and 709b are etched. For the first hard mask film 712, as with the first example embodiment, for example, silicon nitride, silicon oxide or the like, or a stack thereof can be used. The first hard mask film 712 preferably includes the same material as the protection insulating film 714 and the barrier insulating film 707.

The second hard mask film 713 is a film that serves as a hard mask film when the third electrode 711, the second electrodes 710a and 710b, the rectifying layers 708a and 708b, and the ion conductive layers 709a and 709b are etched. For the second hard mask film 713, as with the first example embodiment, for example, silicon nitride, silicon oxide or the like, or a stack thereof can be used.

As with the first example embodiment described above, based on a shape of the second hard mask film 713, the two-terminal switch 722 with a rectifying element and the two-terminal switch 723 are formed differently from each other. On the barrier insulating film 707 of the two-terminal switch 722 with a rectifying element and the two-terminal switch 723, the ion conductive layers 709a and 709b, the second electrodes 710a and 710b, the rectifying layers 708a and 708b, the third electrode 711, the first hard mask film 712, and the second hard mask film 713 are film-formed. Subsequently, the second hard mask film 713 is processed through two rounds of patterning and etching as illustrated in (c) of FIG. 7 to (b) of FIG. 8 in the first example embodiment. In a manner in which a shape of the second hard mask film 713, formed in this way, is transferred onto the two-terminal switch 722 with a rectifying element, one rectifying element is formed on the second electrode 710a.

That is, a stacked structure for the two-terminal switch 722 with a rectifying element is film-formed once on the whole wafer, and, on an element portion to which the two-terminal switch 723 is to be formed, patterning for forming a rectifying element portion in the two-terminal switch 722 with a rectifying element is configured not to be performed (a resist is configured not to be left). This configuration causes thickness of a portion of the second hard mask film 713 on the two-terminal switch 723 to be reduced, as illustrated in (d) of FIG. 7 in the first example embodiment. Subsequently, performing etching enables a portion of the third electrode 711 on the two-terminal switch 723 to be removed. That is, an area on the two-terminal switch 723 is brought into the same condition as an area on the two-terminal switch 722 with a rectifying element except an area under which the rectifying element is formed. The rectifying layer 708b may or does not have to remain on the second electrode 710a of the two-terminal switch 723. In addition, the first hard mask film 712 and the second hard mask film 713 do not remain on the two-terminal switch 723.

The protection insulating film 714 is an insulating film that has functions of preventing the two-terminal switch 722 with a rectifying element and the two-terminal switch 723 from being damaged and further preventing desorption of oxygen from the ion conductive layers 709a and 709b. For the protection insulating film 714, as with the first example embodiment, for example, silicon nitride, silicon carbonitride or the like can be used. The protection insulating film 714 is preferably made of the same material as the first hard mask film 712 and the barrier insulating film 707. In the case of being made of the same material, the protection insulating film 714 is integrated into one body with the barrier insulating film 707 and the first hard mask film 712 and adhesiveness of boundary faces thereamong is thereby improved, which enables the two-terminal switch 722 with a rectifying element and the two-terminal switch 723 to be protected more securely.

The interlayer insulating film 715 is an insulating film that is formed on the protection insulating film 714. For the interlayer insulating film 715, as with the first example embodiment, for example, a silicon oxide film, a SiOC film or the like can be used. The interlayer insulating film 715 may be a stack of a plurality of insulating films. The interlayer insulating film 715 may be made of the same material as the interlayer insulating film 717. In the interlayer insulating film 715, lower holes for embedding the vias 719a and 719b are formed, and, in the lower holes, the vias 719a and 719b are embedded with the second barrier metals 720a and 720b in between, respectively.

For the low-k insulating film 716, as with the first example embodiment, a low dielectric constant film (for example, a SiOCH film) or the like that has a lower relative dielectric constant than a silicon oxide film is used. The low-k insulating film 716 is an insulating film that is interposed between the interlayer insulating films 715 and 717 and has a low dielectric constant. In the low-k insulating film 716, wiring grooves for embedding the second wirings 718a and 718b are formed. In the wiring grooves in the low-k insulating film 716, the second wirings 718a and 718b are embedded with the second barrier metals 720a and 720b in between, respectively.

The interlayer insulating film 717 is an insulating film that is formed on the low-k insulating film 716. For the interlayer insulating film 717, as with the first example embodiment, for example, a silicon oxide film, a SiOC film, a low dielectric constant film (for example, a SiOCH film) or the like that has a lower relative dielectric constant than a silicon oxide film can be used. The interlayer insulating film 717 may be a stack of a plurality of insulating films. The interlayer insulating film 717 may be made of the same material as the interlayer insulating film 715. In the interlayer insulating film 717, wiring grooves for embedding the second wirings 718a and 718b are formed. In the wiring grooves in the interlayer insulating film 717, the second wirings 718a and 718b are embedded with the second barrier metals 720a and 720b in between, respectively.

The second wirings 718a and 718b are wirings that are embedded in the wiring grooves formed in the interlayer insulating film 717 and the low-k insulating film 716 with the second barrier metals 720a and 720b in between, respectively. The second wirings 718a and 718b are integrated into one body with the vias 719a and 719b, respectively.

The via 719a is embedded in the lower hole formed in the interlayer insulating film 715, the protection insulating film 714, the first hard mask film 712, and the second hard mask film 713 with the second barrier metal 720a in between. The via 719b is embedded in the lower hole formed in the interlayer insulating film 715 and the protection insulating film 714 with the second barrier metal 720b in between.

The via 719a is electrically connected to the third electrode 711 via the second barrier metal 720a. The via 719b is electrically connected to the second electrode 710b via the second barrier metal 720b. For the second wirings 718a and 718b and the vias 719a and 719b, for example, copper can be used.

The second barrier metals 720a and 720b are conductive films that cover the side surfaces and the bottom surfaces of the second wirings 718a and 718b and the vias 719a and 719b, respectively and have a barrier property. The second barrier metals 720a and 720b prevent a metal forming the second wirings 718a and 718b (including the vias 719a and 719b) from diffusing into the interlayer insulating films 715 and 717 and lower layers.

When the second wirings 718a and 718b and the vias 719a and 719b are constituted by metallic elements including copper as a main component, a refractory metal, a nitride thereof or the like, such as tantalum, tantalum nitride, titanium nitride, and tungsten carbonitride, or a stacked film thereof can be used for the second barrier metals 720a and 720b.

The barrier insulating film 721 is an insulating film that is formed on the interlayer insulating film 717 including the second wirings 718a and 718b. The barrier insulating film 721 has roles of preventing the metal (for example, copper) forming the second wirings 718a and 718b from being oxidized and preventing the metal forming the second wirings 718a and 718b from diffusing into upper layers. For the barrier insulating film 721, for example, a silicon carbonitride film, a silicon nitride film, a stacked structure thereof, or the like can be used.

Advantageous Effect of Example Embodiment

According to the present example embodiment, it is possible to achieve a semiconductor device including the two-terminal switch 722 with a rectifying element including one rectifying element and the two-terminal switch 723 provided with no rectifying element in the same wiring in a multilayer wiring structure. In the present example embodiment, it is possible to form the two-terminal switch 722 with a rectifying element including one rectifying element and the two-terminal switch 723 in the same wiring layer at the same time.

Third Example Embodiment

Figure 11:
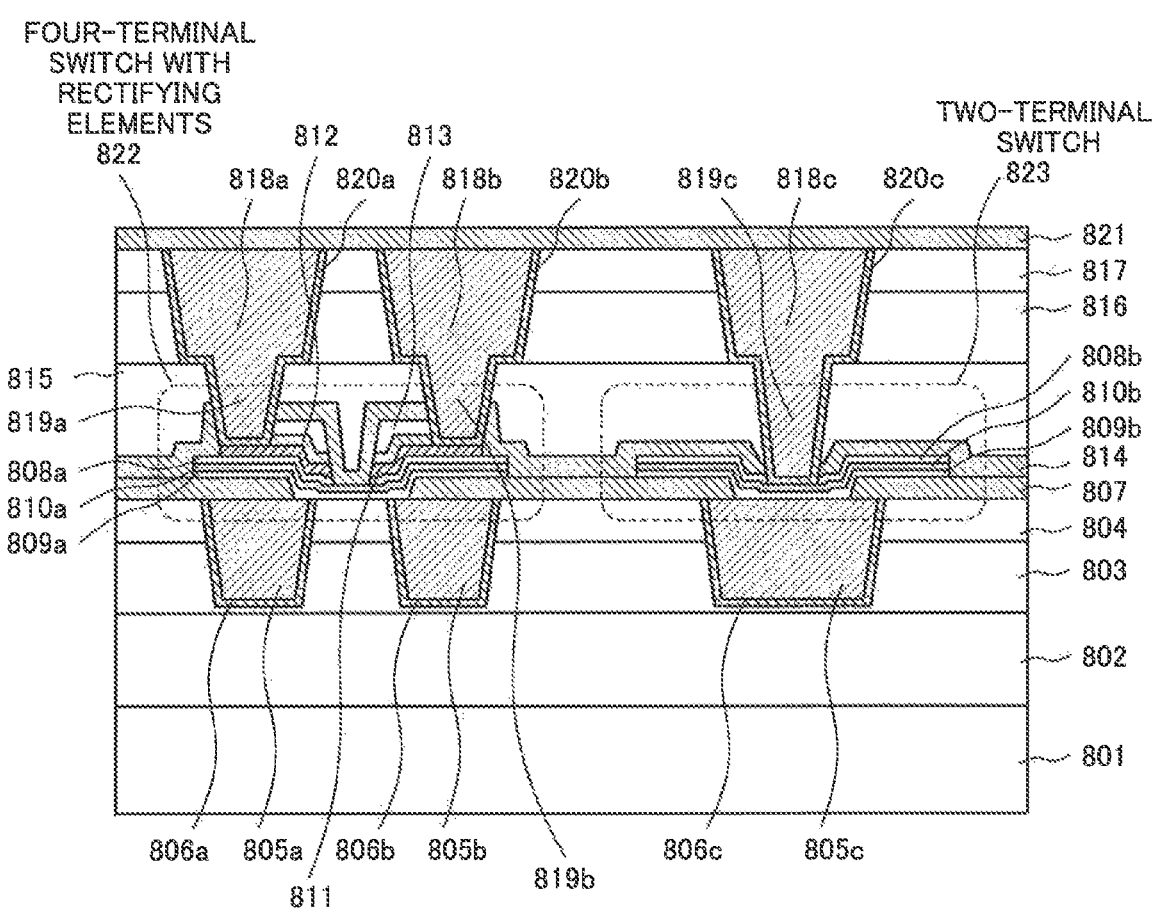
FIG. 11 is a cross-sectional schematic view illustrating a configuration example of a semiconductor device of a third example embodiment.

Next, a semiconductor device according to a third example embodiment and a method for producing the semiconductor device will be described. The present example embodiment is a semiconductor device that has "a four-terminal switch with rectifying elements and a two-terminal switch" formed within a multilayer wiring layer. FIG. 11 is a cross-sectional schematic view illustrating a configuration example of the semiconductor device of the third example embodiment. The present example embodiment is a semiconductor device that includes a four-terminal switch with rectifying elements and a two-terminal switch within a multilayer wiring layer and the equivalent circuit diagrams of which are illustrated in (c) of FIG. 15.

Configuration

The semiconductor device illustrated in FIG. 11 has a four-terminal switch 822 with rectifying elements and a two-terminal switch 823 within a multilayer wiring layer on a semiconductor substrate 801.

The multilayer wiring layer has an insulating stacked body in which, on the semiconductor substrate 801, an interlayer insulating film 802, a low-k insulating film 803, an interlayer insulating film 804, a barrier insulating film 807, a protection insulating film 814, an interlayer insulating film 815, a low-k insulating film 816, an interlayer insulating film 817, and a barrier insulating film 821 are stacked in this sequence. The multilayer wiring layer has, in wiring grooves formed in the interlayer insulating film 804 and the low-k insulating film 803, first wirings 805a and 805b embedded with first barrier metals 806a and 806b in between, respectively. In addition, the multilayer wiring layer has, in a wiring groove formed in the interlayer insulating film 804 and the low-k insulating film 803, a first wiring 805c embedded with a first barrier metal 806c in between.

Further, the multilayer wiring layer has second wirings 818a, 818b, and 818c embedded in wiring grooves formed in the interlayer insulating film 817 and the low-k insulating film 816. Furthermore, vias 819a, 819b, and 819c are embedded in lower holes that are formed in the interlayer insulating film 815, the protection insulating film 814, and a first hard mask film 812. Each of pairs of the second wiring 818a and the via 819a, the second wiring 818b and the via 819b, and the second wiring 818c and the via 819c are integrated into one body. In addition, the side surfaces and the bottom surfaces of pairs of the second wiring 818a and the via 819a, the second wiring 818b and the via 819b, and the second wiring 818c and the via 819c are covered by second barrier metals 820a, 820b, and 820c, respectively.

In an opening section formed in the barrier insulating film 807, on the first wirings 805a and 805b that serve as first electrodes, a portion of the interlayer insulating film 804 flanked by the first wirings 805a and 805b, the wall surface of the opening section in the barrier insulating film 807, and the barrier insulating film 807, an ion conductive layer 809a, a second electrode 810a, a rectifying layer 808a, and a third electrode 811 are stacked in this sequence and the four-terminal switch 822 with rectifying elements is thereby formed. In addition, on the third electrode 811, the first hard mask film 812 and a second hard mask film 813 are formed. Further, the upper surface and the side face of a stacked body of the ion conductive layer 809a, the second electrode 810a, the rectifying layer 808a, the third electrode 811, the first hard mask film 812, and the second hard mask film 813 are covered by the protection insulating film 814.

The multilayer wiring layer has, in another opening section formed in the barrier insulating film 807, on the first wiring 805c that serves as a first electrode, the wall surface of the another opening section in the barrier insulating film 807, and the barrier insulating film 807, the two-terminal switch 823 formed in which an ion conductive layer 809b, a second electrode 810b, and a rectifying layer 808b are stacked in this sequence and the upper surface and the side face of a stacked body of the ion conductive layer 809b and the second electrode 810b covered by the protection insulating film 814.

Forming portions of the first wirings 805a and 805b into lower electrodes of the four-terminal switch 822 with rectifying elements and forming a portion of the first wiring 805c into a lower electrode of the two-terminal switch 823, while simplifying the number of process steps, enable electrode resistance to be reduced. Only generating a mask set of at least three PRs as additional process steps to a regular copper damascene wiring process enables the four-terminal switch 822 with rectifying elements and the two-terminal switch 823 to be provided in the same wiring layer, which enables reduction in element resistance and cost reduction to be achieved at the same time.

The four-terminal switch 822 with rectifying elements has the ion conductive layer 809a in direct contact with the first wirings 805a and 805b in regions in the opening section formed in the barrier insulating film 807. A metal constituting a portion of the ion conductive layer 809a diffuses into the first wirings 805a and 805b and thereby forms alloy layers.

The two-terminal switch 823 has the ion conductive layer 809b in direct contact with the first wiring 805c in a region in the another opening section formed in the barrier insulating film 807. A metal constituting a portion of the ion conductive layer 809b diffuses into the first wiring 805c and thereby forms an alloy layer.

The four-terminal switch 822 with rectifying elements has the rectifying layer 808a on the second electrode 810a, and the rectifying layer 808a is in contact with the third electrode 811 at the upper surface of the rectifying layer 808a. The third electrode 811 of the four-terminal switch 822 with rectifying elements is electrically separated into two regions by etching. On this occasion, the rectifying layer 808a may be separated into two regions as with the third electrode 811 or does not have to be separated. On the third electrode 811, the first hard mask film 812 and the second hard mask film 813, which are separated as with the third electrode 811, remain. The second hard mask film 813 does not have to remain.

In the four-terminal switch 822 with rectifying elements, the vias 819a and 819b and the third electrode 811 are electrically connected to each other with the second barrier metals 820a and 820b in between, respectively, on the third electrode 811.

The four-terminal switch 822 with rectifying elements is on/off controlled by applying voltage or flowing current between the second electrode 810a and the first wiring 805a or 805b via the rectifying layer 808a, such as being on/off controlled by use of electric field diffusion of metal ions supplied from a metal forming the first wirings 805a and 805b into the ion conductive layer 809a. On this occasion, on-resistance is determined by current in the rectifying layer 808a.

In the two-terminal switch 823, the via 819c and the second electrode 810b are electrically connected to each other with the second barrier metal 820c in between, on the second electrode 810b. The rectifying layer 808b may remain on the second electrode 810b or may be removed when etching is performed in a production process of the two-terminal switch 823. The two-terminal switch 823 is on/off controlled by applying voltage or flowing current, such as being on/off controlled by use of electric field diffusion of metal ions supplied from a metal forming the first wiring 805c into the ion conductive layer 809b.

The semiconductor substrate 801 is a substrate on which semiconductor elements are formed. For the semiconductor substrate 801, as with the first example embodiment and the like, substrates, such as a silicon substrate, a single crystal substrate, an SOI substrate, a TFT substrate, a substrate for liquid crystal production, and the like can be used.

The interlayer insulating film 802 is an insulating film that is formed on the semiconductor substrate 801. For the interlayer insulating film 802, as with the first example embodiment and the like, for example, a silicon oxide film, a SiOC film or the like can be used. The interlayer insulating film 802 may be a stack of a plurality of insulating films.

For the low-k insulating film 803, a low dielectric constant film (for example, a SiOCH film) or the like that has a lower relative dielectric constant than a silicon oxide film is used. The low-k insulating film 803 is an insulating film that is interposed between the interlayer insulating films 802 and 804 and has a low dielectric constant. In the low-k insulating film 803, wiring grooves for embedding the first wirings 805a, 805b, and 805c are formed. In the wiring grooves in the low-k insulating film 803, the first wirings 805a, 805b, and 805c are embedded with the first barrier metals 806a, 806b, and 806c in between, respectively.

The interlayer insulating film 804 is an insulating film that is formed on the low-k insulating film 803. For the interlayer insulating film 804, as with the first example embodiment and the like, for example, a silicon oxide film, a SiOC film or the like can be used. The interlayer insulating film 804 may be a stack of a plurality of insulating films. In the interlayer insulating film 804, wiring grooves for embedding the first wirings 805a, 805b, and 805c are formed. In the wiring grooves in the interlayer insulating film 804, the first wirings 805a, 805b, and 805c are embedded with the first barrier metals 806a, 806b, and 806c in between, respectively.

The first wirings 805a and 805b are wirings that are embedded in the wiring grooves formed in the interlayer insulating film 804 and the low-k insulating film 803 with the first barrier metals 806a and 806b in between, respectively. The first wirings 805a and 805b also serve as the lower electrodes of the four-terminal switch 822 with rectifying elements and are in direct contact with the ion conductive layer 809a. The upper surface of the ion conductive layer 809a is in direct contact with the second electrode 810a. As a metal constituting the first wirings 805a and 805b, a metal that can diffuse and be ion-conducted in the ion conductive layer 809a is used and, for example, copper or the like can be used. The metal (for example, copper) constituting the first wirings 805a and 805b may be alloyed with aluminum.

The first wiring 805c is a wiring that is embedded in the wiring groove formed in the interlayer insulating film 804 and the low-k insulating film 803 with the first barrier metal 806c in between. The first wiring 805c also serves as the lower electrode of the two-terminal switch 823 and is in direct contact with the ion conductive layer 809b. The upper surface of the ion conductive layer 809b is in direct contact with the second electrode 810b. As a metal constituting the first wiring 805c, a metal that can diffuse and be ion-conducted in the ion conductive layer 809b is used and, for example, copper or the like can be used. The metal (for example, copper) constituting the first wiring 805c may be alloyed with aluminum.

The first barrier metals 806a, 806b, and 806c are conductive films having a barrier property. The first barrier metals 806a, 806b, and 806c, in order to prevent the metal forming the first wirings 805a, 805b, and 805c from diffusing into the interlayer insulating film 804 and lower layers, covers the side surfaces and the bottom surfaces of the respective wirings. When the first wirings 805a, 805b, and 805c are constituted by metallic elements including copper as a main component, a refractory metal, a nitride thereof or the like, such as tantalum, tantalum nitride, titanium nitride, and tungsten carbonitride, or a stacked film thereof can be used for the first barrier metals 806a, 806b, and 806c.

The barrier insulating film 807 is formed on the interlayer insulating film 804 including the first wirings 805a, 805b, and 805c. This configuration enables the barrier insulating film 807 to have roles of preventing the metal (for example, copper) forming the first wirings 805a, 805b, and 805c from being oxidized, preventing the metal forming the first wirings 805a, 805b, and 805c from diffusing into the interlayer insulating film 815, and working as an etching stop layer at the time of processing the third electrode 811, the rectifying layers 808a and 808b, the second electrodes 810a and 810b, and the ion conductive layers 809a and 809b. For the barrier insulating film 807, as with the first example embodiment and the like, for example, a SiC film, a silicon carbonitride film, a silicon nitride film, a stacked structure thereof, or the like can be used. The barrier insulating film 807 is preferably made of the same material as the protection insulating film 814 and the first hard mask film 812.

The ion conductive layers 809a and 809b are films the resistance of which changes. For the ion conductive layers 809a and 809b, a material the resistance of which changes due to action (diffusion, ionic conduction, or the like) of metal ions generated from the metal forming the first wirings 805a, 805b, and 805c (lower electrodes) can be used. When resistance change in association with switching to an on-state is achieved through deposition of a metal by reduction of metal ions, a film capable of conducting ions is used for the ion conductive layers 809a and 809b.

The ion conductive layers 809a and 809b are respectively constituted by ion conductive layers that are made of a metal oxide and are in contact with the first wirings 805a, 805b, and 805c and ion conductive layers that are made of a polymer and are in contact with the second electrodes 810a and 810b.

The ion conductive layer made of a polymer in each of the ion conductive layers 809a and 809b is formed using a plasma-enhanced CVD method. Raw material of cyclic organosiloxane and helium, which is a carrier gas, are flowed into a reaction chamber, and, when the supply of both the cyclic organosiloxane and helium has stabilized and pressure in the reaction chamber has become constant, application of RF electric power is started. The amount of supply of the raw material is set at 10 to 200 sccm, and 500 sccm helium is supplied via a raw material vaporizer.

The ion conductive layer made of a metal oxide in each of the ion conductive layers 809a and 809b has a plurality of roles. One role is to prevent the metal forming the first wirings 805a, 805b, and 805c from diffusing into the ion conductive layer made of a polymer due to application of heat and plasma during deposition of the ion conductive layer made of a polymer. Another role is to prevent the first wirings 805a, 805b, and 805c from being oxidized and becoming easily accelerated to diffuse into the ion conductive layer made of a polymer. A metal, such as zirconium, hafnium, aluminum and titanium, that forms the ion conductive layer made of a metal oxide, after film formation of the metal that constitutes the ion conductive layer made of a metal oxide, is exposed to an oxygen atmosphere under reduced pressure in a film forming chamber for the ion conductive layer made of a polymer and becomes zirconium oxide, hafnium oxide, aluminum oxide, or titanium oxide, thereby becoming a portion of each of the ion conductive layers 809a and 809b. An optimum thickness of a metal film that forms the ion conductive layer made of a metal oxide is 0.5 to 1 nm. The metal film that is used for forming the ion conductive layer made of a metal oxide may form a stack or a single layer. Film formation of the metal film that is used for forming the ion conductive layer made of a metal oxide is preferably performed by sputtering. Metal atoms or ions having acquired energy through sputtering plunge and diffuse into the first wirings 805a, 805b, and 805c and form alloy layers.

The ion conductive layer 809a is formed on the first wirings 805a and 805b, a portion of the interlayer insulating film 804 flanked by the first wirings 805a and 805b, tapered surfaces formed in the opening section in the barrier insulating film 807, and the barrier insulating film 807.

The ion conductive layer 809b is formed on the first wiring 805c, tapered surfaces formed in the another opening section in the barrier insulating film 807, and the barrier insulating film 807.

The second electrodes 810a and 810b are upper electrodes of the four-terminal switch 822 with rectifying elements and the two-terminal switch 823 and are in direct contact with the ion conductive layers 809a and 809b, respectively.

For the second electrodes 810a and 810b, a ruthenium alloy containing titanium, tantalum, zirconium, hafnium, aluminum or the like is used. Ruthenium is a metal that is harder to ionize than the metal forming the first wirings 805a, 805b, and 805c and is hard to diffuse and be ion-conducted in the ion conductive layers 809a and 809b. Titanium, tantalum, zirconium, hafnium, or aluminum that is added to a ruthenium alloy has a good adhesiveness with the metal forming the first wirings 805a, 805b, and 805c. As a first metal that constitutes the second electrodes 810a and 810b and is added to ruthenium, it is preferable to select a metal that has a standard Gibbs energy of formation of a process of generating metal ions from the metal (oxidation process) larger than ruthenium in the negative direction. Because of having a standard Gibbs energy of formation of a process of generating metal ions from a metal (oxidation process) larger than ruthenium in the negative direction and being more likely to spontaneously react chemically than ruthenium, titanium, tantalum, zirconium, hafnium, aluminum or the like are highly reactive. For this reason, the ruthenium alloy that forms the second electrodes 810a and 810b, alloying titanium, tantalum, zirconium, hafnium, aluminum, or the like with ruthenium improves adhesiveness thereof with metal cross-links formed by the metal forming the first wirings 805a, 805b, and 805c.

On the other hand, an additive metal itself like titanium, tantalum, zirconium, hafnium, aluminum or the like, not alloyed with ruthenium, becomes too highly reactive, which causes a transition to an "OFF" state not to occur. While a transition from an "ON" state to an "OFF" state proceeds through oxidation reaction (dissolution reaction) of metal cross-links, when a metal constituting the second electrodes 810a and 810b has a standard Gibbs energy of formation of a process of generating metal ions from the metal (oxidation process) larger, in the negative direction, than the metal forming the first wirings 805a, 805b, and 805c, the oxidation reaction of the metal constituting the second electrodes 810a and 810b proceeds faster than the oxidation reaction of metal cross-links formed by the metal forming the first wirings 805a, 805b, and 805c, which causes a transition to the "OFF" state not to occur.

For this reason, a metal material that is used to form the metal constituting the second electrodes 810a and 810b is required to be alloyed with ruthenium that has a standard Gibbs energy of formation of a process of generating metal ions from the metal (oxidation process) smaller than copper in the negative direction.

Further, when copper, which is a component of metal cross-links, mixes with the metal constituting the second electrodes 810a and 810b, an effect of adding a metal having a large standard Gibbs energy of formation in the negative direction is reduced. For this reason, a material having a barrier property against copper and copper ions is preferable as a metal added to ruthenium. Such materials include, for example, tantalum and titanium. On the other hand, it has been revealed that, the larger the amount of additive metal is, the more stable an "ON" state becomes, and even an addition of only 5 atm % metal improves the stability. In particular, a case of using titanium as an additive metal excels in transition to an off-state and stability of an on-state, and it is particularly preferable that an alloy of ruthenium and titanium be used as the metal constituting the second electrodes 810a and 810b and a content of titanium be set at a value within a range from 20 atm % to 30 atm %. A content of ruthenium in the ruthenium alloy is preferably set at a value of 60 atm % or higher and 90 atm % or lower.

For forming a ruthenium alloy, it is preferable to use a sputtering method. When an alloy is film-formed using a sputtering method, the sputtering methods include a method of using a target made of an alloy of ruthenium and the first metal, a co-sputtering method of sputtering a ruthenium target and a first metal target in the same chamber at the same time, and an intermixing method in which a thin film of the first metal is formed in advance, ruthenium is film-formed on the thin film by a sputtering method, and the first metal and the ruthenium are alloyed with energy of colliding atoms. Use of the co-sputtering method and the intermixing method enables composition of an alloy to be altered. When the intermixing method is employed, it is preferable that, after ruthenium film formation has been finished, heat treatment at a temperature of 400° C. or lower be performed for "planarization" of the mixed state of metals.

The second electrodes 810a and 810b preferably have a two-layer structure. When the sides of the second electrodes 810a and 810b in contact with the ion conductive layers 809a and 809b are made of a ruthenium alloy, the sides of the second electrodes 810a and 810b in contact with the rectifying layers 808a and 808b serve as lower electrodes of the rectifying elements. As a metal species, a metal nitride, such as titanium nitride and tantalum nitride, that is difficult to be oxidized, easy to process, and the work function of which is adjustable by adjusting composition thereof can be used.

Titanium and tantalum may also be used as long as being able to inhibit oxidation at boundary faces of the second electrodes 810*a* and 810*b* with the rectifying layers 808*a* and 808*b*. Titanium nitride, tantalum nitride, titanium, or tantalum is film-formed on the ruthenium alloy layer by a sputtering method in a continuous vacuum process. When titanium or tantalum is nitrided, the nitride is film-formed by introducing nitrogen into a chamber and using a reactive sputtering method.

The rectifying layers 808*a* and 808*b* are layers that have a bipolar rectification effect and have a characteristic in which current increases in a non-linear manner with respect to applied voltage. A Poole-Frenkel type insulating film, a Schottky type insulating film, a threshold switching type volatile variable-resistance film, or the like can be used as the rectifying layers 808*a* and 808*b*. For example, a film containing any of titanium oxide, tungsten oxide, molybdenum oxide, hafnium oxide, aluminum oxide, zircon oxide, yttrium oxide, manganese oxide, niobium oxide, silicon nitride, silicon carbonitride, silicon oxide, and amorphous silicon can be used as the rectifying layers 808*a* and 808*b*. In particular, constituting a stack by stacking amorphous silicon, silicon nitride, and amorphous silicon in this sequence enables excellent non-linearity to be generated. By, by means of interposing a silicon nitride film between amorphous silicon films, causing composition of a portion of the silicon nitride film to be brought to a state in which nitrogen is deficient from the stoichiometric ratio and thereby reducing differences in barrier heights with the second electrode 810*a* and the third electrode 811, it is possible to facilitate tunneling current to flow to the silicon nitride at the time of high voltage application. As a result, a non-linear current change is generated.

The third electrode 811 is a metal that serves as upper electrodes of the rectifying elements, and, for example, tantalum, titanium, tungsten, a nitride thereof, or the like can be used for the third electrode 811. In order to make current-voltage characteristics of the rectifying elements symmetrical in both positive and negative sides, it is preferable to use the same material as those of the second electrodes 810*a* and 810*b* for the third electrode 811. The third electrode 811 also has a function as an etching stop layer when the vias 819*a* and 819*b* are electrically connected onto the second electrode 810*a*. Thus, it is preferable that the third electrode 811 have a low etching rate for plasma of a fluorocarbon-based gas that is used in etching of the interlayer insulating film 815. For forming the third electrode 811, it is preferable to use a sputtering method. When a metal nitride is film-formed using a sputtering method, it is preferable to use a reactive sputtering method in which a metal target is vaporized using plasma of a gas mixture of nitrogen and argon. A metal vaporized from the metal target reacts with nitrogen and forms a metal nitride, which is film-formed on a substrate.

The third electrode 811 is present only on the four-terminal switch 822 with rectifying elements in which rectifying elements are formed and separated into two regions on the four-terminal switch 822 with rectifying elements. As a result, two rectifying elements are arranged on the four-terminal switch 822 with rectifying elements independently of each other.

The first hard mask film 812 is a film that serves as a hard mask film and a passivation film when the third electrode 811, the second electrodes 810*a* and 810*b*, the rectifying layers 808*a* and 808*b*, and the ion conductive layers 809*a* and 809*b* are etched. For the first hard mask film 812, as with the first example embodiment and the like, for example, a silicon nitride film, a silicon oxide film or the like, or a stack thereof can be used. The first hard mask film 812 preferably includes the same material as the protection insulating film 814 and the barrier insulating film 807.

The second hard mask film 813 is a film that serves as a hard mask film when the third electrode 811, the second electrodes 810*a* and 810*b*, the rectifying layers 808*a* and 808*b*, and the ion conductive layers 809*a* and 809*b* are etched. For the second hard mask film 813, for example, a silicon nitride film, a silicon oxide film or the like, or a stack thereof can be used.

Based on a shape of the second hard mask film 813, the four-terminal switch 822 with rectifying elements and the two-terminal switch 823 are formed differently from each other. On the barrier insulating film 807 of the four-terminal switch 822 with rectifying elements and the two-terminal switch 823, the ion conductive layers 809*a* and 809*b*, the second electrodes 810*a* and 810*b*, the rectifying layers 808*a* and 808*b*, the third electrode 811, the first hard mask film 812, and the second hard mask film 813 are film-formed. Subsequently, in a manner in which a shape of the second hard mask film 813, formed through two rounds of patterning and etching, is transferred onto the four-terminal switch 822 with rectifying elements, two rectifying elements are formed separated from each other on the second electrode 810*a* in one round of etching.

That is, a stacked structure for the four-terminal switch 822 with rectifying elements is film-formed once on the whole wafer, and, on an element portion to which the two-terminal switch 823 is to be formed, patterning for forming a rectifying element portion in the four-terminal switch 822 with rectifying elements is configured not to be performed (a resist is configured not to be left). This configuration causes thickness of a portion of the second hard mask film 813 on the two-terminal switch 823 to be reduced. Subsequently, performing etching enables a portion of the third electrode 811 on the two-terminal switch 823 to be removed. That is, an area on the two-terminal switch 823 is brought into the same condition as an area on the four-terminal switch 822 with rectifying elements except an area under which the rectifying elements are formed. The rectifying layer 808*b* may or does not have to remain on the second electrode 810*a* of the two-terminal switch 823. In addition, the first hard mask film 812 and the second hard mask film 813 do not remain on the two-terminal switch 823.

The protection insulating film 814 is an insulating film that has functions of preventing the four-terminal switch 822 with rectifying elements and the two-terminal switch 823 from being damaged and further preventing desorption of oxygen from the ion conductive layers 809*a* and 809*b*. For the protection insulating film 814, for example, a silicon nitride film, a silicon carbonitride film or the like can be used. The protection insulating film 814 is preferably made of the same material as the first hard mask film 812 and the barrier insulating film 807. In the case of being made of the same material, the protection insulating film 814 is integrated into one body with the barrier insulating film 807 and the first hard mask film 812 and adhesiveness of boundary faces thereamong is thereby improved, which enables the four-terminal switch 822 with rectifying elements and the two-terminal switch 823 to be protected more securely.

The interlayer insulating film 815 is an insulating film that is formed on the protection insulating film 814. For the interlayer insulating film 815, for example, a silicon oxide film, a SiOC film or the like can be used. The interlayer insulating film 815 may be a stack of a plurality of insulating films. The interlayer insulating film 815 may be made of the same material as the interlayer insulating film 817. In the interlayer insulating film 815, lower holes for embedding the vias 819a, 819b, and 819c are formed, and, in the lower holes, the vias 819a, 819b, and 819c are embedded with the second barrier metals 820a, 820b, and 820c in between, respectively.

For the low-k insulating film 816, a low dielectric constant film (for example, a SiOCH film) or the like that has a lower relative dielectric constant than a silicon oxide film is used. The low-k insulating film 816 is an insulating film that is interposed between the interlayer insulating films 815 and 817 and has a low dielectric constant. In the low-k insulating film 816, wiring grooves for embedding the second wirings 818a, 818b, and 818c are formed. In the wiring grooves in the low-k insulating film 816, the second wirings 818a, 818b, and 818c are embedded with the second barrier metals 820a, 820b, and 820c in between, respectively.

The interlayer insulating film 817 is an insulating film that is formed on the low-k insulating film 816. For the interlayer insulating film 817, for example, a silicon oxide film, a SiOC film, a low dielectric constant film (for example, a SiOCH film) that has a lower relative dielectric constant than a silicon oxide film, or the like can be used. The interlayer insulating film 817 may be a stack of a plurality of insulating films. The interlayer insulating film 817 may be made of the same material as the interlayer insulating film 815. In the interlayer insulating film 817, wiring grooves for embedding the second wirings 818a, 818b, and 818c are formed. In the wiring grooves in the interlayer insulating film 817, the second wirings 818a, 818b, and 818c are embedded with the second barrier metals 820a, 820b, and 820c in between, respectively.

The second wirings 818a, 818b, and 818c are wirings that are embedded in the wiring grooves formed in the interlayer insulating film 817 and the low-k insulating film 816 with the second barrier metals 820a, 820b, and 820c in between, respectively. The second wirings 818a, 818b, and 818c are integrated into one body with the vias 819a, 819b, and 819c, respectively.

The vias 819a and 819b are embedded in the lower holes formed in the interlayer insulating film 815, the protection insulating film 814, the first hard mask film 812, and the second hard mask film 813 with the second barrier metals 820a and 820b in between, respectively. The via 819c is embedded in the lower hole formed in the interlayer insulating film 815 and the protection insulating film 814 with the second barrier metal 820c in between.

The vias 819a and 819b are electrically connected to the third electrode 811 via the second barrier metals 820a and 820b, respectively. The via 819c is electrically connected to the second electrode 810b via the second barrier metal 820c. For the second wirings 818a, 818b, and 818c and the vias 819a, 819b, and 819c, for example, copper can be used.

The second barrier metals 820a, 820b, and 820c are conductive films that cover the side surfaces and the bottom surfaces of the second wirings 818a, 818b, and 818c and the vias 819a, 819b, and 819c, respectively and have a barrier property. The second barrier metals 820a, 820b, and 820c prevent a metal forming the second wirings 818a, 818b, and 818c (including the vias 819a, 819b, and 819c) from diffusing into the interlayer insulating films 815 and 817 and lower layers.

When the second wirings 818a, 818b, and 818c and the vias 819a, 819b, and 819c are constituted by metallic elements including copper as a main component, a refractory metal, a nitride thereof or the like, such as tantalum, tantalum nitride, titanium nitride and tungsten carbonitride, or a stacked film thereof can be used for the second barrier metals 820a, 820b, and 820c.

The barrier insulating film 821 is an insulating film that is formed on the interlayer insulating film 817 including the second wirings 818a, 818b, and 818c. The barrier insulating film 821 has roles of preventing the metal (for example, copper) forming the second wirings 818a, 818b, and 818c from being oxidized and preventing the metal forming the second wirings 818a, 818b, and 818c from diffusing into upper layers. For the barrier insulating film 821, for example, a silicon carbonitride film, a silicon nitride film, a stacked structure thereof, or the like can be used.

Advantageous Effect of Example Embodiment

According to the present example embodiment, it is possible to achieve a semiconductor device including the four-terminal switch 822 with rectifying elements including two rectifying elements and the two-terminal switch 823 provided with no rectifying element in the same wiring in a multilayer wiring structure. In the present example embodiment, it is possible to form the four-terminal switch 822 with rectifying elements including two rectifying elements and the two-terminal switch 823 in the same wiring layer at the same time.

Fourth Example Embodiment

Figure 12:
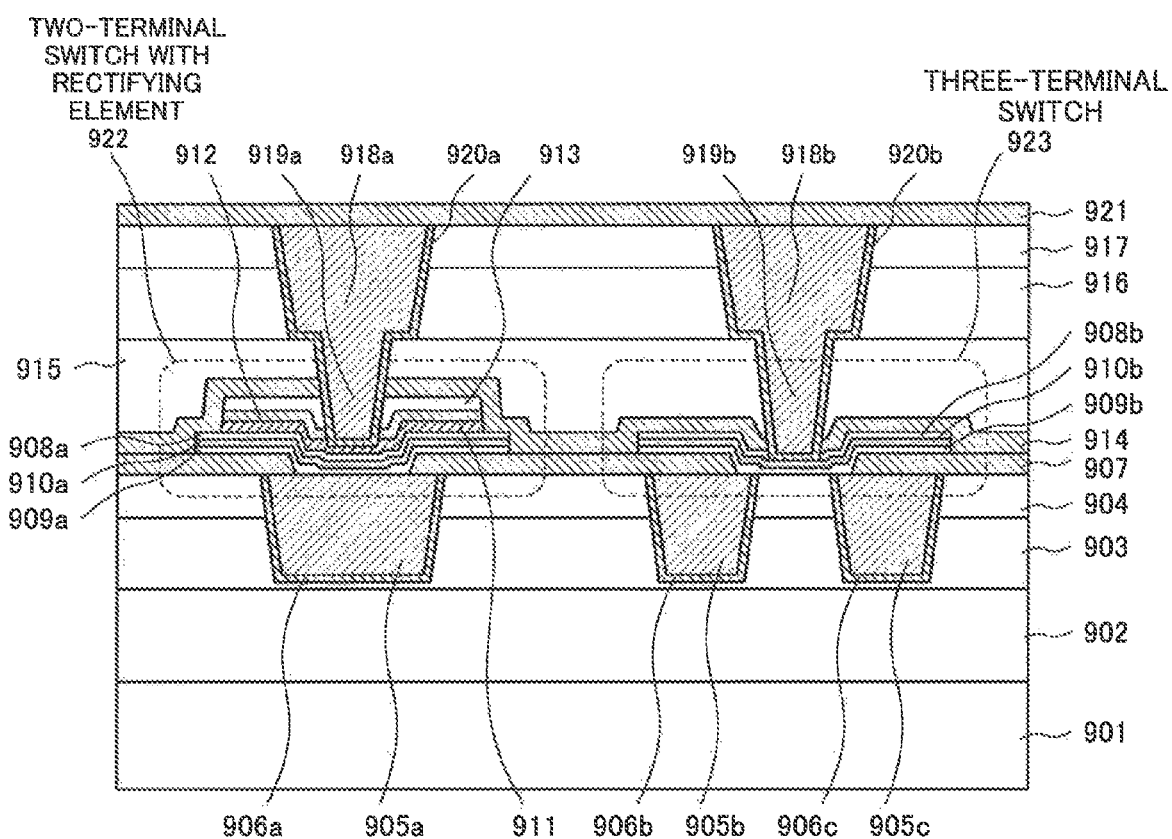
FIG. 12 is a cross-sectional schematic view illustrating a configuration example of a semiconductor device of a fourth example embodiment.

Next, a semiconductor device according to a fourth example embodiment and a method for producing the semiconductor device will be described. The present example embodiment is a semiconductor device that has "a two-terminal switch with a rectifying element and a three-terminal switch" formed within a multilayer wiring layer. FIG. 12 is a cross-sectional schematic view illustrating a configuration example of the semiconductor device of the fourth example embodiment. The present example embodiment is a semiconductor device that includes a two-terminal switch with a rectifying element and a three-terminal switch within a multilayer wiring layer and the equivalent circuit diagrams of which are illustrated in (a) of FIG. 16.

Configuration

The semiconductor device illustrated in FIG. 12 has a two-terminal switch 922 with a rectifying element and a three-terminal switch 923 within a multilayer wiring layer on a semiconductor substrate 901.

The multilayer wiring layer has an insulating stacked body in which, on the semiconductor substrate 901, an interlayer insulating film 902, a low-k insulating film 903, an interlayer insulating film 904, a barrier insulating film 907, a protection insulating film 914, an interlayer insulating film 915, a low-k insulating film 916, an interlayer insulating film 917, and a barrier insulating film 921 are stacked in this sequence. The multilayer wiring layer has, in wiring grooves formed in the interlayer insulating film 904 and the low-k insulating film 903, first wirings 905a and 905b embedded with first barrier metals 906a and 906b in between, respectively.

Further, the multilayer wiring layer has second wirings 918a and 918b embedded in wiring grooves formed in the interlayer insulating film 917 and the low-k insulating film 916. Furthermore, vias 919a and 919b are embedded in lower holes that are formed in the interlayer insulating film 915, the protection insulating film 914, and a first hard mask film 912. Each of pairs of the second wiring 918a and the via 919a and the second wiring 918b and the via 919b are integrated into one body. In addition, the side surfaces and the bottom surfaces of pairs of the second wiring 918a and the via 919a and the second wiring 918b and the via 919b are covered by second barrier metals 920a and 920b, respectively.

In an opening section formed in the barrier insulating film 907, on the first wiring 905a that serves as a first electrode, the wall surface of the opening section in the barrier insulating film 907, and the barrier insulating film 907, an ion conductive layer 909a, a second electrode 910a, a rectifying layer 908a, and a third electrode 911 are stacked in this sequence and the two-terminal switch 922 with a rectifying element is thereby formed. In addition, on the third electrode 911, the first hard mask film 912 and a second hard mask film 913 are formed. Further, the upper surface and the side face of a stacked body of the ion conductive layer 909a, the second electrode 910a, the rectifying layer 908a, the third electrode 911, the first hard mask film 912, and the second hard mask film 913 are covered by the protection insulating film 914.

The multilayer wiring layer has, in another opening section formed in the barrier insulating film 907, on the first wirings 905b and 905c that serve as first electrodes, a portion of the interlayer insulating film 904 flanked by the first wirings 905b and 905c, the wall surface of the another opening section in the barrier insulating film 907, and the barrier insulating film 907, the three-terminal switch 923 formed in which an ion conductive layer 909b, a second electrode 910b, and a rectifying layer 908b are stacked in this sequence and the upper surface and the side face of a stacked body of the ion conductive layer 909b and the second electrode 910b covered by the protection insulating film 914.

Forming a portion of the first wiring 905a into a lower electrode of the two-terminal switch 922 with a rectifying element and forming portions of the first wirings 905b and 905c into lower electrodes of the three-terminal switch 923, while simplifying the number of process steps, enable electrode resistance to be reduced. Only generating a mask set of at least three PRs as additional process steps to a regular copper damascene wiring process enables the two-terminal switch 922 with a rectifying element and the three-terminal switch 923 to be provided in the same wiring layer, which enables reduction in element resistance and cost reduction to be achieved at the same time.

The two-terminal switch 922 with a rectifying element has the ion conductive layer 909a in direct contact with the first wiring 905a in a region in the opening section formed in the barrier insulating film 907. A metal constituting a portion of the ion conductive layer 909a diffuses into the first wiring 905a and thereby forms an alloy layer.

The three-terminal switch 923 has the ion conductive layer 909b in direct contact with the first wirings 905b and 905c in regions in the another opening section formed in the barrier insulating film 907. A metal constituting a portion of the ion conductive layer 909b diffuses into the first wirings 905b and 905c and thereby forms alloy layers.

The two-terminal switch 922 with a rectifying element has the rectifying layer 908a on the second electrode 910a, and the rectifying layer 908a is in contact with the third electrode 911 at the upper surface of the rectifying layer 908a. On the third electrode 911, the first hard mask film 912 and the second hard mask film 913 remain. The second hard mask film 913 does not have to remain.

In the two-terminal switch 922 with a rectifying element, the via 919a and the third electrode 911 are electrically connected to each other with the second barrier metal 920a in between, on the third electrode 911.

The two-terminal switch 922 with a rectifying element is on/off controlled by applying voltage or flowing current between the second electrode 910a and the first wiring 905a via the rectifying layer 908a, such as being on/off controlled by use of electric field diffusion of metal ions supplied from a metal forming the first wiring 905a into the ion conductive layer 909a. On this occasion, on-resistance is determined by current in the rectifying layer 908a.

In the three-terminal switch 923, the via 919b and the second electrode 910b are electrically connected to each other with the second barrier metal 920b in between, on the second electrode 910b. The rectifying layer 908b may remain on the second electrode 910b or may be removed when etching is performed in a production process of the three-terminal switch 923. The three-terminal switch 923 is on/off controlled by applying voltage or flowing current, such as being on/off controlled by use of electric field diffusion of metal ions supplied from a metal forming the first wirings 905b and 905c into the ion conductive layer 909b.

The semiconductor substrate 901 is a substrate on which semiconductor elements are formed. For the semiconductor substrate 901, as with the first example embodiment and the like, substrates, such as a silicon substrate, a single crystal substrate, an SOI substrate, a TFT substrate, a substrate for liquid crystal production, and the like can be used.

The interlayer insulating film 902 is an insulating film that is formed on the semiconductor substrate 901. For the interlayer insulating film 902, for example, a silicon oxide film, a SiOC film or the like can be used. The interlayer insulating film 902 may be a stack of a plurality of insulating films.

For the low-k insulating film 903, a low dielectric constant film (for example, a SiOCH film) or the like that has a lower relative dielectric constant than a silicon oxide film is used. The low-k insulating film 903 is an insulating film that is interposed between the interlayer insulating films 902 and 904 and has a low dielectric constant. In the low-k insulating film 903, wiring grooves for embedding the first wirings 905a, 905b, and 905c are formed. In the wiring grooves in the low-k insulating film 903, the first wirings 905a, 905b, and 905c are embedded with the first barrier metals 906a, 906b, and 906c in between, respectively.

The interlayer insulating film 904 is an insulating film that is formed on the low-k insulating film 903. For the interlayer insulating film 904, for example, a silicon oxide film, a SiOC film or the like can be used. The interlayer insulating film 904 may be a stack of a plurality of insulating films. In the interlayer insulating film 904, wiring grooves for embedding the first wirings 905a, 905b, and 905c are formed. In the wiring grooves in the interlayer insulating film 904, the first wirings 905a, 905b, and 905c are embedded with the first barrier metals 906a, 906b, and 906c in between, respectively.

The first wiring 905a is a wiring that is embedded in the wiring groove formed in the interlayer insulating film 904 and the low-k insulating film 903 with the first barrier metal 906a in between. The first wiring 905a also serves as the lower electrode of the two-terminal switch 922 with a rectifying element and is in direct contact with the ion conductive layer 909a. The upper surface of the ion conductive layer 909a is in direct contact with the second electrode 910a. As a metal constituting the first wirings 905a and 905b, a metal that can diffuse and be ion-conducted in the ion conductive layer 909a is used and, for example, copper or the like can be used. The metal (for example, copper) constituting the first wirings 905a and 905b may be alloyed with aluminum.

The first wirings 905b and 905c are wirings that are embedded in the wiring grooves formed in the interlayer insulating film 904 and the low-k insulating film 903 with the first barrier metals 906b and 906c in between, respectively. The first wirings 905b and 905c also serve as the lower electrodes of the three-terminal switch 923 and are in direct contact with the ion conductive layer 909b. The upper surface of the ion conductive layer 909b is in direct contact with the second electrode 910b. As a metal constituting the first wirings 905b and 905c, a metal that can diffuse and be ion-conducted in the ion conductive layer 909b is used and, for example, copper or the like can be used. The metal (for example, copper) constituting the first wirings 905b and 905c may be alloyed with aluminum.

The first barrier metals 906a, 906b, and 906c are conductive films having a barrier property. The first barrier metals 906a, 906b, and 906c, in order to prevent the metal forming the first wirings 905a, 905b, and 905c from diffusing into the interlayer insulating film 904 and lower layers, covers the side surfaces and the bottom surfaces of the respective wirings. When the first wirings 905a, 905b, and 905c are constituted by metallic elements including copper as a main component, a refractory metal, a nitride thereof or the like, such as tantalum, tantalum nitride, titanium nitride, and tungsten carbonitride, or a stacked film thereof can be used for the first barrier metals 906a, 906b, and 906c.

The barrier insulating film 907 is formed on the interlayer insulating film 904 including the first wirings 905a, 905b, and 905c. This configuration enables the barrier insulating film 907 to have roles of preventing the metal (for example, copper) forming the first wirings 905a, 905b, and 905c from being oxidized, preventing the metal forming the first wirings 905a, 905b, and 905c from diffusing into the interlayer insulating film 915, and working as an etching stop layer at the time of processing the third electrode 911, the rectifying layers 908a and 908b, the second electrodes 910a and 910b, and the ion conductive layers 909a and 909b. For the barrier insulating film 907, for example, a SiC film, a silicon carbonitride film, a silicon nitride film, a stacked structure thereof, or the like can be used. The barrier insulating film 907 is preferably made of the same material as the protection insulating film 914 and the first hard mask film 912.

The ion conductive layers 909a and 909b are films the resistance of which changes. For the ion conductive layers 909a and 909b, a material the resistance of which changes due to action (diffusion, ionic conduction, or the like) of metal ions generated from the metal forming the first wirings 905a, 905b, and 905c (lower electrodes) can be used. When resistance change in association with switching to an on-state is achieved through deposition of a metal by reduction of metal ions, a film capable of conducting ions is used for the ion conductive layers 909a and 909b.

The ion conductive layers 909a and 909b are respectively constituted by ion conductive layers that are made of a metal oxide and are in contact with the first wirings 905a, 905b, and 905c and ion conductive layers that are made of a polymer and are in contact with the second electrodes 910a and 910b.

The ion conductive layer made of a polymer in each of the ion conductive layers 909a and 909b is formed using a plasma-enhanced CVD method. Raw material of cyclic organosiloxane and helium, which is a carrier gas, are flowed into a reaction chamber, and, when the supply of both the cyclic organosiloxane and helium has stabilized and pressure in the reaction chamber has become constant, application of RF electric power is started. The amount of supply of the raw material is set at 10 to 200 sccm, and 500 sccm helium is supplied via a raw material vaporizer.

The ion conductive layer made of a metal oxide in each of the ion conductive layers 909a and 909b has a plurality of roles. One role is to prevent the metal forming the first wirings 905a, 905b, and 905c from diffusing into the ion conductive layer made of a polymer due to application of heat and plasma during deposition of the ion conductive layer made of a polymer. Another role is to prevent the first wirings 905a, 905b, and 905c from being oxidized and becoming easily accelerated to diffuse into the ion conductive layer made of a polymer. A metal, such as zirconium, hafnium, aluminum and titanium, that forms the ion conductive layer made of a metal oxide, after film formation of the metal that constitutes the ion conductive layer made of a metal oxide, is exposed to an oxygen atmosphere under reduced pressure in a film forming chamber for the ion conductive layer made of a polymer and becomes zirconium oxide, hafnium oxide, aluminum oxide, or titanium oxide, thereby becoming a portion of each of the ion conductive layers 909a and 909b. An optimum thickness of a metal film that forms the ion conductive layer made of a metal oxide is 0.5 to 1 nm. The metal film that is used for forming the ion conductive layer made of a metal oxide may form a stack or a single layer. Film formation of the metal film that is used for forming the ion conductive layer made of a metal oxide is preferably performed by sputtering. Metal atoms or ions having acquired energy through sputtering plunge and diffuse into the first wirings 905a, 905b, and 905c and form alloy layers.

The ion conductive layer 909a is formed on the first wiring 905a, tapered surfaces formed in the opening section in the barrier insulating film 907, and the barrier insulating film 907.

The ion conductive layer 909b is formed on the first wirings 905b and 905c, a portion of the interlayer insulating film 904 flanked by the first wirings 905b and 905c, tapered surfaces formed in the another opening section in the barrier insulating film 907, and the barrier insulating film 907.

The second electrodes 910a and 910b are upper electrodes of the two-terminal switch 922 with a rectifying element and the three-terminal switch 923 and are in direct contact with the ion conductive layers 909a and 909b, respectively.

For the second electrodes 910a and 910b, a ruthenium alloy containing titanium, tantalum, zirconium, hafnium, aluminum or the like is used. Ruthenium is a metal that is harder to ionize than the metal forming the first wirings 905a, 905b, and 905c and is hard to diffuse and be ion-conducted in the ion conductive layers 909a and 909b. Titanium, tantalum, zirconium, hafnium, or aluminum that is added to a ruthenium alloy has a good adhesiveness with the metal forming the first wirings 905a, 905b, and 905c. As a first metal that constitutes the second electrodes 910a and 910b and is added to ruthenium, it is preferable to select a metal that has a standard Gibbs energy of formation of a process of generating metal ions from the metal (oxidation process) larger than ruthenium in the negative direction. Because of having a standard Gibbs energy of formation of a process of generating metal ions from a metal (oxidation process) larger than ruthenium in the negative direction and being more likely to spontaneously react chemically than ruthenium, titanium, tantalum, zirconium, hafnium, aluminum or the like are highly reactive. For this reason, in the ruthenium alloy that forms the second electrodes 910a and 910b, alloying titanium, tantalum, zirconium, hafnium, aluminum or the like with ruthenium improves adhesiveness thereof with metal cross-links formed by the metal forming the first wirings 905a, 905b, and 905c.

On the other hand, an additive metal itself like titanium, tantalum, zirconium, hafnium, aluminum or the like, not alloyed with ruthenium, becomes too highly reactive, which causes a transition to an "OFF" state not to occur. While a transition from an "ON" state to an "OFF" state proceeds through oxidation reaction (dissolution reaction) of metal cross-links, when a metal constituting the second electrodes 910a and 910b has a standard Gibbs energy of formation of a process of generating metal ions from the metal (oxidation process) larger, in the negative direction, than the metal forming the first wirings 905a, 905b, and 905c, the oxidation reaction of the metal constituting the second electrodes 910a and 910b proceeds faster than the oxidation reaction of metal cross-links formed by the metal forming the first wirings 905a, 905b, and 905c, which causes a transition to the "OFF" state not to occur.

For this reason, a metal material that is used to form the metal constituting the second electrodes 910a and 910b is required to be alloyed with ruthenium that has a standard Gibbs energy of formation of a process of generating metal ions from the metal (oxidation process) smaller than copper in the negative direction.

Further, when copper, which is a component of metal cross-links, mixes with the metal constituting the second electrodes 910a and 910b, an effect of adding a metal having a large standard Gibbs energy of formation in the negative direction is reduced. For this reason, a material having a barrier property against copper and copper ions is preferable as a metal added to ruthenium. Such materials include, for example, tantalum and titanium. On the other hand, it has been revealed that, the larger the amount of additive metal is, the more stable an "ON" state becomes, and even an addition of only 5 atm % metal improves the stability. In particular, a case of using titanium as an additive metal excels in transition to an off-state and stability of an on-state, and it is particularly preferable that an alloy of ruthenium and titanium be used as the metal constituting the second electrodes 910a and 910b and a content of titanium be set at a value within a range from 20 atm % to 30 atm %. A content of ruthenium in the ruthenium alloy is preferably set at a value of 60 atm % or higher and 90 atm % or lower.

For forming a ruthenium alloy, it is preferable to use a sputtering method. When an alloy is film-formed using a sputtering method, the sputtering methods include a method of using a target made of an alloy of ruthenium and the first metal, a co-sputtering method of sputtering a ruthenium target and a first metal target in the same chamber at the same time, and an intermixing method in which a thin film of the first metal is formed in advance, ruthenium is film-formed on the thin film by a sputtering method, and the first metal and the ruthenium are alloyed with energy of colliding atoms. Use of the co-sputtering method and the intermixing method enables composition of an alloy to be altered. When the intermixing method is employed, it is preferable that, after ruthenium film formation has been finished, heat treatment at a temperature of 400° C. or lower be performed for "planarization" of the mixed state of metals.

The second electrodes 910a and 910b preferably have a two-layer structure. When the sides of the second electrodes 910a and 910b in contact with the ion conductive layers 909a and 909b are made of a ruthenium alloy, the sides of the second electrodes 910a and 910b in contact with the rectifying layers 908a and 908b serve as lower electrodes of the rectifying elements. As a metal species, a metal nitride, such as titanium nitride and tantalum nitride, that is difficult to be oxidized, easy to process, and the work function of which is adjustable by adjusting composition thereof can be used.

Titanium and tantalum may also be used as long as being able to inhibit oxidation at boundary faces of the second electrodes 910a and 910b with the rectifying layers 908a and 908b. Titanium nitride, tantalum nitride, titanium, or tantalum is film-formed on the ruthenium alloy layer by a sputtering method in a continuous vacuum process. When titanium or tantalum is nitrided, the nitride is film-formed by introducing nitrogen into a chamber and using a reactive sputtering method.

The rectifying layers 908a and 908b are layers that have a bipolar rectification effect and have a characteristic in which current increases in a non-linear manner with respect to applied voltage. A Poole-Frenkel type insulating film, a Schottky type insulating film, a threshold switching type volatile variable-resistance film, or the like can be used as the rectifying layers 908a and 908b. For example, a film containing any of titanium oxide, tungsten oxide, molybdenum oxide, hafnium oxide, aluminum oxide, zircon oxide, yttrium oxide, manganese oxide, niobium oxide, silicon nitride, silicon carbonitride, silicon oxide, and amorphous silicon can be used as the rectifying layers 908a and 908b. In particular, constituting a stack by stacking amorphous silicon, silicon nitride, and amorphous silicon in this sequence enables excellent non-linearity to be generated. By, by means of interposing a silicon nitride film between amorphous silicon films, causing composition of a portion of the silicon nitride film to be brought to a state in which nitrogen is deficient from the stoichiometric ratio and thereby reducing differences in barrier heights with the second electrode 910a and the third electrode 911, it is possible to facilitate tunneling current to flow to the silicon nitride at the time of high voltage application. As a result, a non-linear current change is generated.

The third electrode 911 is a metal that serves as an upper electrode of the rectifying element, and, for example, tantalum, titanium, tungsten, a nitride thereof, or the like can be used for the third electrode 911. In order to make current-voltage characteristics of the rectifying element symmetrical in both positive and negative sides, it is preferable to use the same material as that of the second electrode 910a for the third electrode 911. The third electrode 911 also has a function as an etching stop layer when the via 919a is electrically connected onto the second electrode 910a. Thus, it is preferable that the third electrode 911 have a low etching rate for plasma of a fluorocarbon-based gas that is used in etching of the interlayer insulating film 915. For forming the third electrode 911, it is preferable to use a sputtering method. When a metal nitride is film-formed using a sputtering method, it is preferable to use a reactive sputtering method in which a metal target is vaporized using plasma of a gas mixture of nitrogen and argon. A metal vaporized from the metal target reacts with nitrogen and forms a metal nitride, which is film-formed on a substrate.

The third electrode 911 is present only on the two-terminal switch 922 with a rectifying element in which a rectifying element is formed and is not present on the three-terminal switch 923.

The first hard mask film 912 is a film that serves as a hard mask film and a passivation film when the third electrode 911, the second electrodes 910a and 910b, the rectifying layers 908a and 908b, and the ion conductive layers 909a and 909b are etched. For the first hard mask film 912, for example, a silicon nitride film, a silicon oxide film or the like, or a stack thereof can be used. The first hard mask film 912 preferably includes the same material as the protection insulating film 914 and the barrier insulating film 907.

The second hard mask film 913 is a film that serves as a hard mask film when the third electrode 911, the second electrodes 910a and 910b, the rectifying layers 908a and 908b, and the ion conductive layers 909a and 909b are etched. For the second hard mask film 913, for example, a silicon nitride film, a silicon oxide film or the like, or a stack thereof can be used.

Based on a shape of the second hard mask film 913, the two-terminal switch 922 with a rectifying element and the three-terminal switch 923 are formed differently from each other. On the barrier insulating film 907 of the two-terminal switch 922 with a rectifying element and the three-terminal switch 923, the ion conductive layers 909a and 909b, the second electrodes 910a and 910b, the rectifying layers 908a and 908b, the third electrode 911, the first hard mask film 912, and the second hard mask film 913 are film-formed. Subsequently, in a manner in which a shape of the second hard mask film 913, formed through two rounds of patterning and etching, is transferred onto the two-terminal switch 922 with a rectifying element, a rectifying element is formed on the second electrode 910a.

That is, a stacked structure for the two-terminal switch 922 with a rectifying element is film-formed once on the whole wafer, and, on an element portion to which the three-terminal switch 923 is to be formed, patterning for forming a rectifying element portion in the two-terminal switch 922 with a rectifying element is configured not to be performed (a resist is configured not to be left). This configuration causes thickness of a portion of the second hard mask film 913 on the three-terminal switch 923 to be reduced. Subsequently, performing etching enables a portion of the third electrode 911 on the three-terminal switch 923 to be removed. That is, an area on the three-terminal switch 923 is brought into the same condition as an area on the two-terminal switch 922 with a rectifying element except an area under which the rectifying element is formed. The rectifying layer 908b may or does not have to remain on the second electrode 910a of the three-terminal switch 923. In addition, the first hard mask film 912 and the second hard mask film 913 do not remain on the three-terminal switch 923.

The protection insulating film 914 is an insulating film that has functions of preventing the two-terminal switch 922 with a rectifying element and the three-terminal switch 923 from being damaged and further preventing desorption of oxygen from the ion conductive layers 909a and 909b. For the protection insulating film 914, for example, a silicon nitride film, a silicon carbonitride film or the like can be used. The protection insulating film 914 is preferably made of the same material as the first hard mask film 912 and the barrier insulating film 907. In the case of being made of the same material, the protection insulating film 914 is integrated into one body with the barrier insulating film 907 and the first hard mask film 912 and adhesiveness of boundary faces thereamong is thereby improved, which enables the four-terminal switch 922 with rectifying elements and the two-terminal switch 923 to be protected more securely.

The interlayer insulating film 915 is an insulating film that is formed on the protection insulating film 914. For the interlayer insulating film 915, for example, a silicon oxide film, a SiOC film or the like can be used. The interlayer insulating film 915 may be a stack of a plurality of insulating films. The interlayer insulating film 915 may be made of the same material as the interlayer insulating film 917. In the interlayer insulating film 915, lower holes for embedding the vias 919a and 919b are formed, and, in the lower holes, the vias 919a and 919b are embedded with the second barrier metals 920a and 920b in between, respectively.

For the low-k insulating film 916, a low dielectric constant film (for example, a SiOCH film) or the like that has a lower relative dielectric constant than a silicon oxide film is used. The low-k insulating film 916 is an insulating film that is interposed between the interlayer insulating films 915 and 917 and has a low dielectric constant. In the low-k insulating film 916, wiring grooves for embedding the second wirings 918a and 918b are formed. In the wiring grooves in the low-k insulating film 916, the second wirings 918a and 918b are embedded with the second barrier metals 920a and 920b in between, respectively.

The interlayer insulating film 917 is an insulating film that is formed on the low-k insulating film 916. For the interlayer insulating film 917, for example, a silicon oxide film, a SiOC film, a low dielectric constant film (for example, a SiOCH film) that has a lower relative dielectric constant than a silicon oxide film, or the like can be used. The interlayer insulating film 917 may be a stack of a plurality of insulating films. The interlayer insulating film 917 may be made of the same material as the interlayer insulating film 915. In the interlayer insulating film 917, wiring grooves for embedding the second wirings 918a and 918b are formed. In the wiring grooves in the interlayer insulating film 917, the second wirings 918a and 918b are embedded with the second barrier metals 920a and 920b in between, respectively.

The second wirings 918a and 918b are wirings that are embedded in the wiring grooves formed in the interlayer insulating film 917 and the low-k insulating film 916 with the second barrier metals 920a and 920b in between, respectively. The second wirings 918a and 918b are integrated into one body with the vias 919a and 919b, respectively.

The via 919a is embedded in the lower hole formed in the interlayer insulating film 915, the protection insulating film 914, the first hard mask film 912, and the second hard mask film 913 with the second barrier metal 920a in between. The via 919b is embedded in the lower hole formed in the interlayer insulating film 915 and the protection insulating film 914 with the second barrier metal 920b in between.

The via 919a is electrically connected to the third electrode 911 with the second barrier metal 920a in between. The via 919b is electrically connected to the second electrode 910b with the second barrier metal 920b in between. For the second wirings 918a and 918b and the vias 919a and 919b, for example, copper can be used.

The second barrier metals 920a and 920b are conductive films that cover the side surfaces and the bottom surfaces of the second wirings 918a and 918b and the vias 919a and 919b, respectively and have a barrier property. The second barrier metals 920a and 920b prevent a metal forming the second wirings 918a and 918b (including the vias 919a and 919b) from diffusing into the interlayer insulating films 915 and 917 and lower layers.

For example, when the second wirings 918a and 918b and the vias 919a and 919b are constituted by metallic elements including copper as a main component, a refractory metal, a nitride thereof, or the like, such as tantalum, tantalum nitride, titanium nitride, and tungsten carbonitride, or a stacked film thereof can be used for the second barrier metals 920a and 920b.

The barrier insulating film 921 is an insulating film that is formed on the interlayer insulating film 917 including the second wirings 918a and 918b. The barrier insulating film 921 has roles of preventing the metal (for example, copper) forming the second wirings 918a and 918b from being oxidized and preventing the metal forming the second wirings 918a and 918b from diffusing into upper layers. For the barrier insulating film 921, for example, a silicon carbonitride film, a silicon nitride film, a stacked structure thereof, or the like can be used.

Advantageous Effect of Example Embodiment

According to the present example embodiment, it is possible to achieve a semiconductor device including the two-terminal switch 922 with a rectifying element including one rectifying element and the three-terminal switch 923 provided with no rectifying element in the same wiring in a multilayer wiring structure. In the present example embodiment, it is possible to form the two-terminal switch 922 with a rectifying element including two rectifying elements and the three-terminal switch 923 in the same wiring layer at the same time.

Fifth Example Embodiment

Figure 13:
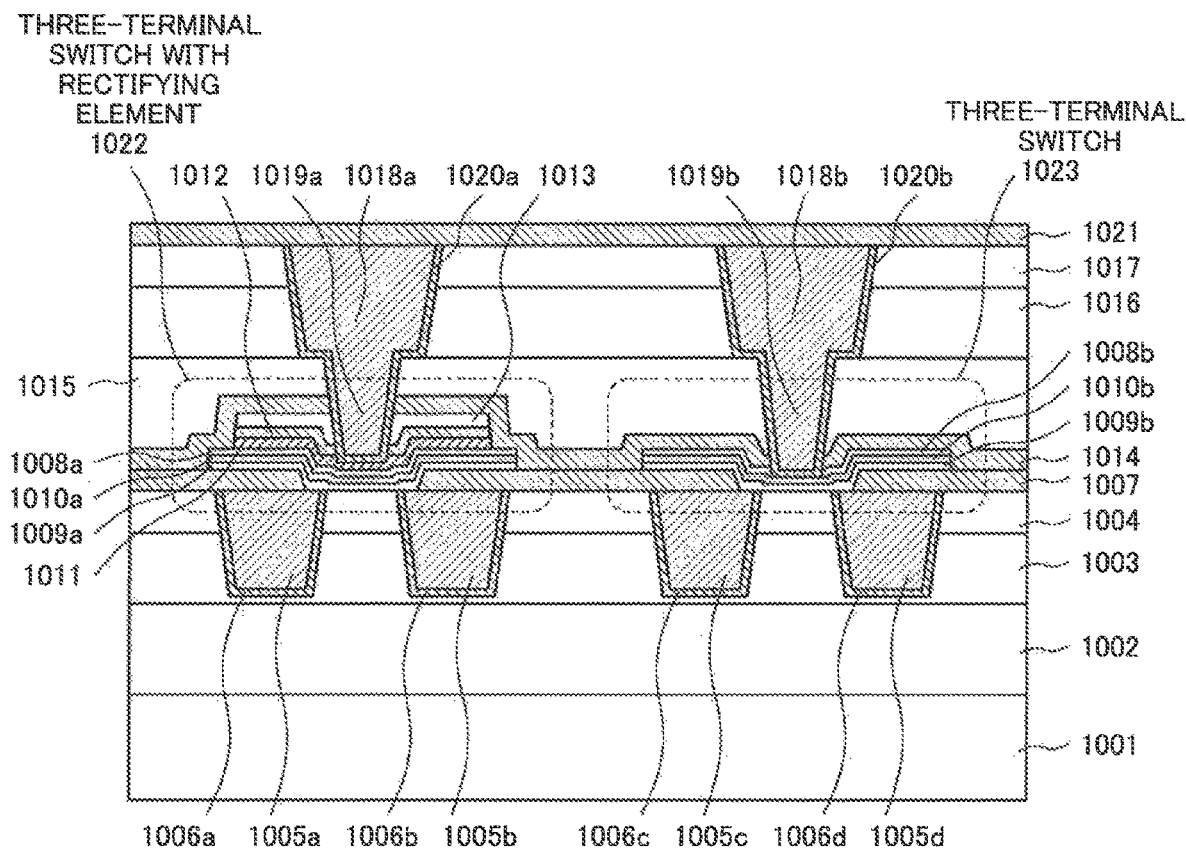
FIG. 13 is a cross-sectional schematic view illustrating a configuration example of a semiconductor device of a fifth example embodiment.

Next, a semiconductor device according to a fifth example embodiment and a method for producing the semiconductor device will be described. The present example embodiment is a semiconductor device that has "a three-terminal switch with a rectifying element and a three-terminal switch" formed within a multilayer wiring layer. FIG. 13 is a cross-sectional schematic view illustrating a configuration example of the semiconductor device of the fifth example embodiment. The present example embodiment is a semiconductor device that includes a three-terminal switch with a rectifying element and a three-terminal switch within a multilayer wiring layer and the equivalent circuit diagrams of which are illustrated in (b) of FIG. 16.

Configuration

The semiconductor device illustrated in FIG. 13 has a three-terminal switch 1022 with a rectifying element and a three-terminal switch 1023 within a multilayer wiring layer on a semiconductor substrate 1001.

The multilayer wiring layer has an insulating stacked body in which, on the semiconductor substrate 1001, an interlayer insulating film 1002, a low-k insulating film 1003, an interlayer insulating film 1004, a barrier insulating film 1007, a protection insulating film 1014, an interlayer insulating film 1015, a low-k insulating film 1016, an interlayer insulating film 1017, and a barrier insulating film 1021 are stacked in this sequence. The multilayer wiring layer has, in wiring grooves formed in the interlayer insulating film 1004 and the low-k insulating film 1003, first wirings 1005a and 1005b embedded with first barrier metals 1006a and 1006b in between, respectively. In addition, the multilayer wiring layer has, in wiring grooves formed in the interlayer insulating film 1004 and the low-k insulating film 1003, first wirings 1005c and 1005d embedded with first barrier metals 1006c and 1006d in between, respectively.

Further, the multilayer wiring layer has second wirings 1018a and 1018b embedded in wiring grooves formed in the interlayer insulating film 1017 and the low-k insulating film 1016. Furthermore, vias 1019a and 1019b are embedded in lower holes that are formed in the interlayer insulating film 1015, the protection insulating film 1014, and a first hard mask film 1012. Each of pairs of the second wiring 1018a and the via 1019a and the second wiring 1018b and the via 1019b are integrated into one body. In addition, the side surfaces and the bottom surfaces of pairs of the second wiring 1018a and the via 1019a and the second wiring 1018b and the via 1019b are covered by second barrier metals 1020a and 1020b, respectively.

In an opening section formed in the barrier insulating film 1007, on the first wirings 1005a and 1005b that serve as first electrodes, a portion of the interlayer insulating film 1004 flanked by the first wirings 1005a and 1005b, the wall surface of the opening section in the barrier insulating film 1007, and the barrier insulating film 1007, an ion conductive layer 1009a, a second electrode 1010a, a rectifying layer 1008a, and a third electrode 1011 are stacked in this sequence and the three-terminal switch 1022 with a rectifying element is thereby formed. In addition, on the third electrode 1011, the first hard mask film 1012 and a second hard mask film 1013 are formed. Further, the upper surface and the side face of a stacked body of the ion conductive layer 1009a, the second electrode 1010a, the rectifying layer 1008a, the third electrode 1011, the first hard mask film 1012, and the second hard mask film 1013 are covered by the protection insulating film 1014.

The multilayer wiring layer has, in another opening section formed in the barrier insulating film 1007, on the first wirings 1005c and 1005d that serve as first electrodes, a portion of the interlayer insulating film 1004 flanked by the first wirings 1005c and 1005d, the wall surface of the another opening section in the barrier insulating film 1007, and the barrier insulating film 1007, the three-terminal switch 1023 formed in which an ion conductive layer 1009b, a second electrode 1010b, and a rectifying layer 1008b are stacked in this sequence and the upper surface and the side face of a stacked body of the ion conductive layer 1009b and the second electrode 1010b covered by the protection insulating film 1014.

Forming portions of the first wirings 1005a and 1005b into lower electrodes of the three-terminal switch 1022 with a rectifying element and forming portions of the first wirings 1005c and 1005d into lower electrodes of the three-terminal switch 1023, while simplifying the number of process steps, enable electrode resistance to be reduced. Only generating a mask set of at least three PRs as additional process steps to a regular copper damascene wiring process enables the three-terminal switch 1022 with a rectifying element and the three-terminal switch 1023 to be provided in the same wiring layer, which enables reduction in element resistance and cost reduction to be achieved at the same time.

The three-terminal switch 1022 with a rectifying element has the ion conductive layer 1009a in direct contact with the first wirings 1005a and 1005b in regions in the opening section formed in the barrier insulating film 1007. A metal constituting a portion of the ion conductive layer 1009a diffuses into the first wirings 1005a and 1005b and thereby forms alloy layers.

The three-terminal switch 1023 has the ion conductive layer 1009b in direct contact with the first wirings 1005c and 1005d in regions in the another opening section formed in the barrier insulating film 1007. A metal constituting a portion of the ion conductive layer 1009*b* diffuses into the first wirings 1005*c* and 1005*d* and thereby forms alloy layers.

The three-terminal switch 1022 with a rectifying element has the rectifying layer 1008*a* on the second electrode 1010*a*, and the rectifying layer 1008*a* is in contact with the third electrode 1011 at the upper surface of the rectifying layer 1008*a*. On the third electrode 1011, the first hard mask film 1012 and the second hard mask film 1013 remain. The second hard mask film 1013 does not have to remain.

In the three-terminal switch 1022 with a rectifying element, the via 1019*a* and the third electrode 1011 are electrically connected to each other with the second barrier metal 1020*a* in between, on the third electrode 1011.

The three-terminal switch 1022 with a rectifying element is on/off controlled by applying voltage or flowing current between the second electrode 1010*a* and the first wiring 1005*a* or 1005*b* via the rectifying layer 1008*a*, such as being on/off controlled by use of electric field diffusion of metal ions supplied from a metal forming the first wirings 1005*a* and 1005*b* into the ion conductive layer 1009*a*. On this occasion, on-resistance is determined by current in the rectifying layer 1008*a*.

The three-terminal switch 1023 has the via 1019*b* electrically connected to the second electrode 1010*b* via the second barrier metal 1020*b* on the second electrode 1010*b*. The rectifying layer 1008*b* may remain on the second electrode 1010*b* or may be removed when etching is performed in a production process of the three-terminal switch 1023. The three-terminal switch 1023 is on/off controlled by applying voltage or flowing current, such as being on/off controlled by use of electric field diffusion of metal ions supplied from a metal forming the first wirings 1005*c* and 1005*d* into the ion conductive layer 1009*b*.

The semiconductor substrate 1001 is a substrate on which semiconductor elements are formed. For the semiconductor substrate 1001, substrates, such as a silicon substrate, a single crystal substrate, an SOI substrate, a TFT substrate, a substrate for liquid crystal production, and the like can be used.

The interlayer insulating film 1002 is an insulating film that is formed on the semiconductor substrate 1001. For the interlayer insulating film 1002, for example, a silicon oxide film, a SiOC film or the like can be used. The interlayer insulating film 1002 may be a stack of a plurality of insulating films.

For the low-k insulating film 1003, a low dielectric constant film (for example, a SiOCH film) or the like that has a lower relative dielectric constant than a silicon oxide film is used. The low-k insulating film 1003 is an insulating film that is interposed between the interlayer insulating films 1002 and 1004 and has a low dielectric constant. In the low-k insulating film 1003, wiring grooves for embedding the first wirings 1005*a*, 1005*b*, 1005*c*, and 1005*d* are formed. In the wiring grooves in the low-k insulating film 1003, the first wirings 1005*a*, 1005*b*, 1005*c*, and 1005*d* are embedded with the first barrier metals 1006*a*, 1006*b*, 1006*c*, and 1006*d* in between, respectively The interlayer insulating film 1004 is an insulating film that is formed on the low-k insulating film 1003. For the interlayer insulating film 1004, for example, a silicon oxide film, a SiOC film or the like can be used. The interlayer insulating film 1004 may be a stack of a plurality of insulating films. In the interlayer insulating film 1004, wiring grooves for embedding the first wirings 1005*a*, 1005*b*, 1005*c*, and 1005*d* are formed. In the wiring grooves in the interlayer insulating film 1004, the first wirings 1005*a*, 1005*b*, 1005*c*, and 1005*d* are embedded with the first barrier metals 1006*a*, 1006*b*, 1006*c*, and 1006*d* in between, respectively The first wirings 1005*a* and 1005*b* are wirings that are embedded in the wiring grooves formed in the interlayer insulating film 1004 and the low-k insulating film 1003 with the first barrier metals 1006*a* and 1006*b* in between, respectively. The first wirings 1005*a* and 1005*b* also serve as the lower electrodes of the three-terminal switch 1022 with a rectifying element and are in direct contact with the ion conductive layer 1009*a*. The upper surface of the ion conductive layer 1009*a* is in direct contact with the second electrode 1010*a*. As a metal constituting the first wirings 1005*a* and 1005*b*, a metal that can diffuse and be ion-conducted in the ion conductive layer 1009*a* is used and, for example, copper or the like can be used. The metal (for example, copper) constituting the first wirings 1005*a* and 1005*b* may be alloyed with aluminum.

The first wirings 1005*c* and 1005*d* are wirings that are embedded in the wiring grooves formed in the interlayer insulating film 1004 and the low-k insulating film 1003 with the first barrier metals 1006*c* and 1006*d* in between, respectively. The first wirings 1005*c* and 1005*d* also serve as the lower electrodes of the three-terminal switch 1023 and are in direct contact with the ion conductive layer 1009*b*. The upper surface of the ion conductive layer 1009*b* is in direct contact with the second electrode 1010*b*. As a metal constituting the first wirings 1005*c* and 1005*d*, a metal that can diffuse and be ion-conducted in the ion conductive layer 1009*b* is used and, for example, copper or the like can be used. The metal (for example, copper) constituting the first wirings 1005*c* and 1005*d* may be alloyed with aluminum.

The first barrier metals 1006*a*, 1006*b*, 1006*c*, and 1006*d* are conductive films having a barrier property. The first barrier metals 1006*a*, 1006*b*, 1006*c*, and 1006*d*, in order to prevent the metal forming the first wirings 1005*a*, 1005*b*, 1005*c*, and 1005*d* from diffusing into the interlayer insulating film 1004 and lower layers, covers the side surfaces and the bottom surfaces of the respective wirings. When the first wirings 1005*a*, 1005*b*, 1005*c*, and 1005*d* are constituted by metallic elements including copper as a main component, a refractory metal, a nitride thereof or the like, such as tantalum, tantalum nitride, titanium nitride, and tungsten carbonitride, or a stacked film thereof can be used for the first barrier metals 1006*a*, 1006*b*, 1006*c*, and 1006*d*.

The barrier insulating film 1007 is formed on the interlayer insulating film 1004 including the first wirings 1005*a*, 1005*b*, 1005*c*, and 1005*d*. This configuration enables the barrier insulating film 1007 to have roles of preventing the metal (for example, copper) forming the first wirings 1005*a*, 1005*b*, 1005*c*, and 1005*d* from being oxidized, preventing the metal forming the first wirings 1005*a*, 1005*b*, 1005*c*, and 1005*d* from diffusing into the interlayer insulating film 1015, and working as an etching stop layer at the time of processing the third electrode 1011, the rectifying layers 1008*a* and 1008*b*, the second electrodes 1010*a* and 1010*b*, and the ion conductive layers 1009*a* and 1009*b*. For the barrier insulating film 1007, for example, a SiC film, a silicon carbonitride film, a silicon nitride film, a stacked structure thereof, or the like can be used. The barrier insulating film 1007 is preferably made of the same material as the protection insulating film 1014 and the first hard mask film 1012.

The ion conductive layers 1009*a* and 1009*b* are films the resistance of which changes. For the ion conductive layers 1009*a* and 1009*b*, a material the resistance of which changes due to action (diffusion, ionic conduction, or the like) of metal ions generated from the metal forming the first wirings 1005a, 1005b, 1005c, and 1005d (lower electrodes) can be used. When resistance change in association with switching to an on-state is achieved through deposition of a metal by reduction of metal ions, a film capable of conducting ions is used for the ion conductive layers 1009a and 1009b.

The ion conductive layers 1009a and 1009b are respectively constituted by ion conductive layers that are made of a metal oxide and are in contact with the first wirings 1005a, 1005b, 1005c, and 1005d and ion conductive layers that are made of a polymer and are in contact with the second electrodes 1010a and 1010b.

The ion conductive layer made of a polymer in each of the ion conductive layers 1009a and 1009b is formed using a plasma-enhanced CVD method. Raw material of cyclic organosiloxane and helium, which is a carrier gas, are flowed into a reaction chamber, and, when the supply of both the cyclic organosiloxane and helium has stabilized and pressure in the reaction chamber has become constant, application of RF electric power is started. The amount of supply of the raw material is set at 10 to 200 sccm, and 500 sccm helium is supplied via a raw material vaporizer.

The ion conductive layer made of a metal oxide in each of the ion conductive layers 1009a and 1009b has a plurality of roles. One role is to prevent the metal forming the first wirings 1005a, 1005b, 1005c, and 1005d from diffusing into the ion conductive layer made of a polymer due to application of heat and plasma during deposition of the ion conductive layer made of a polymer. Another role is to prevent the first wirings 1005a, 1005b, 1005c, and 1005d from being oxidized and becoming easily accelerated to diffuse into the ion conductive layer made of a polymer. A metal, such as zirconium, hafnium, aluminum and titanium, that forms the ion conductive layer made of a metal oxide, after film formation of the metal that constitutes the ion conductive layer made of a metal oxide, is exposed to an oxygen atmosphere under reduced pressure in a film forming chamber for the ion conductive layer made of a polymer and becomes zirconium oxide, hafnium oxide, aluminum oxide, or titanium oxide, thereby becoming a portion of each of the ion conductive layers 1009a and 1009b. An optimum thickness of a metal film that forms the ion conductive layer made of a metal oxide is 0.5 to 1 nm. The metal film that is used for forming the ion conductive layer made of a metal oxide may form a stack or a single layer. Film formation of the metal film that is used for forming the ion conductive layer made of a metal oxide is preferably performed by sputtering. Metal atoms or ions having acquired energy through sputtering plunge and diffuse into the first wirings 1005a, 1005b, 1005c, and 1005d and form alloy layers.

The ion conductive layer 1009a is formed on the first wirings 1005a and 1005b, a portion of the interlayer insulating film 1004 flanked by the first wirings 1005a and 1005b, tapered surfaces formed in the opening section in the barrier insulating film 1007, and the barrier insulating film 1007.

The ion conductive layer 1009b is formed on the first wirings 1005c and 1005d, a portion of the interlayer insulating film 1004 flanked by the first wirings 1005c and 1005d, tapered surfaces formed in the another opening section in the barrier insulating film 1007, and the barrier insulating film 1007.

The second electrodes 1010a and 1010b are upper electrodes of the three-terminal switch 1022 with a rectifying element and the three-terminal switch 1023 and are in direct contact with the ion conductive layers 1009a and 1009b, respectively.

For the second electrodes 1010a and 1010b, a ruthenium alloy containing titanium, tantalum, zirconium, hafnium, aluminum or the like is used. Ruthenium is a metal that is harder to ionize than the metal forming the first wirings 1005a, 1005b, 1005c, and 1005d and is hard to diffuse and be ion-conducted in the ion conductive layers 1009a and 1009b. Titanium, tantalum, zirconium, hafnium, or aluminum that is added to a ruthenium alloy has a good adhesiveness with the metal forming the first wirings 1005a, 1005b, 1005c, and 1005d. As a first metal that constitutes the second electrodes 1010a and 1010b and is added to ruthenium, it is preferable to select a metal that has a standard Gibbs energy of formation of a process of generating metal ions from the metal (oxidation process) larger than ruthenium in the negative direction. Because of having a standard Gibbs energy of formation of a process of generating metal ions from a metal (oxidation process) larger than ruthenium in the negative direction and being more likely to spontaneously react chemically than ruthenium, titanium, tantalum, zirconium, hafnium, aluminum and the like are highly reactive. For this reason, in the ruthenium alloy that forms the second electrodes 1010a and 1010b, alloying titanium, tantalum, zirconium, hafnium, aluminum or the like with ruthenium improves adhesiveness thereof with metal cross-links formed by the metal forming the first wirings 1005a, 1005b, 1005c, and 1005d.

On the other hand, an additive metal itself like titanium, tantalum, zirconium, hafnium, aluminum or the like, not alloyed with ruthenium, becomes too highly reactive, which causes a transition to an "OFF" state not to occur. While a transition from an "ON" state to an "OFF" state proceeds through oxidation reaction (dissolution reaction) of metal cross-links, when a metal constituting the second electrodes 1010a and 1010b has a standard Gibbs energy of formation of a process of generating metal ions from the metal (oxidation process) larger, in the negative direction, than the metal forming the first wirings 1005a, 1005b, 1005c, and 1005d, the oxidation reaction of the metal constituting the second electrodes 1010a and 1010b proceeds faster than the oxidation reaction of metal cross-links formed by the metal forming the first wirings 1005a, 1005b, 1005c, and 1005d, which causes a transition to the "OFF" state not to occur.

For this reason, a metal material that is used to form the metal constituting the second electrodes 1010a and 1010b is required to be alloyed with ruthenium that has a standard Gibbs energy of formation of a process of generating metal ions from the metal (oxidation process) smaller than copper in the negative direction.

Further, when copper, which is a component of metal cross-links, mixes with the metal constituting the second electrodes 1010a and 1010b, an effect of adding a metal having a large standard Gibbs energy of formation in the negative direction is reduced. For this reason, a material having a barrier property against copper and copper ions is preferable as a metal added to ruthenium. Such materials include, for example, tantalum and titanium. On the other hand, it has been revealed that, the larger the amount of additive metal is, the more stable an "ON" state becomes, and even an addition of only 5 atm % metal improves the stability. In particular, a case of using titanium as an additive metal excels in transition to an off-state and stability of an on-state, and it is particularly preferable that an alloy of ruthenium and titanium be used as the metal constituting the second electrodes 1010a and 1010b and a content of titanium be set at a value within a range from 20 atm % to 30 atm %. A content of ruthenium in the ruthenium alloy is preferably set at a value of 60 atm % or higher and 90 atm % or lower.

For forming a ruthenium alloy, it is preferable to use a sputtering method. When an alloy is film-formed using a sputtering method, the sputtering methods include a method of using a target made of an alloy of ruthenium and the first metal, a co-sputtering method of sputtering a ruthenium target and a first metal target in the same chamber at the same time, and an intermixing method in which a thin film of the first metal is formed in advance, ruthenium is film-formed on the thin film by a sputtering method, and the first metal and the ruthenium are alloyed with energy of colliding atoms. Use of the co-sputtering method and the intermixing method enables composition of an alloy to be altered. When the intermixing method is employed, it is preferable that, after ruthenium film formation has been finished, heat treatment at a temperature of 400° C. or lower be performed for "planarization" of the mixed state of metals.

The second electrodes 1010a and 1010b preferably have a two-layer structure. When the sides of the second electrodes 1010a and 1010b in contact with the ion conductive layers 1009a and 1009b are made of a ruthenium alloy, the sides of the second electrodes 1010a and 1010b in contact with the rectifying layers 1008a and 1008b serve as lower electrodes of the rectifying elements. As a metal species, a metal nitride, such as titanium nitride and tantalum nitride, that is difficult to be oxidized, easy to process, and the work function of which is adjustable by adjusting composition thereof can be used.

Titanium and tantalum may also be used as long as being able to inhibit oxidation at boundary faces of the second electrodes 1010a and 1010b with the rectifying layers 1008a and 1008b. Titanium nitride, tantalum nitride, titanium, or tantalum is film-formed on the ruthenium alloy layer by a sputtering method in a continuous vacuum process. When titanium or tantalum is nitrided, the nitride is film-formed by introducing nitrogen into a chamber and using a reactive sputtering method.

The rectifying layers 1008a and 1008b are layers that have a bipolar rectification effect and have a characteristic in which current increases in a non-linear manner with respect to applied voltage. A Poole-Frenkel type insulating film, a Schottky type insulating film, a threshold switching type volatile variable-resistance film, or the like can be used as the rectifying layers 1008a and 1008b. For example, a film containing any of titanium oxide, tungsten oxide, molybdenum oxide, hafnium oxide, aluminum oxide, zircon oxide, yttrium oxide, manganese oxide, niobium oxide, silicon nitride, silicon carbonitride, silicon oxide, and amorphous silicon can be used as the rectifying layers 1008a and 1008b. In particular, constituting a stack by stacking amorphous silicon, silicon nitride, and amorphous silicon in this sequence enables excellent non-linearity to be generated. By, by means of interposing a silicon nitride film between amorphous silicon films, causing composition of a portion of the silicon nitride film to be brought to a state in which nitrogen is deficient from the stoichiometric ratio and thereby reducing differences in barrier heights with the second electrode 1010a and the third electrode 1011, it is possible to facilitate tunneling current to flow to the silicon nitride at the time of high voltage application. As a result, a non-linear current change is generated.

The third electrode 1011 is a metal that serves as an upper electrode of the rectifying element, and, for example, tantalum, titanium, tungsten, a nitride thereof, or the like can be used for the third electrode 1011. In order to make current-voltage characteristics of the rectifying element symmetrical in both positive and negative sides, it is preferable to use the same material as that of the second electrode 1010a for the third electrode 1011. The third electrode 1011 also has a function as an etching stop layer when the via 1019a is electrically connected onto the second electrode 1010a. Thus, it is preferable that the third electrode 1011 have a low etching rate for plasma of a fluorocarbon-based gas that is used in etching of the interlayer insulating film 1015. For forming the third electrode 1011, it is preferable to use a sputtering method. When a metal nitride is film-formed using a sputtering method, it is preferable to use a reactive sputtering method in which a metal target is vaporized using plasma of a gas mixture of nitrogen and argon. A metal vaporized from the metal target reacts with nitrogen and forms a metal nitride, which is film-formed on a substrate.

The third electrode 1011 is present only on the three-terminal switch 1022 with a rectifying element in which a rectifying element is formed and is not present on the three-terminal switch 1023.

The first hard mask film 1012 is a film that serves as a hard mask film and a passivation film when the third electrode 1011, the second electrodes 1010a and 1010b, the rectifying layers 1008a and 1008b, and the ion conductive layers 1009a and 1009b are etched. For the first hard mask film 1012, for example, a silicon nitride film, a silicon oxide film or the like, or a stack thereof can be used. The first hard mask film 1012 preferably includes the same material as the protection insulating film 1014 and the barrier insulating film 1007.

The second hard mask film 1013 is a film that serves as a hard mask film when the third electrode 1011, the second electrodes 1010a and 1010b, the rectifying layers 1008a and 1008b, and the ion conductive layers 1009a and 1009b are etched. For the second hard mask film 1013, for example, a silicon nitride film, a silicon oxide film or the like, or a stack thereof can be used.

Based on a shape of the second hard mask film 1013, the three-terminal switch 1022 with a rectifying element and the three-terminal switch 1023 are formed differently from each other. On the barrier insulating film 1007 of the three-terminal switch 1022 with a rectifying element and the three-terminal switch 1023, the ion conductive layers 1009a and 1009b, the second electrodes 1010a and 1010b, the rectifying layers 1008a and 1008b, the third electrode 1011, the first hard mask film 1012, and the second hard mask film 1013 are film-formed. Subsequently, in a manner in which a shape of the second hard mask film 1013, formed through two rounds of patterning and etching, is transferred onto the three-terminal switch 1022 with a rectifying element, one rectifying element is formed on the second electrode 1010a.

That is, a stacked structure for the three-terminal switch 1022 with a rectifying element is film-formed once on the whole wafer, and, on an element portion to which the three-terminal switch 1023 is to be formed, patterning for forming a rectifying element portion in the three-terminal switch 1022 with a rectifying element is configured not to be performed (a resist is configured not to be left). This configuration causes thickness of a portion of the second hard mask film 1013 on the three-terminal switch 1023 to be reduced. Subsequently, performing etching enables a portion of the third electrode 1011 on the three-terminal switch 1023 to be removed. That is, an area on the three-terminal switch 1023 is brought into the same condition as an area on the three-terminal switch 1022 with a rectifying element except an area under which the rectifying element is formed. The rectifying layer 1008b may or does not have to remain on the second electrode 1010a of the three-terminal switch 1023. In addition, the first hard mask film 1012 and the second hard mask film 1013 do not remain on the three-terminal switch 1023.

The protection insulating film 1014 is an insulating film that has functions of preventing the three-terminal switch 1022 with a rectifying element and the three-terminal switch 1023 from being damaged and further preventing desorption of oxygen from the ion conductive layers 1009a and 1009b. For the protection insulating film 1014, for example, a silicon nitride film, a silicon carbonitride film or the like can be used. The protection insulating film 1014 is preferably made of the same material as the first hard mask film 1012 and the barrier insulating film 1007. In the case of being made of the same material, the protection insulating film 1014 is integrated into one body with the barrier insulating film 1007 and the first hard mask film 1012 and adhesiveness of boundary faces thereamong is thereby improved, which enables the three-terminal switch 1022 with a rectifying element and the three-terminal switch 1023 to be protected more securely.

The interlayer insulating film 1015 is an insulating film that is formed on the protection insulating film 1014. For the interlayer insulating film 1015, for example, a silicon oxide film, a SiOC film or the like can be used. The interlayer insulating film 1015 may be a stack of a plurality of insulating films. The interlayer insulating film 1015 may be made of the same material as the interlayer insulating film 1017. In the interlayer insulating film 1015, lower holes for embedding the vias 1019a and 1019b are formed, and, in the lower holes, the vias 1019a and 1019b are embedded with the second barrier metals 1020a and 1020b in between, respectively.

For the low-k insulating film 1016, a low dielectric constant film (for example, a SiOCH film) or the like that has a lower relative dielectric constant than a silicon oxide film is used. The low-k insulating film 1016 is an insulating film that is interposed between the interlayer insulating films 1015 and 1017 and has a low dielectric constant. In the low-k insulating film 1016, wiring grooves for embedding the second wirings 1018a and 1018b are formed. In the wiring grooves in the low-k insulating film 1016, the second wirings 1018a and 1018b are embedded with the second barrier metals 1020a and 1020b in between, respectively.

The interlayer insulating film 1017 is an insulating film that is formed on the low-k insulating film 1016. For the interlayer insulating film 1017, for example, a silicon oxide film, a SiOC film, a low dielectric constant film (for example, a SiOCH film) that has a lower relative dielectric constant than a silicon oxide film, or the like can be used. The interlayer insulating film 1017 may be a stack of a plurality of insulating films. The interlayer insulating film 1017 may be made of the same material as the interlayer insulating film 1015. In the interlayer insulating film 1017, wiring grooves for embedding the second wirings 1018a and 1018b are formed. In the wiring grooves in the interlayer insulating film 1017, the second wirings 1018a and 1018b are embedded with the second barrier metals 1020a and 1020b in between, respectively.

The second wirings 1018a and 1018b are wirings that are embedded in the wiring grooves formed in the interlayer insulating film 1017 and the low-k insulating film 1016 with the second barrier metals 1020a and 1020b in between, respectively. The second wirings 1018a and 1018b are integrated into one body with the vias 1019a and 1019b, respectively.

The via 1019a is embedded in the lower hole formed in the interlayer insulating film 1015, the protection insulating film 1014, the first hard mask film 1012, and the second hard mask film 1013 with the second barrier metal 1020a in between. The via 1019b is embedded in the lower hole formed in the interlayer insulating film 1015 and the protection insulating film 1014 with the second barrier metal 1020b in between.

The via 1019a is electrically connected to the third electrode 1011 with the second barrier metal 1020a in between. The via 1019b is electrically connected to the second electrode 1010b with the second barrier metal 1020b in between. For the second wirings 1018a and 1018b and the vias 1019a and 1019b, for example, copper can be used.

The second barrier metals 1020a and 1020b are conductive films that cover the side surfaces and the bottom surfaces of the second wirings 1018a and 1018b and the vias 1019a and 1019b, respectively and have a barrier property. The second barrier metals 1020a and 1020b prevent a metal forming the second wirings 1018a and 1018b (including the vias 1019a and 1019b) from diffusing into the interlayer insulating films 1015 and 1017 and lower layers.

For example, when the second wirings 1018a and 1018b and the vias 1019a and 1019b are constituted by metallic elements including copper as a main component, a refractory metal, a nitride thereof or the like, such as tantalum, tantalum nitride, titanium nitride, and tungsten carbonitride, or a stacked film thereof can be used for the second barrier metals 1020a and 1020b.

The barrier insulating film 1021 is an insulating film that is formed on the interlayer insulating film 1017 including the second wirings 1018a and 1018b. The barrier insulating film 1021 has roles of preventing the metal (for example, copper) forming the second wirings 1018a and 1018b from being oxidized and preventing the metal forming the second wirings 1018a and 1018b from diffusing into upper layers. For the barrier insulating film 1021, for example, a silicon carbonitride film, a silicon nitride film, a stacked structure thereof, or the like can be used.

Advantageous Effect of Example Embodiment

According to the present example embodiment, it is possible to achieve a semiconductor device including the three-terminal switch 1022 with a rectifying element including one rectifying element and the three-terminal switch 1023 provided with no rectifying element in the same wiring in a multilayer wiring structure. In the present example embodiment, it is possible to form the three-terminal switch 1022 with a rectifying element including one rectifying element and the three-terminal switch 1023 in the same wiring layer at the same time.

Sixth Example Embodiment

Figure 14:
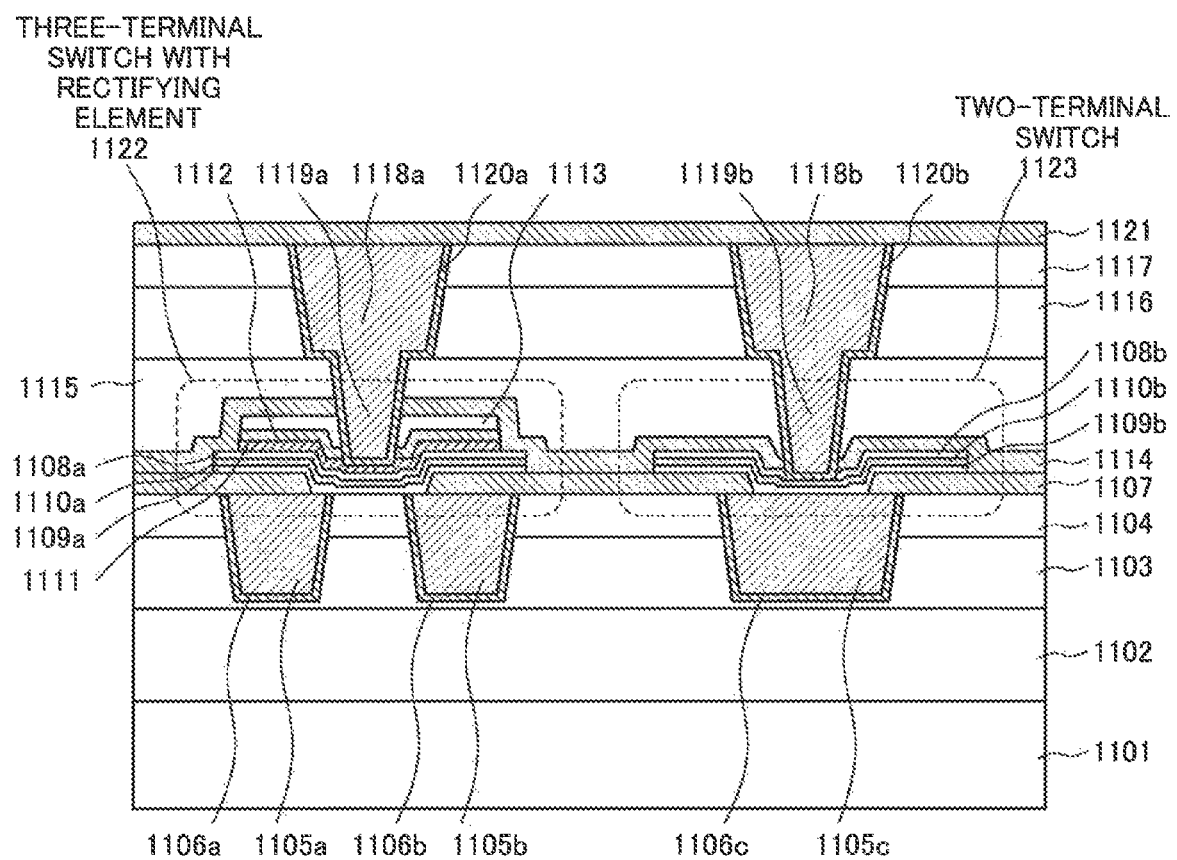
FIG. 14 is a cross-sectional schematic view illustrating a configuration example of a semiconductor device of a sixth example embodiment.

Next, a semiconductor device according to a sixth example embodiment and a method for producing the semiconductor device will be described. The present example embodiment is a semiconductor device that has "a three-terminal switch with a rectifying element and a two-terminal switch" formed within a multilayer wiring layer. FIG. 14 is a cross-sectional schematic view illustrating a configuration example of the semiconductor device of the sixth example embodiment. The present example embodiment is a semiconductor device that includes a three-terminal switch with a rectifying element and a two-terminal switch within a multilayer wiring layer and the equivalent circuit diagrams of which are illustrated in (c) of FIG. 16.

Configuration

The semiconductor device illustrated in FIG. 14 has a three-terminal switch 1122 with a rectifying element and a two-terminal switch 1123 within a multilayer wiring layer on a semiconductor substrate 1101.

The multilayer wiring layer has an insulating stacked body in which, on the semiconductor substrate 1101, an interlayer insulating film 1102, a low-k insulating film 1103, an interlayer insulating film 1104, a barrier insulating film 1107, a protection insulating film 1114, an interlayer insulating film 1115, a low-k insulating film 1116, an interlayer insulating film 1117, and a barrier insulating film 1121 are stacked in this sequence. The multilayer wiring layer has, in wiring grooves formed in the interlayer insulating film 1104 and the low-k insulating film 1103, first wirings 1105a and 1105b embedded with first barrier metals 1106a and 1106b in between, respectively. In addition, the multilayer wiring layer has, in a wiring groove formed in the interlayer insulating film 1104 and the low-k insulating film 1103, a first wiring 1105c embedded with a first barrier metal 1106c in between.

Further, the multilayer wiring layer has second wirings 1118a and 1118b embedded in wiring grooves formed in the interlayer insulating film 1117 and the low-k insulating film 1116. Furthermore, vias 1119a and 1119b are embedded in lower holes that are formed in the interlayer insulating film 1115, the protection insulating film 1114, and a first hard mask film 1112. Each of pairs of the second wiring 1118a and the via 1119a and the second wiring 1118b and the via 1119b are integrated into one body. In addition, the side surfaces and the bottom surfaces of pairs of the second wiring 1118a and the via 1119a and the second wiring 1118b and the via 1119b are covered by second barrier metals 1120a and 1120b, respectively.

In an opening section formed in the barrier insulating film 1107, on the first wirings 1105a and 1105b that serve as first electrodes, a portion of the interlayer insulating film 1104 flanked by the first wirings 1105a and 1105b, the wall surface of the opening section in the barrier insulating film 1107, and the barrier insulating film 1107, an ion conductive layer 1109a, a second electrode 1110a, a rectifying layer 1108a, and a third electrode 1111 are stacked in this sequence and the three-terminal switch 1122 with a rectifying element is thereby formed. In addition, on the third electrode 1111, the first hard mask film 1112 and a second hard mask film 1113 are formed. Further, the upper surface and the side face of a stacked body of the ion conductive layer 1109a, the second electrode 1110a, the rectifying layer 1108a, the third electrode 1111, the first hard mask film 1112, and the second hard mask film 1113 are covered by the protection insulating film 1114.

The multilayer wiring layer has, in another opening section formed in the barrier insulating film 1107, over the first wiring 1105c that serves as a first electrode, the wall surface of the another opening section in the barrier insulating film 1107, and the barrier insulating film 1107, the two-terminal switch 1123 formed in which an ion conductive layer 1109b, a second electrode 1110b, and a rectifying layer 1108b are stacked in this sequence and the upper surface and the side face of a stacked body of the ion conductive layer 1109b and the second electrode 1110b covered by the protection insulating film 1114.

Forming portions of the first wirings 1105a and 1105b into lower electrodes of the three-terminal switch 1122 with a rectifying element and forming a portion of the first wiring 1105c into a lower electrode of the two-terminal switch 1123, while simplifying the number of process steps, enable electrode resistance to be reduced. Only generating a mask set of at least three PRs as additional process steps to a regular copper damascene wiring process enables the three-terminal switch 1122 with a rectifying element and the two-terminal switch 1123 to be provided in the same wiring layer, which enables reduction in element resistance and cost reduction to be achieved at the same time.

The three-terminal switch 1122 with a rectifying element has the ion conductive layer 1109a in direct contact with the first wirings 1105a and 1105b in regions in the opening section formed in the barrier insulating film 1107. A metal constituting a portion of the ion conductive layer 1109a diffuses into the first wirings 1105a and 1105b and thereby forms alloy layers.

The two-terminal switch 1123 has the ion conductive layer 1109b in direct contact with the first wiring 1105c in a region in the another opening section formed in the barrier insulating film 1107. A metal constituting a portion of the ion conductive layer 1109b diffuses into the first wiring 1105c and thereby forms an alloy layer.

The three-terminal switch 1122 with a rectifying element has the rectifying layer 1108a on the second electrode 1110a, and the rectifying layer 1108a is in contact with the third electrode 1111 at the upper surface of the rectifying layer 1108a. On the third electrode 1111, the first hard mask film 1112 and the second hard mask film 1113 remain. The second hard mask film 1113 does not have to remain.

In the three-terminal switch 1122 with a rectifying element, the via 1119a and the third electrode 1111 are electrically connected to each other with the second barrier metal 1120a in between, on the third electrode 1111.

The three-terminal switch 1122 with a rectifying element is on/off controlled by applying voltage or flowing current between the second electrode 1110a and the first wiring 1105a or 1105b via the rectifying layer 1108a, such as being on/off controlled by use of electric field diffusion of metal ions supplied from a metal forming the first wirings 1105a and 1105b into the ion conductive layer 1109a. On this occasion, on-resistance is determined by current in the rectifying layer 1108a.

The two-terminal switch 1123 has the via 1119b electrically connected to the second electrode 1110b via the second barrier metal 1120b on the second electrode 1110b. The rectifying layer 1108b may remain on the second electrode 1110b or may be removed when etching is performed in a production process of the two-terminal switch 1123. The two-terminal switch 1123 is on/off controlled by applying voltage or flowing current, such as being on/off controlled by use of electric field diffusion of metal ions supplied from a metal forming the first wiring 1105c into the ion conductive layer 1109b.

The semiconductor substrate 1101 is a substrate on which semiconductor elements are formed. For the semiconductor substrate 1101, substrates, such as a silicon substrate, a single crystal substrate, an SOI substrate, a TFT substrate, a substrate for liquid crystal production, and the like can be used.

The interlayer insulating film 1102 is an insulating film that is formed on the semiconductor substrate 1101. For the interlayer insulating film 1102, for example, a silicon oxide film, a SiOC film or the like can be used. The interlayer insulating film 1102 may be a stack of a plurality of insulating films.

For the low-k insulating film 1103, a low dielectric constant film (for example, a SiOCH film) or the like that has a lower relative dielectric constant than a silicon oxide film is used. The low-k insulating film 1103 is an insulating film that is interposed between the interlayer insulating films 1102 and 1104 and has a low dielectric constant. In the low-k insulating film 1103, wiring grooves for embedding the first wirings 1105*a*, 1105*b*, and 1105*c* are formed. In the wiring grooves in the low-k insulating film 1103, the first wirings 1105*a*, 1105*b*, and 1105*c* are embedded with the first barrier metals 1106*a*, 1106*b*, and 1106*c* in between, respectively The interlayer insulating film 1104 is an insulating film that is formed on the low-k insulating film 1103. For the interlayer insulating film 1104, for example, a silicon oxide film, a SiOC film or the like can be used. The interlayer insulating film 1104 may be a stack of a plurality of insulating films. In the interlayer insulating film 1104, wiring grooves for embedding the first wirings 1105*a*, 1105*b*, and 1105*c* are formed. In the wiring grooves in the interlayer insulating film 1104, the first wirings 1105*a*, 1105*b*, and 1105*c* are embedded with the first barrier metals 1106*a*, 1106*b*, and 1106*c* in between, respectively The first wirings 1105*a* and 1105*b* are wirings that are embedded in the wiring grooves formed in the interlayer insulating film 1104 and the low-k insulating film 1103 with the first barrier metals 1106*a* and 1106*b* in between, respectively. The first wirings 1105*a* and 1105*b* also serve as the lower electrodes of the three-terminal switch 1122 with a rectifying element and are in direct contact with the ion conductive layer 1109*a*. The upper surface of the ion conductive layer 1109*a* is in direct contact with the second electrode 1110*a*. As a metal constituting the first wirings 1105*a* and 1105*b*, a metal that can diffuse and be ion-conducted in the ion conductive layer 1109*a* is used and, for example, copper or the like can be used. The metal (for example, copper) constituting the first wirings 1105*a* and 1105*b* may be alloyed with aluminum.

The first wiring 1105*c* is a wiring that is embedded in the wiring groove formed in the interlayer insulating film 1104 and the low-k insulating film 1103 with the first barrier metal 1106*c* in between. The first wiring 1105*c* also serves as the lower electrode of the two-terminal switch 1123 and is in direct contact with the ion conductive layer 1109*b*. The upper surface of the ion conductive layer 1109*b* is in direct contact with the second electrode 1110*b*. As a metal constituting the first wiring 1105*c*, a metal that can diffuse and be ion-conducted in the ion conductive layer 1109*b* is used and, for example, copper or the like can be used. The metal (for example, copper) constituting the first wiring 1105*c* may be alloyed with aluminum.

The first barrier metals 1106*a*, 1106*b*, and 1106*c* are conductive films having a barrier property. The first barrier metals 1106*a*, 1106*b*, and 1106*c*, in order to prevent the metal forming the first wirings 1105*a*, 1105*b*, and 1105*c* from diffusing into the interlayer insulating film 1104 and lower layers, covers the side surfaces and the bottom surfaces of the respective wirings. When the first wirings 1105*a*, 1105*b*, and 1105*c* are constituted by metallic elements including copper as a main component, a refractory metal, a nitride thereof or the like, such as tantalum, tantalum nitride, titanium nitride and tungsten carbonitride, or a stacked film thereof can be used for the first barrier metals 1106*a*, 1106*b*, and 1106*c*.

The barrier insulating film 1107 is formed on the interlayer insulating film 1104 including the first wirings 1105*a*, 1105*b*, and 1105*c*. This configuration enables the barrier insulating film 1107 to have roles of preventing the metal (for example, copper) forming the first wirings 1105*a*, 1105*b*, and 1105*c* from being oxidized, preventing the metal forming the first wirings 1105*a*, 1105*b*, and 1105*c* from diffusing into the interlayer insulating film 1115, and working as an etching stop layer at the time of processing the third electrode 1111, the rectifying layers 1108*a* and 1108*b*, the second electrodes 1110*a* and 1110*b*, and the ion conductive layers 1109*a* and 1109*b*. For the barrier insulating film 1107, for example, a SiC film, a silicon carbonitride film, a silicon nitride film, a stacked structure thereof, or the like can be used. The barrier insulating film 1107 is preferably made of the same material as the protection insulating film 1114 and the first hard mask film 1112.

The ion conductive layers 1109*a* and 1109*b* are films the resistance of which changes. For the ion conductive layers 1109*a* and 1109*b*, a material the resistance of which changes due to action (diffusion, ionic conduction, or the like) of metal ions generated from the metal forming the first wirings 1105*a*, 1105*b*, and 1105*c* (lower electrodes) can be used. When resistance change in association with switching to an on-state is achieved through deposition of a metal by reduction of metal ions, a film capable of conducting ions is used for the ion conductive layers 1109*a* and 1109*b*.

The ion conductive layers 1109*a* and 1109*b* are respectively constituted by ion conductive layers that are made of a metal oxide and are in contact with the first wirings 1105*a*, 1105*b*, and 1105*c* and ion conductive layers that are made of a polymer and are in contact with the second electrodes 1110*a* and 1110*b*.

The ion conductive layer made of a polymer in each of the ion conductive layers 1109*a* and 1109*b* is formed using a plasma-enhanced CVD method. Raw material of cyclic organosiloxane and helium, which is a carrier gas, are flowed into a reaction chamber, and, when the supply of both the cyclic organosiloxane and helium has stabilized and pressure in the reaction chamber has become constant, application of RF electric power is started. The amount of supply of the raw material is set at 10 to 200 sccm, and 500 sccm helium is supplied via a raw material vaporizer.

The ion conductive layer made of a metal oxide in each of the ion conductive layers 1109*a* and 1109*b* has a plurality of roles. One role is to prevent the metal forming the first wirings 1105*a*, 1105*b*, and 1105*c* from diffusing into the ion conductive layer made of a polymer due to application of heat and plasma during deposition of the ion conductive layer made of a polymer. Another role is to prevent the first wirings 1105*a*, 1105*b*, and 1105*c* from being oxidized and becoming easily accelerated to diffuse into the ion conductive layer made of a polymer. A metal, such as zirconium, hafnium, aluminum and titanium, that forms the ion conductive layer made of a metal oxide, after film formation of the metal that constitutes the ion conductive layer made of a metal oxide, is exposed to an oxygen atmosphere under reduced pressure in a film forming chamber for the ion conductive layer made of a polymer and becomes zirconium oxide, hafnium oxide, aluminum oxide, or titanium oxide, thereby becoming a portion of each of the ion conductive layers 1109*a* and 1109*b*. An optimum thickness of a metal film that forms the ion conductive layer made of a metal oxide is 0.5 to 1 nm. The metal film that is used for forming the ion conductive layer made of a metal oxide may form a stack or a single layer. Film formation of the metal film that is used for forming the ion conductive layer made of a metal oxide is preferably performed by sputtering. Metal atoms or ions having acquired energy through sputtering plunge and diffuse into the first wirings 1105a, 1105b, and 1105c and form alloy layers.

The ion conductive layer 1109a is formed on the first wirings 1105a and 1105b, a portion of the interlayer insulating film 1104 flanked by the first wirings 1105a and 1105b, tapered surfaces formed in the opening section in the barrier insulating film 1107, and the barrier insulating film 1107.

The ion conductive layer 1109b is formed on the first wiring 1105c, tapered surfaces formed in the another opening section in the barrier insulating film 1107, and the barrier insulating film 1107.

The second electrodes 1110a and 1110b are upper electrodes of the three-terminal switch 1122 with a rectifying element and the two-terminal switch 1123 and are in direct contact with the ion conductive layers 1109a and 1109b, respectively.

For the second electrodes 1110a and 1110b, a ruthenium alloy containing titanium, tantalum, zirconium, hafnium, aluminum or the like is used. Ruthenium is a metal that is harder to ionize than the metal forming the first wirings 1105a, 1105b, and 1105c and is hard to diffuse and be ion-conducted in the ion conductive layers 1109a and 1109b. Titanium, tantalum, zirconium, hafnium, or aluminum that is added to a ruthenium alloy has a good adhesiveness with the metal forming the first wirings 1105a, 1105b, and 1105c. As a first metal that constitutes the second electrodes 1110a and 1110b and is added to ruthenium, it is preferable to select a metal that has a standard Gibbs energy of formation of a process of generating metal ions from the metal (oxidation process) larger than ruthenium in the negative direction. Because of having a standard Gibbs energy of formation of a process of generating metal ions from a metal (oxidation process) larger than ruthenium in the negative direction and being more likely to spontaneously react chemically than ruthenium, titanium, tantalum, zirconium, hafnium, aluminum or the like are highly reactive. For this reason, in the ruthenium alloy that forms the second electrodes 1110a and 1110b, alloying titanium, tantalum, zirconium, hafnium, aluminum or the like with ruthenium improves adhesiveness thereof with metal cross-links formed by the metal forming the first wirings 1105a, 1105b, and 1105c.

On the other hand, an additive metal itself like titanium, tantalum, zirconium, hafnium, aluminum or the like, not alloyed with ruthenium, becomes too highly reactive, which causes a transition to an "OFF" state not to occur. While a transition from an "ON" state to an "OFF" state proceeds through oxidation reaction (dissolution reaction) of metal cross-links, when a metal constituting the second electrodes 1110a and 1110b has a standard Gibbs energy of formation of a process of generating metal ions from the metal (oxidation process) larger, in the negative direction, than the metal forming the first wirings 1105a, 1105b, and 1105c, the oxidation reaction of the metal constituting the second electrodes 1110a and 1110b proceeds faster than the oxidation reaction of metal cross-links formed by the metal forming the first wirings 1105a, 1105b, and 1105c, which causes a transition to the "OFF" state not to occur.

For this reason, a metal material that is used to form the metal constituting the second electrodes 1110a and 1110b is required to be alloyed with ruthenium that has a standard Gibbs energy of formation of a process of generating metal ions from the metal (oxidation process) smaller than copper in the negative direction.

Further, when copper, which is a component of metal cross-links, mixes with the metal constituting the second electrodes 1110a and 1110b, an effect of adding a metal having a large standard Gibbs energy of formation in the negative direction is reduced. For this reason, a material having a barrier property against copper and copper ions is preferable as a metal added to ruthenium. Such materials include, for example, tantalum and titanium. On the other hand, it has been revealed that, the larger the amount of additive metal is, the more stable an "ON" state becomes, and even an addition of only 5 atm % metal improves the stability. In particular, a case of using titanium as an additive metal excels in transition to an off-state and stability of an on-state, and it is particularly preferable that an alloy of ruthenium and titanium be used as the metal constituting the second electrodes 1110a and 1110b and a content of titanium be set at a value within a range from 20 atm % to 30 atm %. A content of ruthenium in the ruthenium alloy is preferably set at a value of 60 atm % or higher and 90 atm % or lower.

For forming a ruthenium alloy, it is preferable to use a sputtering method. When an alloy is film-formed using a sputtering method, the sputtering methods include a method of using a target made of an alloy of ruthenium and the first metal, a co-sputtering method of sputtering a ruthenium target and a first metal target in the same chamber at the same time, and an intermixing method in which a thin film of the first metal is formed in advance, ruthenium is film-formed on the thin film by a sputtering method, and the first metal and the ruthenium are alloyed with energy of colliding atoms. Use of the co-sputtering method and the intermixing method enables composition of an alloy to be altered. When the intermixing method is employed, it is preferable that, after ruthenium film formation has been finished, heat treatment at a temperature of 400° C. or lower be performed for "planarization" of the mixed state of metals.

The second electrodes 1110a and 1110b preferably have a two-layer structure. When the sides of the second electrodes 1110a and 1110b in contact with the ion conductive layers 1109a and 1109b are made of a ruthenium alloy, the sides of the second electrodes 1110a and 1110b in contact with the rectifying layers 1108a and 1108b serve as lower electrodes of the rectifying elements. As a metal species, a metal nitride, such as titanium nitride and tantalum nitride, that is difficult to be oxidized, easy to process, and the work function of which is adjustable by adjusting composition thereof can be used.

Titanium and tantalum may also be used as long as being able to inhibit oxidation at boundary faces of the second electrodes 1110a and 1110b with the rectifying layers 1108a and 1108b. Titanium nitride, tantalum nitride, titanium, or tantalum is film-formed on the ruthenium alloy layer by a sputtering method in a continuous vacuum process. When titanium or tantalum is nitrided, the nitride is film-formed by introducing nitrogen into a chamber and using a reactive sputtering method.

The rectifying layers 1108a and 1108b are layers that have a bipolar rectification effect and have a characteristic in which current increases in a non-linear manner with respect to applied voltage. A Poole-Frenkel type insulating film, a Schottky type insulating film, a threshold switching type volatile variable-resistance film, or the like can be used as the rectifying layers 1108a and 1108b. For example, a film containing any of titanium oxide, tungsten oxide, molybdenum oxide, hafnium oxide, aluminum oxide, zircon oxide, yttrium oxide, manganese oxide, niobium oxide, silicon nitride, silicon carbonitride, silicon oxide, and amorphous silicon can be used as the rectifying layers 1108a and 1108b.

In particular, constituting a stack by stacking amorphous silicon, silicon nitride, and amorphous silicon in this sequence enables excellent non-linearity to be generated. By, by means of interposing a silicon nitride film between amorphous silicon films, causing composition of a portion of the silicon nitride film to be brought to a state in which nitrogen is deficient from the stoichiometric ratio and thereby reducing differences in barrier heights with the second electrode 1110a and the third electrode 1111, it is possible to facilitate tunneling current to flow to the silicon nitride at the time of high voltage application. As a result, a non-linear current change is generated.

The third electrode 1111 is a metal that serves as an upper electrode of the rectifying element, and, for example, tantalum, titanium, tungsten, a nitride thereof, or the like can be used for the third electrode 1111. In order to make current-voltage characteristics of the rectifying elements symmetrical in both positive and negative sides, it is preferable to use the same material as those of the second electrodes 1110a and 1110b for the third electrode 1111. The third electrode 1111 also has a function as an etching stop layer when the via 1119a is electrically connected onto the second electrode 1110a. Thus, it is preferable that the third electrode 1111 have a low etching rate for plasma of a fluorocarbon-based gas that is used in etching of the interlayer insulating film 1115. For forming the third electrode 1111, it is preferable to use a sputtering method. When a metal nitride is film-formed using a sputtering method, it is preferable to use a reactive sputtering method in which a metal target is vaporized using plasma of a gas mixture of nitrogen and argon. A metal vaporized from the metal target reacts with nitrogen and forms a metal nitride, which is film-formed on a substrate.

The third electrode 1111 is present only on the three-terminal switch 1122 with a rectifying element in which a rectifying element is formed and is not present on the two-terminal switch 1123.

The first hard mask film 1112 is a film that serves as a hard mask film and a passivation film when the third electrode 1111, the second electrodes 1110a and 1110b, the rectifying layers 1108a and 1108b, and the ion conductive layers 1109a and 1109b are etched. For the first hard mask film 1112, for example, a silicon nitride film, a silicon oxide film or the like, or a stack thereof can be used. The first hard mask film 1112 preferably includes the same material as the protection insulating film 1114 and the barrier insulating film 1107.

The second hard mask film 1113 is a film that serves as a hard mask film when the third electrode 1111, the second electrodes 1110a and 1110b, the rectifying layers 1108a and 1108b, and the ion conductive layers 1109a and 1109b are etched. For the second hard mask film 1113, for example, a silicon nitride film, a silicon oxide film or the like, or a stack thereof can be used.

Based on a shape of the second hard mask film 1113, the three-terminal switch 1122 with a rectifying element and the two-terminal switch 1123 are formed differently from each other. On the barrier insulating film 1107 of the three-terminal switch 1122 with a rectifying element and the two-terminal switch 1123, the ion conductive layers 1109a and 1109b, the second electrodes 1110a and 1110b, the rectifying layers 1108a and 1108b, the third electrode 1111, the first hard mask film 1112, and the second hard mask film 1113 are film-formed. Subsequently, in a manner in which a shape of the second hard mask film 1113, formed through two rounds of patterning and etching, is transferred onto the three-terminal switch 1122 with a rectifying element, one rectifying element is formed on the second electrode 1110a.

That is, a stacked structure for the three-terminal switch 1122 with a rectifying element is film-formed once on the whole wafer, and, on an element portion to which the two-terminal switch 1123 is to be formed, patterning for forming a rectifying element portion in the three-terminal switch 1122 with a rectifying element is configured not to be performed (a resist is configured not to be left). This configuration causes thickness of a portion of the second hard mask film 1113 on the two-terminal switch 1123 to be reduced. Subsequently, performing etching enables a portion of the third electrode 1111 on the two-terminal switch 1123 to be removed. That is, an area on the two-terminal switch 1123 is brought into the same condition as an area on the three-terminal switch 1122 with a rectifying element except an area under which the rectifying element is formed. The rectifying layer 1108b may or does not have to remain on the second electrode 1110a of the two-terminal switch 1123. In addition, the first hard mask film 1112 and the second hard mask film 1113 do not remain on the two-terminal switch 1123.

The protection insulating film 1114 is an insulating film that has functions of preventing the three-terminal switch 1122 with a rectifying element and the two-terminal switch 1123 from being damaged and further preventing desorption of oxygen from the ion conductive layers 1109a and 1109b. For the protection insulating film 1114, for example, a silicon nitride film, a silicon carbonitride film or the like can be used. The protection insulating film 1114 is preferably made of the same material as the first hard mask film 1112 and the barrier insulating film 1107. In the case of being made of the same material, the protection insulating film 1114 is integrated into one body with the barrier insulating film 1107 and the first hard mask film 1112 and adhesiveness of boundary faces thereamong is thereby improved, which enables the three-terminal switch 1122 with a rectifying element and the two-terminal switch 1123 to be protected more securely.

The interlayer insulating film 1115 is an insulating film that is formed on the protection insulating film 1114. For the interlayer insulating film 1115, for example, a silicon oxide film, a SiOC film or the like can be used. The interlayer insulating film 1115 may be a stack of a plurality of insulating films. The interlayer insulating film 1115 may be made of the same material as the interlayer insulating film 1117. In the interlayer insulating film 1115, lower holes for embedding the vias 1119a and 1119b are formed, and, in the lower holes, the vias 1119a and 1119b are embedded with the second barrier metals 1120a and 1120b in between, respectively.

For the low-k insulating film 1116, a low dielectric constant film (for example, a SiOCH film) or the like that has a lower relative dielectric constant than a silicon oxide film is used. The low-k insulating film 1116 is an insulating film that is interposed between the interlayer insulating films 1115 and 1117 and has a low dielectric constant. In the low-k insulating film 1116, wiring grooves for embedding the second wirings 1118a and 1118b are formed. In the wiring grooves in the low-k insulating film 1116, the second wirings 1118a and 1118b are embedded with the second barrier metals 1120a and 1120b in between, respectively.

The interlayer insulating film 1117 is an insulating film that is formed on the low-k insulating film 1116. For the interlayer insulating film 1117, for example, a silicon oxide film, a SiOC film, a low dielectric constant film (for example, a SiOCH film) that has a lower relative dielectric constant than a silicon oxide film, or the like can be used. The interlayer insulating film 1117 may be a stack of a plurality of insulating films. The interlayer insulating film 1117 may be made of the same material as the interlayer insulating film 1115. In the interlayer insulating film 1117, wiring grooves for embedding the second wirings 1118a and 1118b are formed. In the wiring grooves in the interlayer insulating film 1117, the second wirings 118a and 118b are embedded with the second barrier metals 1120a and 1120b in between, respectively.

The second wirings 1118a and 1118b are wirings that are embedded in the wiring grooves formed in the interlayer insulating film 1117 and the low-k insulating film 1116 with the second barrier metals 1120a and 1120b in between, respectively. The second wirings 1118a and 1118b are integrated into one body with the vias 1119a and 1119b, respectively.

The via 1119a is embedded in the lower hole formed in the interlayer insulating film 1115, the protection insulating film 1114, the first hard mask film 1112, and the second hard mask film 1113 with the second barrier metal 1120a in between. The via 1119b is embedded in the lower hole formed in the interlayer insulating film 1115 and the protection insulating film 1114 with the second barrier metal 1120b in between.

The via 1119a is electrically connected to the third electrode 1111 with the second barrier metal 1120a in between. The via 1119b is electrically connected to the second electrode 1110b with the second barrier metal 1120b in between. For the second wirings 1118a and 1118b and the vias 1119a and 1119b, for example, copper can be used.

The second barrier metals 1120a and 1120b are conductive films that cover the side surfaces and the bottom surfaces of the second wirings 1118a and 1118b and the vias 1119a and 1119b, respectively and have a barrier property. The second barrier metals 1120a and 1120b prevent a metal forming the second wirings 1118a and 1118b (including the vias 1119a and 1119b) from diffusing into the interlayer insulating films 1115 and 1117 and lower layers.

For example, when the second wirings 1118a and 1118b and the vias 1119a and 1119b are constituted by metallic elements including copper as a main component, a refractory metal, a nitride thereof or the like, such as tantalum, tantalum nitride, titanium nitride and tungsten carbonitride, or a stacked film thereof can be used for the second barrier metals 1120a and 1120b.

The barrier insulating film 1121 is an insulating film that is formed on the interlayer insulating film 1117 including the second wirings 1118a and 1118b. The barrier insulating film 1121 has roles of preventing the metal (for example, copper) forming the second wirings 1118a and 1118b from being oxidized and preventing the metal forming the second wirings 1118a and 1118b from diffusing into upper layers. For the barrier insulating film 1121, for example, a silicon carbonitride film, a silicon nitride film, a stacked structure thereof, or the like can be used.

Advantageous Effect of Example Embodiment

According to the present example embodiment, it is possible to achieve a semiconductor device including the three-terminal switch 1122 with a rectifying element including one rectifying element and the two-terminal switch 1123 provided with no rectifying element in the same wiring in a multilayer wiring structure. In the present example embodiment, it is possible to form the three-terminal switch 1122 with a rectifying element including one rectifying element and the two-terminal switch 1123 in the same wiring layer at the same time.

Preferred example embodiments of the present invention were described above, but the present invention is not limited to the above example embodiments. It is needless to say that, within the scope of the present invention described in the claims, various modifications are possible and such modifications are also included in the scope of the present invention.

All or part of the respective example embodiments described above may be described as in the following supplementary notes, but the present invention is not limited thereto.

(Supplementary note 1) A semiconductor device comprising
a first switching element and a second switching element that are disposed in a signal path of a logic circuit, wherein
the first switching element includes a rectifying element and a variable resistance element,
the second switching element does not include the rectifying element and includes a variable resistance element, and
the first switching element and the second switching element are formed in the same wiring layer.

(Supplementary note 2) A semiconductor device comprising
a first switching element and a second switching element that are disposed in a signal path of a logic circuit, wherein
the first switching element includes two rectifying elements and two variable resistance elements,
the second switching element does not include the two rectifying elements and includes the two variable resistance elements, and
the first switching element and the second switching element are formed in the same wiring layer.

(Supplementary note 3) A semiconductor device comprising
a first switching element and a second switching element that are disposed in a signal path of a logic circuit, wherein
the first switching element including two rectifying elements and two variable resistance elements, wherein each of the two variable resistance elements has two terminals, one terminals of the respective two terminals of the two variable resistance elements are connected to each other, one terminal and the other terminal of the two other terminals of the two variable resistance elements are a signal input terminal and a signal output terminal, respectively, and one electrode of a first electrode and a second electrode of each of the two rectifying elements is connected to one terminal of the two terminals of one of the two variable resistance element and the other electrode of the first electrode and the second electrode of the rectifying element serves as a control terminal and
the second switching element including no rectifying element and two variable resistance elements, wherein each of the two variable resistance elements has two terminals, one terminals of the respective two terminals of the two variable resistance elements are connected to each other and serve as a common control terminal of the two variable resistance elements and one terminal and the other terminal of the two other terminals of the two variable resistance elements are a signal input terminal and a signal output terminal, respectively
are formed in the same wiring layer.

(Supplementary note 4) The semiconductor device according to supplementary note 2 or 3, wherein
film thickness of a metal constituting a common control terminal of the two variable resistance elements of the second switching element is thinner than film thickness of a metal constituting a common control terminal of the two variable resistance elements of the first switching element.

(Supplementary note 5) The semiconductor device according to any one of supplementary notes 1 to 4, wherein
on the second switching element, a hard mask film for processing the second switching element does not remain.

(Supplementary note 6) The semiconductor device according to any one of supplementary notes 1 to 5, wherein
the rectifying element comprises a rectifying layer that includes amorphous silicon and silicon nitride as main components.

(Supplementary note 7) The semiconductor device according to any one of supplementary notes 1 to 5, wherein
the variable resistance element includes an ion conductive layer in which metal ions can move and metal cross-links can be formed.

(Supplementary note 8) The semiconductor device according to any one of supplementary notes 1 to 5, wherein
the variable resistance layer includes a film that is an ion conductor conducting metal ions in accordance with an electric field, that includes at least silicon, oxygen, and carbon as main components, and the relative dielectric constant of which is 2.1 or higher and 3.0 or lower.

(Supplementary note 9) A method for producing a semiconductor device in which a first switching element and a second switching element are formed at the same time, the first switching element including a rectifying element and a variable resistance element, the second switching element including no rectifying element and a variable resistance element, the method comprising:
film-forming electrodes and a variable resistance layer that form the variable resistance elements;
film-forming electrodes and a rectifying layer that form the rectifying element;
forming a first pattern for constituting the variable resistance element and the rectifying element to a hard mask for forming the first switching element;
forming a second pattern for constituting the variable resistance element to a hard mask for forming the second switching element; and
etching the rectifying layer and the variable resistance layer at the same time by use of the hard masks to which the first pattern and the second pattern are formed.

(Supplementary note 10) The method for producing the semiconductor device according to supplementary note 9, wherein
in an area where the first pattern is formed to the hard mask, after exposure for forming a pattern of the rectifying element to a photoresist and etching using the photoresist are performed, exposure for forming a pattern of the variable resistance element to a photoresist and etching using the photoresist are performed, and
in an area where the second pattern is formed to the hard mask, exposure for forming a pattern of the rectifying element to a photoresist is not performed and exposure for forming a pattern of the variable resistance element to a photoresist and etching using the photoresist are performed.

(Supplementary note 11) The method for producing the semiconductor device according to supplementary note 9 or 10, wherein
a first switching element includes two rectifying elements, the method comprising:
forming a first pattern for constituting the variable resistance element and the two rectifying elements to the hard mask for forming the first switching element; and
etching the rectifying layer and the variable resistance layer at the same time by use of the hard masks to which the first pattern and the second pattern are formed.

(Supplementary note 12) The method for producing the semiconductor device according to any one of supplementary notes 9 to 11, wherein
by etching of the rectifying layer by use of the hard masks to which the first pattern and the second pattern are formed, an electrode on the rectifying layer positioned in the area where the second switching element is formed is removed.

(Supplementary note 13) The method for producing the semiconductor device according to supplementary note 12, wherein
even through etching of the rectifying layer by use of the hard masks to which the first pattern and the second pattern are formed, the rectifying layer positioned in the area where the second switching element is formed remains.

The present invention was described above using the example embodiments described above as exemplary examples. However, the present invention is not limited to the example embodiments described above. That is, various modes that could be understood by a person skilled in the art may be applied to the present invention within the scope of the present invention.

This application is based upon and claims the benefit of priority from Japanese Patent Application No. 2016-131469, filed on Jul. 1, 2016, the disclosure of which is incorporated herein in its entirety by reference.

INDUSTRIAL APPLICABILITY

A variable resistance element used in a semiconductor device of the present invention is usable as a non-volatile switching element and, in particular, suitably usable as a non-volatile switching element that constitutes an electronic device, such as a programmable logic and a memory.

REFERENCE SIGNS LIST 122, 822 Four-terminal switch with rectifying elements
123, 923, 1023 Three-terminal switch
722, 922 Two-terminal switch with a rectifying element
723, 823, 1123 Two-terminal switch
1022, 1122 Three-terminal switch with a rectifying element
105a, 105b, 105c, 105d, 605a, 605b, 605c, 605d, 705a, 705b, 805a, 805b, 805c, 905a, 905b, 905c, 1005a, 1005b, 1005c, 1005d, 1105a, 1105b, 1105c First wiring
108a, 108b, 608, 608a, 608b, 708a, 708b, 808a, 808b, 908a, 908b, 1008a, 1008b, 1108a, 1108b Rectifying layer
109a, 109b, 609, 609a, 609b, 709a, 709b, 809a, 809b, 909a, 909b, 1009a, 1009b, 1109a, 1109b Ion conductive layer
110a, 110b, 610, 610a, 610b, 710a, 710b, 810a, 810b, 910a, 910b, 1010a, 1010b, 1110a, 1110b Second electrode
111, 611, 711, 811, 911, 1011, 1111 Third electrode
112, 612, 712, 812, 912, 1012, 1112 First hard mask film
113, 713, 713, 813, 913, 1013, 1113 Second hard mask film

What is claimed is:
1. A semiconductor device comprising
a first switching element and a second switching element that are disposed in a signal path of a logic circuit, wherein
the first switching element includes two rectifying elements and two first variable resistance elements,
the second switching element does not include any rectifying elements and includes two second variable resistance elements, and the first switching element and the second switching element are formed in the same wiring layer.

2. The semiconductor device according to claim 1, wherein film thickness of a metal constituting a common control terminal of the two second variable resistance elements of the second switching element is thinner than film thickness of a metal constituting a common control terminal of the two first variable resistance elements of the first switching element.

3. A semiconductor device comprising
a first switching element and a second switching element that are disposed in a signal path of a logic circuit, wherein
the first switching element including two rectifying elements and two first variable resistance elements, wherein each of the two first variable resistance elements has two terminals, one terminals of the respective two terminals of the two first variable resistance elements are connected to each other, one terminal and the other terminal of the two other terminals of the two first variable resistance elements are a signal input terminal and a signal output terminal, respectively, and one electrode of a first electrode and a second electrode of each of the two rectifying elements is connected to one terminal of the two terminals of one of the two first variable resistance element and the other electrode of the first electrode and the second electrode of the rectifying element serves as a control terminal and
the second switching element including no rectifying element and two second variable resistance elements, wherein each of the two second variable resistance elements has two terminals, one terminals of the respective two terminals of the two second variable resistance elements are connected to each other and serve as a common control terminal of the two second variable resistance elements and one terminal and the other terminal of the two other terminals of the two second variable resistance elements are a signal input terminal and a signal output terminal, respectively are formed in the same wiring layer.

4. A semiconductor device comprising:
a first switching element and a second switching element that are disposed in a signal path of a logic circuit, wherein
the first switching element includes a rectifying element and a first variable resistance element,
the second switching element does not include any rectifying element and includes a second variable resistance element, and
the first switching element and the second switching element are formed in the same wiring layer, wherein
the rectifying element comprises a rectifying layer that includes amorphous silicon and silicon nitride as main components.

5. The semiconductor device of claim 4, wherein
on the second switching element, a hard mask film for processing the second switching element does not remain.

6. A semiconductor device comprising:
a first switching element and a second switching element that are disposed in a signal path of a logic circuit, wherein
the first switching element includes a rectifying element and a first variable resistance element,
the second switching element does not include any rectifying element and includes a second variable resistance element, and the first switching element and the second switching element are formed in the same wiring layer, wherein
the first variable resistance element, the second variable resistance element, or both the first and the second variable resistance each includes an ion conductive layer in which metal ions can move and metal cross-links can be formed.

7. The semiconductor device of claim 6, wherein
on the second switching element, a hard mask film for processing the second switching element does not remain.

8. A semiconductor device comprising:
a first switching element and a second switching element that are disposed in a signal path of a logic circuit, wherein
the first switching element includes a rectifying element and a first variable resistance element,
the second switching element does not include any rectifying element and includes a second variable resistance element, and
the first switching element and the second switching element are formed in the same wiring layer, wherein
the first variable resistance element, the second variable resistance element, or both the first and the second variable resistance each includes a variable resistance layer having a film that is an ion conductor conducting metal ions in accordance with an electric field, that includes at least silicon, oxygen, and carbon as main components, and the relative dielectric constant of which is 2.1 or higher and 3.0 or lower.

9. The semiconductor device of claim 8, wherein
on the second switching element, a hard mask film for processing the second switching element does not remain.

10. A method for producing a semiconductor device in which a first switching element and a second switching element are formed at the same time, the first switching element including a rectifying element and a first variable resistance element, the second switching element including no rectifying element and a second variable resistance element, the method comprising:
forming first electrodes and a first variable resistance layer that form the first variable resistance element;
forming second electrodes and a second variable resistance layer that form the second variable resistance element;
forming third electrodes and a rectifying layer that form the rectifying element;
forming a first pattern for constituting the first variable resistance element and the rectifying element in a first hard mask for forming the first switching element;
forming a second pattern for constituting the second variable resistance element in a second hard mask for forming the second switching element; and
etching the rectifying layer and the first and second variable resistance layers at the same time by use of the first and second hard masks to which the first pattern and the second pattern are formed.

11. The method for producing the semiconductor device according to claim 10, wherein
in an area where the first pattern is formed to the hard mask, after exposure for forming a pattern of the rectifying element to a photoresist and etching using the photoresist are performed, exposure for forming a pattern of the first variable resistance element to a photoresist and etching using the photoresist are performed, and in an area where the second pattern is formed to the hard mask, exposure for forming a pattern of the rectifying element to a photoresist is not performed and exposure for forming a pattern of the second variable resistance element to a photoresist and etching using the photoresist are performed.

12. The method for producing the semiconductor device according to claim 10, wherein the rectifying element is a first rectifying element, and the first switching element further includes a second rectifying element, forming the first pattern is for constituting the first variable resistance element and the first and second rectifying elements to the first hard mask for forming the first switching element.

13. The method for producing the semiconductor device according to claim 10, wherein by etching of the rectifying layer by use of the first and second hard masks to which the first pattern and the second pattern are formed, an electrode on the rectifying layer positioned in the area where the second switching element is formed is removed.

14. The method for producing the semiconductor device according to claim 13, wherein even through etching of the rectifying layer by use of the first and second hard masks to which the first pattern and the second pattern are formed, the rectifying layer positioned in the area where the second switching element is formed remains.

\* \* \* \* \*